United States Patent
Yamagiwa et al.

(10) Patent No.: US 11,876,542 B2
(45) Date of Patent: Jan. 16, 2024

(54) DATA COMPRESSION AND DECOMPRESSION METHODS, DATA COMPRESSION DEVICE, AND DATA DECOMPRESSION DEVICE

(71) Applicant: UNIVERSITY OF TSUKUBA, Ibaraki (JP)

(72) Inventors: Shinichi Yamagiwa, Ibaraki (JP); Koichi Marumo, Ibaraki (JP); Eisaku Hayakawa, Ibaraki (JP)

(73) Assignee: UNIVERSITY OF TSUKUBA, Ibaraki (JP)

( * ) Notice: Subject to any disclaimer, the term of this patent is extended or adjusted under 35 U.S.C. 154(b) by 190 days.

(21) Appl. No.: 17/609,447

(22) PCT Filed: Apr. 28, 2020

(86) PCT No.: PCT/JP2020/018146
§ 371 (c)(1),
(2) Date: Nov. 8, 2021

(87) PCT Pub. No.: WO2020/226105
PCT Pub. Date: Nov. 12, 2020

(65) Prior Publication Data
US 2022/0239316 A1 Jul. 28, 2022

(30) Foreign Application Priority Data

May 7, 2019 (JP) .................................. 2019-087870

(51) Int. Cl.
*H03M 7/40* (2006.01)
*H03M 7/42* (2006.01)
(Continued)

(52) U.S. Cl.
CPC ................. *H03M 7/42* (2013.01); *G06F 9/38* (2013.01); *H03M 7/00* (2013.01); *H03M 7/30* (2013.01)

(58) Field of Classification Search
CPC ............ H03M 7/42; H03M 7/30; H03M 7/34; H03M 7/00; G06F 9/38
See application file for complete search history.

(56) References Cited

U.S. PATENT DOCUMENTS

| 2003/0206125 A1 | 11/2003 | Abdat |
| 2005/0030208 A1 | 2/2005 | Abdat |

(Continued)

FOREIGN PATENT DOCUMENTS

| EP | 129439 A1 | 12/1984 |
| JP | 3-209923 B2 | 9/1991 |

(Continued)

OTHER PUBLICATIONS

Search Report in International Application No. PCT/JP2020/018146 dated Jun. 30, 2020, 2 pages.

(Continued)

*Primary Examiner* — Joseph J Lauture
(74) *Attorney, Agent, or Firm* — MARSHALL, GERSTEIN & BORUN LLP

(57) ABSTRACT

A compression apparatus performs processing of registering a symbol, which is input, in a predetermined entry among a plurality of entries in a case where the symbol is not registered in a first table having the plurality of entries and outputting the symbol and index data indicating non-compression, processing of outputting index data indicating compression and positional information indicating a position of the entry having the symbol registered therein and having a size smaller than a size of the symbol in a case where the symbol has been registered in the table, and (Continued)

processing of changing the size of the positional information depending on usage conditions of the plurality of entries.

28 Claims, 87 Drawing Sheets

(51) Int. Cl.
  *H03M 7/30* (2006.01)
  *G06F 9/38* (2018.01)
  *H03M 7/00* (2006.01)

(56) References Cited

U.S. PATENT DOCUMENTS

| | | |
|---|---|---|
| 2006/0071822 A1 | 4/2006 | Abdat |
| 2007/0030179 A1 | 2/2007 | Abdat |
| 2008/0071748 A1* | 3/2008 | Wroblewski ............ H03M 7/30 |
| 2018/0054215 A1 | 2/2018 | Yamagiwa et al. |

FOREIGN PATENT DOCUMENTS

| | | |
|---|---|---|
| JP | 9-93138 | 4/1997 |
| JP | 2003-264703 A | 9/2003 |
| JP | 2012-100275 A | 5/2012 |
| JP | 2014/236449 A | 12/2014 |
| JP | 2016-184830 A | 10/2016 |

OTHER PUBLICATIONS

Extended European Search Report in EP Application No. 20801810.1 dated May 12, 2023, 10 pages.

Marumo et al., "Lazy Management for Frequency Table on Hardware-Based Stream Lossless Data Compression", Information, vol. 7, No. 63, 2016, 16 pages.

* cited by examiner

FIG. 1

| INDEX | SYMBOL BEFORE COMPRESSION | COUNT VALUE |
|---|---|---|
| 0 | AB | 3 |
| 1 | DC | 2 |
| 2 | BB | 4 |
| 3 | GF | 2 |

NUMBER OF ENTRIES (indexes 0–3)

REGISTRATION POINTER
DELETE POINTER

FIG. 2A

INPUT: A̲B̲ACABADBCFGDEDAFGAB····
OUTPUT: AB

| INDEX | SYMBOL BEFORE COMPRESSION | COUNT VALUE |
|---|---|---|
| 0 | AB | 2 |
| 1 | | |
| 2 | | |
| 3 | | |

← DELETION POINTER
← REGISTRATION POINTER

FIG. 2B

INPUT: AB A̲C̲ABADBCFGDEDAFGAB····
OUTPUT: ABAC

| INDEX | SYMBOL BEFORE COMPRESSION | COUNT VALUE |
|---|---|---|
| 0 | AB | 1 |
| 1 | AC | 2 |
| 2 | | |
| 3 | | |

← DELETION POINTER
← REGISTRATION POINTER

FIG. 2C

INPUT: ABAC A̲B̲ADBCFGDEDAFGAB····
OUTPUT: ABAC0

| INDEX | SYMBOL BEFORE COMPRESSION | COUNT VALUE |
|---|---|---|
| 0 | AB | 2 |
| 1 | AC | 1 |
| 2 | | |
| 3 | | |

← DELETION POINTER
← REGISTRATION POINTER

INPUT: ABACABADBCFGDEDAFGAB····
OUTPUT: ABAC0AD

FIG. 3A

| INDEX | SYMBOL BEFORE COMPRESSION | COUNT VALUE | |
|---|---|---|---|
| 0 | AB | 1 | |
| 1 | AC | 1 | ← DELETION POINTER |
| 2 | AD | 2 | |
| 3 | | | ← REGISTRATION POINTER |

INPUT: ABACABADBCFGDEDAFGAB····
OUTPUT: ABAC0ADBC

FIG. 3B

| INDEX | SYMBOL BEFORE COMPRESSION | COUNT VALUE | |
|---|---|---|---|
| 0 | AB | 1 | |
| 1 | ~~AC~~ | ~~0~~ | ← REGISTRATION POINTER |
| 2 | AD | 2 | ← DELETION POINTER |
| 3 | BC | 2 | |

INPUT: ABACABADBCFGDEDAFGAB····
OUTPUT: ABAC0ADBCFG

FIG. 3C

| INDEX | SYMBOL BEFORE COMPRESSION | COUNT VALUE | |
|---|---|---|---|
| 0 | AB | 1 | |
| 1 | FG | 2 | |
| 2 | AD | 1 | ← REGISTRATION POINTER |
| 3 | BC | 2 | ← DELETION POINTER |

FIG. 4A

INPUT: ABACABADBCFG<u>DE</u>DAFGAB····
OUTPUT: ABAC0ADBCFGDE

| INDEX | SYMBOL BEFORE COMPRESSION | COUNT VALUE | |
|---|---|---|---|
| 0 | AB | 1 | ← DELETION POINTER |
| 1 | FG | 2 | |
| 2 | AD | 1 | |
| 3 | BC | *1* | ← REGISTRATION POINTER |

FIG. 4B

INPUT: ABACABADBCFGDE<u>DA</u>FGAB····
OUTPUT: ABAC0ADBCFGDEDA

| INDEX | SYMBOL BEFORE COMPRESSION | COUNT VALUE | |
|---|---|---|---|
| 0 | ~~AB~~ | ~~0~~ | ← REGISTRATION POINTER |
| 1 | FG | 2 | ← DELETION POINTER |
| 2 | AD | 1 | |
| 3 | BC | *1* | |

FIG. 5A

INPUT: ABACABADBCFGDEDA<u>FG</u>AB····
OUTPUT: ABAC0ADBCFGDEDA1

| INDEX | SYMBOL BEFORE COMPRESSION | COUNT VALUE | |
|---|---|---|---|
| 0 |  |  | ← REGISTRATION POINTER |
| 1 | FG | 2 | |
| 2 | AD | 1 | ← DELETION POINTER |
| 3 | BC | 1 | |

FIG. 5B

INPUT: ABACABADBCFGDEDAFG<u>AB</u>····
OUTPUT: ABAC0ADBCFGDEDA0AB

| INDEX | SYMBOL BEFORE COMPRESSION | COUNT VALUE | |
|---|---|---|---|
| 0 | AB | 2 | |
| 1 | DE | 1 | |
| 2 | ~~AD~~ | ~~0~~ | ← REGISTRATION POINTER |
| 3 | BC | 1 | ← DELETION POINTER |

INPUT: <u>A</u>BAC0ADBCFGDEDA1AB····

OUTPUT: AB

FIG. 6A

| INDEX | SYMBOL BEFORE COMPRESSION | COUNT VALUE | |
|---|---|---|---|
| 0 | AB | 2 | ← DELETION POINTER |
| 1 | | | ← REGISTRATION POINTER |
| 2 | | | |
| 3 | | | |

INPUT: AB<u>A</u>C0ABADBCFGDEDA1AB····

OUTPUT: ABAC

FIG.6B

| INDEX | SYMBOL BEFORE COMPRESSION | COUNT VALUE | |
|---|---|---|---|
| 0 | AB | 1 | |
| 1 | AC | 2 | ← DELETION POINTER |
| 2 | | | ← REGISTRATION POINTER |
| 3 | | | |

INPUT: ABAC<u>0</u>ADBCFGDEDA1AB····

OUTPUT: ABACAB

FIG.6C

| INDEX | SYMBOL BEFORE COMPRESSION | COUNT VALUE | |
|---|---|---|---|
| 0 | AB | 2 | ← DELETION POINTER |
| 1 | AC | 1 | |
| 2 | | | ← REGISTRATION POINTER |
| 3 | | | |

INPUT: ABAC0ADBCFGDEDA1AB····
OUTPUT: ABACABAD

FIG. 7A

| INDEX | SYMBOL BEFORE COMPRESSION | COUNT VALUE | |
|---|---|---|---|
| 0 | AB | 1 | |
| 1 | AC | 1 | ← DELETION POINTER |
| 2 | AD | 2 | |
| 3 | | | ← REGISTRATION POINTER |

INPUT: ABAC0ADBCFGDEDA1AB····
OUTPUT: ABACABADBC

FIG. 7B

| INDEX | SYMBOL BEFORE COMPRESSION | COUNT VALUE | |
|---|---|---|---|
| 0 | AB | 1 | |
| 1 | ~~AC~~ | ~~0~~ | ← REGISTRATION POINTER |
| 2 | AD | 2 | ← DELETION POINTER |
| 3 | BC | 2 | |

INPUT: ABAC0ADBCFGDEDA1AB····
OUTPUT: ABACABADBCFG

FIG. 7C

| INDEX | SYMBOL BEFORE COMPRESSION | COUNT VALUE | |
|---|---|---|---|
| 0 | AB | 1 | |
| 1 | FG | 2 | |
| 2 | AD | 1 | ← REGISTRATION POINTER |
| 3 | BC | 2 | ← DELETION POINTER |

FIG. 8A

INPUT: ABAC0ADBCFG<u>D</u>EDA1AB····

OUTPUT: ABACABADBCFGDE

| INDEX | SYMBOL BEFORE COMPRESSION | COUNT VALUE | |
|---|---|---|---|
| 0 | AB | 1 | ← DELETION POINTER |
| 1 | FG | 2 | |
| 2 | AD | 1 | |
| 3 | BC | *1* | ← REGISTRATION POINTER |

FIG. 8B

INPUT: ABAC0ADBCFGDE<u>D</u>A1AB····

OUTPUT: ABAC0ADBCFGDEDA

| INDEX | SYMBOL BEFORE COMPRESSION | COUNT VALUE | |
|---|---|---|---|
| 0 | ~~AB~~ | *0* | ← REGISTRATION POINTER |
| 1 | FG | 2 | ← DELETION POINTER |
| 2 | AD | 1 | |
| 3 | BC | 1 | |

FIG. 9A

INPUT:  ABAC0ADBCFGDEDA1AB····
OUTPUT: ABACABADBCFGDEDAFG

| INDEX | SYMBOL BEFORE COMPRESSION SYMBOL | COUNT VALUE |
|---|---|---|
| 0 |  |  | ← REGISTRATION POINTER
| 1 | FG | 2 |
| 2 | AD | 1 | ← DELETION POINTER
| 3 | BC | 1 |

FIG. 9B

INPUT:  ABAC0ADBCFGDEDA1AB····
OUTPUT: ABACABADBCFGDEDAFGAB

| INDEX | SYMBOL BEFORE COMPRESSION SYMBOL | COUNT VALUE |
|---|---|---|
| 0 | AB | 2 |
| 1 | DE | 1 |
| 2 | ~~AD~~ | ~~0~~ | ← REGISTRATION POINTER
| 3 | BC | 1 | ← DELETION POINTER

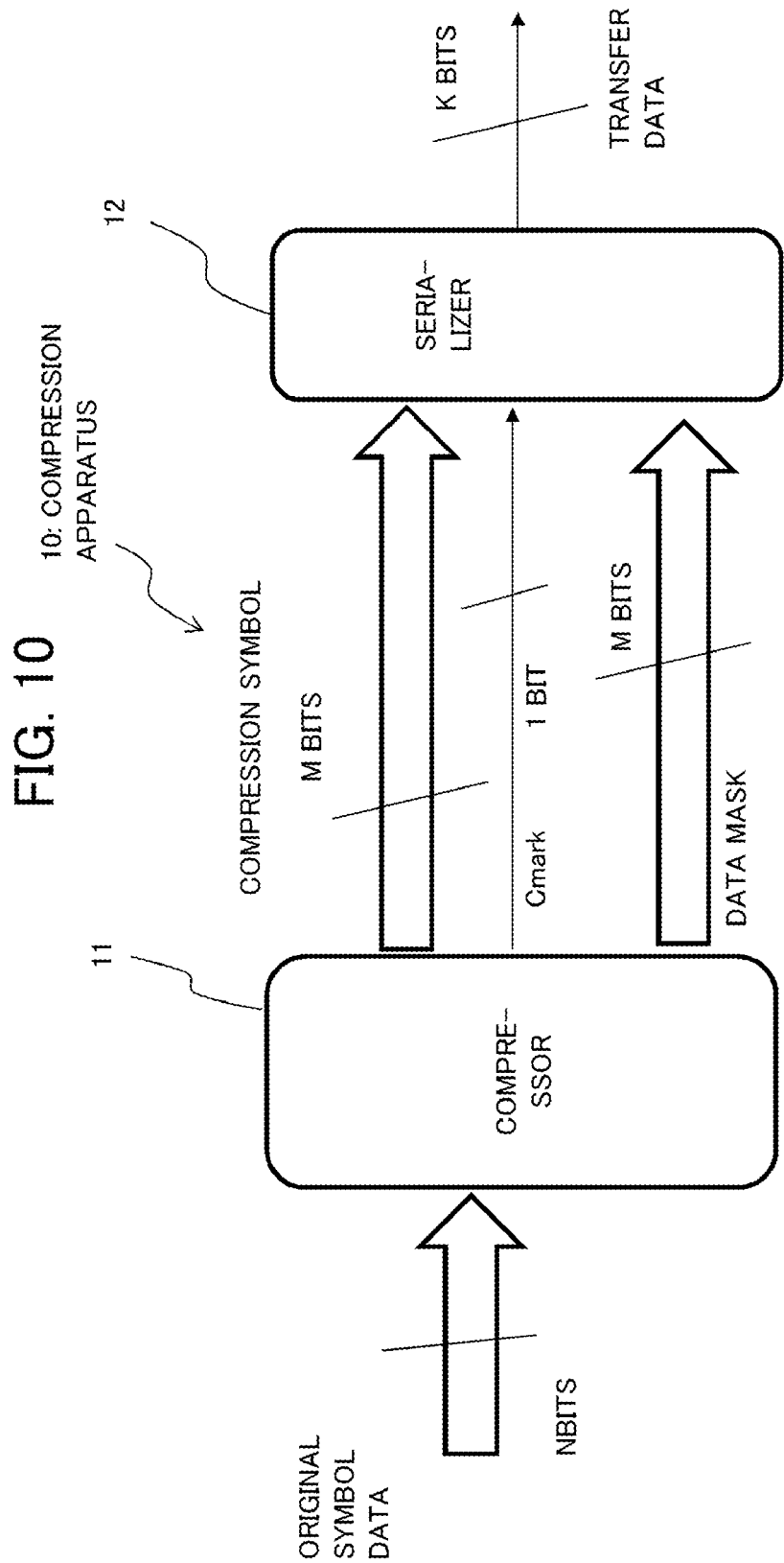

FIG. 12

| COMPRESSED SYMBOL | Cmark | DATA MASK | OUTPUT |
|---|---|---|---|
| 0001000 | 1 | 0011111 | 1+01000 |
| 1110100 | 0 | 1111111 | 0+1110100 |
| 0000100 | 1 | 0000111 | 1+100 |
| 0000000 | 1 | 0000001 | 1+0 |
| 0001100 | 1 | 0011111 | 1+01100 |

FIG. 14

CONVERSION TABLE

INDEX    ORIGINAL SYMBOL

NUMBER OF ENTRIES (EXAMPLE:4)
- 0 — B
- 1 — F
- 2 — R
- 3 — P

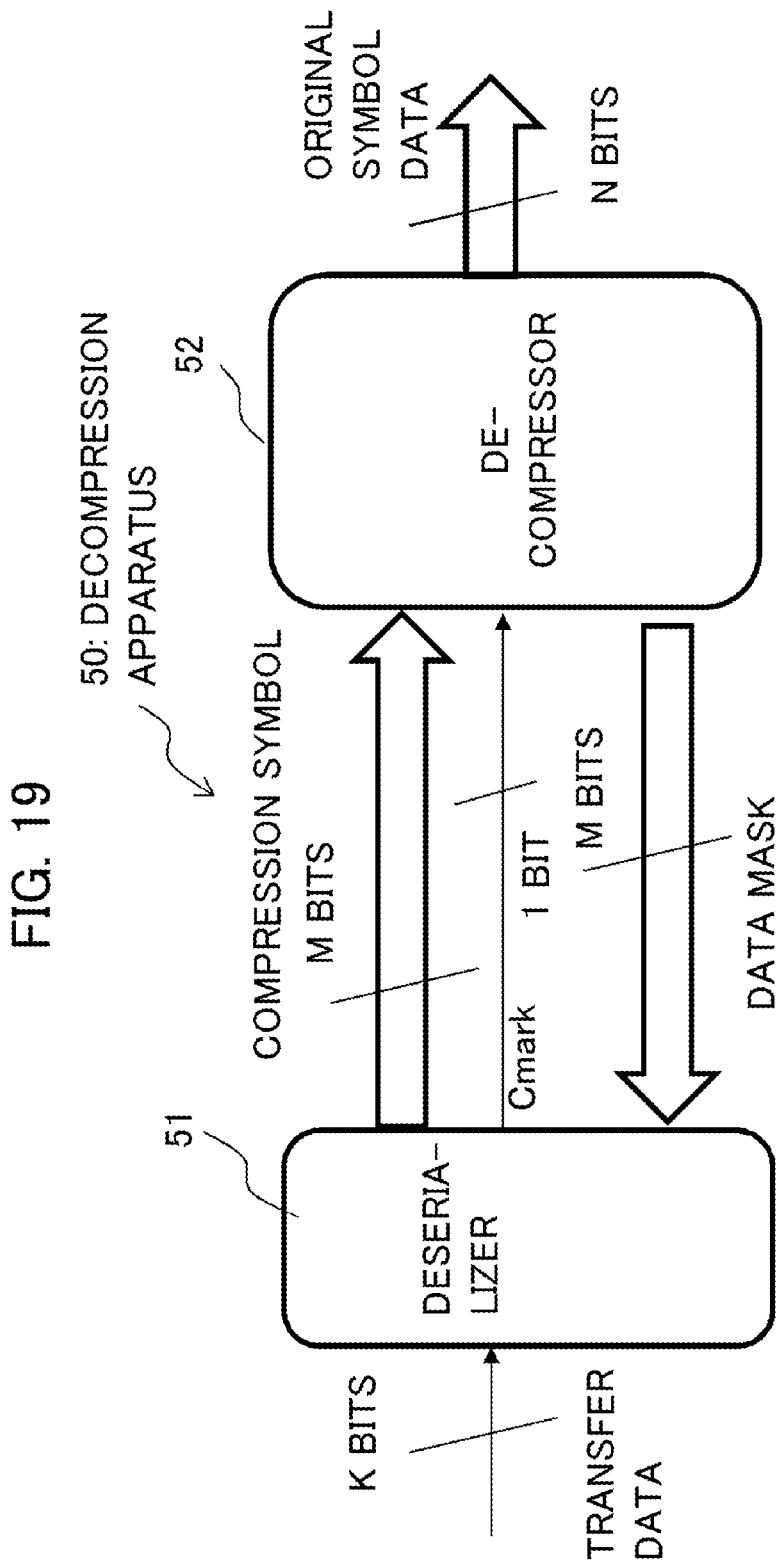

ORIGINAL SYMBOL(INPUT): ABACDABFGEFHJAB

FIG. 25A

| 0 | A |
| 1 | D |
| 2 | C |
| 3 | B |
| 4 | |
| 5 | |
| 6 | |
| 7 | |

COMPRESSION SYMBOL: AB1CD2

Cmark BIT: 001001

DATA MASK:
11111111
11111111
00000001
11111111
11111111
<u>00000011</u>

ENTROPY CALCULATION VALUE: 2

ORIGINAL SYMBOL(INPUT): ABACDABFGEFHJAB

FIG. 25B

| 0 | B |
| 1 | A |
| 2 | D |
| 3 | C |
| 4 | |
| 5 | |
| 6 | |
| 7 | |

COMPRESSION SYMBOL: AB1CD23

Cmark BIT: 0010011

DATA MASK:
11111111
11111111
00000001
11111111
11111111
00000011
<u>00000011</u>

ENTROPY CALCULATION VALUE: 2

ORIGINAL SYMBOL(INPUT): ABACDABFGEFHJAB

FIG. 25C

| 0 | F |
| 1 | B |
| 2 | A |
| 3 | D |
| 4 | C |
| 5 | |
| 6 | |
| 7 | |

COMPRESSION SYMBOL: AB1CD23F

Cmark BIT: 00100110

DATA MASK:
11111111  <u>11111111</u>
11111111
00000001
11111111
11111111
00000011
00000011

FIG. 26A

ORIGINAL SYMBOL(INPUT): ABACDABF<u>G</u>EFHJAB

| 0 | G |
|---|---|
| 1 | F |
| 2 | B |
| 3 | A |
| 4 | D |
| 5 | C |
| 6 |   |
| 7 |   |

COMPRESSION SYMBOL: AB1CD23F<u>G</u>

Cmark BIT: 00100110<u>0</u>

DATA MASK:
11111111   11111111
11111111   <u>11111111</u>
00000001
11111111
11111111
00000011
00000011

FIG. 26B

ORIGINAL SYMBOL(INPUT): ABACDABFG<u>E</u>FHJAB

| 0 | E |
|---|---|
| 1 | G |
| 2 | F |
| 3 | B |
| 4 | A |
| 5 | D |
| 6 | C |
| 7 |   |

COMPRESSION SYMBOL: AB1CD23FG<u>E</u>

Cmark BIT: 0010011000

DATA MASK:
11111111   11111111
11111111   11111111
00000001   <u>11111111</u>
11111111
11111111
00000011
00000011

FIG. 26C

ORIGINAL SYMBOL(INPUT): ABACDABFG<u>E</u>FHJAB

| 0 | F |
|---|---|
| 1 | E |
| 2 | G |
| 3 | B |
| 4 | A |
| 5 | D |
| 6 | C |
| 7 |   |

COMPRESSION SYMBOL: AB1CD23FG<u>E2</u>

Cmark BIT: 001001100<u>1</u>

DATA MASK:
11111111   11111111
11111111   11111111
00000001   11111111
11111111   <u>00000111</u>
11111111
00000011   ENTROPY
00000011   CALCULATION VALUE: 3

FIG. 27A

ORIGINAL SYMBOL(INPUT): ABACDABFGEFHJAB

| 0 | H |
| 1 | F |
| 2 | E |
| 3 | G |
| 4 | B |
| 5 | A |
| 6 | D |
| 7 | C |

COMPRESSION SYMBOL: AB1CD23FGE2H

Cmark BIT: 001001100010

DATA MASK:
11111111  11111111
11111111  11111111
00000001  11111111
11111111  00000111
11111111  11111111
00000011
00000011

FIG. 27B

ORIGINAL SYMBOL(INPUT): ABACDABFGEFHJAB

| 0 | J |
| 1 | H |
| 2 | F |
| 3 | E |
| 4 | G |
| 5 | B |
| 6 | A |
| 7 | D |

COMPRESSION SYMBOL: AB1CD23FGE2HJ

Cmark BIT: 00010011000100

DATA MASK:
11111111  11111111
11111111  11111111
00000001  11111111
11111111  00000111
11111111  11111111
00000011  11111111
00000011

FIG. 27C

ORIGINAL SYMBOL(INPUT): ABACDABFGEFHJAB

| 0 | A |
| 1 | J |
| 2 | H |
| 3 | F |
| 4 | E |
| 5 | G |
| 6 | B |
| 7 | D |

COMPRESSION SYMBOL: AB1CD23FGE2HJ6

Cmark BIT: 000100110001001

DATA MASK:
11111111  11111111
11111111  11111111
00000001  11111111
11111111  00000111
11111111  11111111
00000011  11111111
00000011  00000111

ENTROPY CALCULATION VALUE: 3

FIG. 28

ORIGINAL SYMBOL(INPUT): ABACDABFGEFHJAB

| 0 | B |
| 1 | A |
| 2 | J |
| 3 | H |
| 4 | F |
| 5 | E |
| 6 | G |
| 7 | D |

COMPRESSION SYMBOL: AB1CD23FGE2HJ66

Cmark BIT: 001001100010011

DATA MASK:
11111111  11111111  <u>00000111</u>
11111111  11111111
00000001  11111111
11111111  00000111
11111111  11111111
00000011  11111111
00000011  00000111

ENTROPY CALCULATION VALUE: 3

FIG. 30A

INPUT: 1<u>1</u>

| 0 | A |
| 1 | B |
| 2 |   |
| 3 |   |
| 4 |   |
| 5 |   |
| 6 |   |
| 7 |   |

ENTROPY CALCULATION VALUE: 1

DECOMPRESSION SYMBOL: AB<u>A</u>

Cmark BIT: 00<u>1</u>

DATA MASK:
11111111
11111111
<u>00000001</u>

FIG. 30B

INPUT: <u>0</u>"C" ("C"=01000011)

| 0 | C |
| 1 | A |
| 2 | B |
| 3 |   |
| 4 |   |
| 5 |   |
| 6 |   |
| 7 |   |

ENTROPY CALCULATION VALUE: 2

DECOMPRESSION SYMBOL: ABA<u>C</u>

Cmark BIT: 001<u>0</u>

DATA MASK:
11111111
11111111
00000001
<u>11111111</u>

FIG. 30C

INPUT: <u>0</u>"D" ("D"=01000100)

| 0 | D |
| 1 | C |
| 2 | A |
| 3 | B |
| 4 |   |
| 5 |   |
| 6 |   |
| 7 |   |

ENTROPY CALCULATION VALUE: 2

DECOMPRESSION SYMBOL: ABAC<u>D</u>

Cmark BIT: 0010<u>0</u>

DATA MASK:
11111111
11111111
00000001
11111111
<u>11111111</u>

FIG. 31A

INPUT: 1̲10

| 0 | A |
| 1 | D |
| 2 | C |
| 3 | B |
| 4 | |
| 5 | |
| 6 | |
| 7 | |

ENTROPY CALCULATION VALUE: 2

DECOMPRESSION SYMBOL: ABACDA̲
Cmark BIT: 00100 1̲

DATA MASK:
11111111
11111111
00000001
11111111
11111111
0000001 1̲

FIG. 31B

INPUT: 1̲11

| 0 | B |
| 1 | A |
| 2 | D |
| 3 | C |
| 4 | |
| 5 | |
| 6 | |
| 7 | |

ENTROPY CALCULATION VALUE: 2

DECOMPRESSION SYMBOL: ABACDAB̲
Cmark BIT: 001001 1̲

DATA MASK:
11111111
11111111
00000001
11111111
11111111
00000011
0000001 1̲

FIG. 31C

INPUT: 0̲"F" ("F"=01000110)

| 0 | F |
| 1 | B |
| 2 | A |
| 3 | D |
| 4 | C |
| 5 | |
| 6 | |
| 7 | |

ENTROPY CALCULATION VALUE: 3

DECOMPRESSION SYMBOL: ABACDABF̲
Cmark BIT: 0010011 0̲

DATA MASK:
11111111 11111111
11111111
00000001
11111111
11111111
00000011
00000011

FIG. 32A

INPUT: 0"G" ("G"=01000111)  ENTROPY CALCULATION VALUE: 3

| 0 | G |
| 1 | F |
| 2 | B |
| 3 | A |
| 4 | D |
| 5 | C |
| 6 |   |
| 7 |   |

DECOMPRESSION SYMBOL: ABACDABF<u>G</u>

Cmark BIT: 00100110<u>0</u>

DATA MASK:
11111111  11111111
11111111  <u>11111111</u>
00000001
11111111
11111111
00000011
00000011

FIG. 32B

INPUT: 0"E" ("E"=01000101)  ENTROPY CALCULATION VALUE: 3

| 0 | E |
| 1 | G |
| 2 | F |
| 3 | B |
| 4 | A |
| 5 | D |
| 6 | C |
| 7 |   |

DECOMPRESSION SYMBOL: ABACDABFG<u>E</u>

Cmark BIT: 0010011000<u>0</u>

DATA MASK:
11111111   11111111
11111111   11111111
00000001   <u>11111111</u>
11111111
11111111
00000011
00000011

FIG. 32C

INPUT: <u>1</u>010  ENTROPY CALCULATION VALUE: 3

| 0 | F |
| 1 | E |
| 2 | G |
| 3 | B |
| 4 | A |
| 5 | D |
| 6 | C |
| 7 |   |

DECOMPRESSION SYMBOL: ABACDABFGE<u>F</u>

Cmark BIT: 00100110000<u>1</u>

DATA MASK:
11111111   11111111
11111111   11111111
00000001   11111111
11111111   <u>00000111</u>
11111111
00000011
00000011

FIG. 33A

INPUT: 0"H" ("H"=01001000)  ENTROPY CALCULATION VALUE: 3
DECOMPRESSION SYMBOL:
ABACDABFGEFH
Cmark BIT: 001001100010
DATA MASK:
11111111  11111111
11111111  11111111
00000001  11111111
11111111  00000111
11111111  11111111
00000011
00000011

| 0 | H |
| 1 | F |
| 2 | E |
| 3 | G |
| 4 | B |
| 5 | A |
| 6 | D |
| 7 | C |

FIG. 33B

INPUT: 0"J" ("J"=01001010) ENTROPY CALCULATION VALUE: 3
DECOMPRESSION SYMBOL:
ABACDABFGEFHJ
Cmark BIT: 0010011000100
DATA MASK:
11111111  11111111
11111111  11111111
00000001  11111111
11111111  00000111
11111111  11111111
00000011  11111111
00000011

| 0 | J |
| 1 | H |
| 2 | F |
| 3 | E |
| 4 | G |
| 5 | B |
| 6 | A |
| 7 | D |

FIG. 33C

INPUT: 1110  ENTROPY CALCULATION VALUE: 3
DECOMPRESSION SYMBOL:
ABACDABFGEFHJA
Cmark BIT: 00100110001001
DATA MASK:
11111111  11111111
11111111  11111111
00000001  11111111
11111111  00000111
11111111  11111111
00000011  11111111
00000011  00000111

| 0 | A |
| 1 | J |
| 2 | H |
| 3 | F |
| 4 | E |
| 5 | G |
| 6 | B |
| 7 | D |

FIG. 34

INPUT: 1110   ENTROPYCALCULATION VALUE:3

| 0 | B |
| 1 | A |
| 2 | J |
| 3 | H |
| 4 | F |
| 5 | E |
| 6 | G |
| 7 | D |

DECOMPRESSION SYMBOL:
ABACDABFGEFHJAB
Cmark BIT:  001001100010011

DATA MASK:
11111111 11111111 00000111
11111111 11111111
00000001 11111111
11111111 00000111
11111111 11111111
00000011 11111111
00000011 00000111

FIG. 35
INPUT: CASE OF DCBC...
EXAMPLE: CASE WHERE ENTROPY CULLING IS PERFORMED WITH 2 HITS
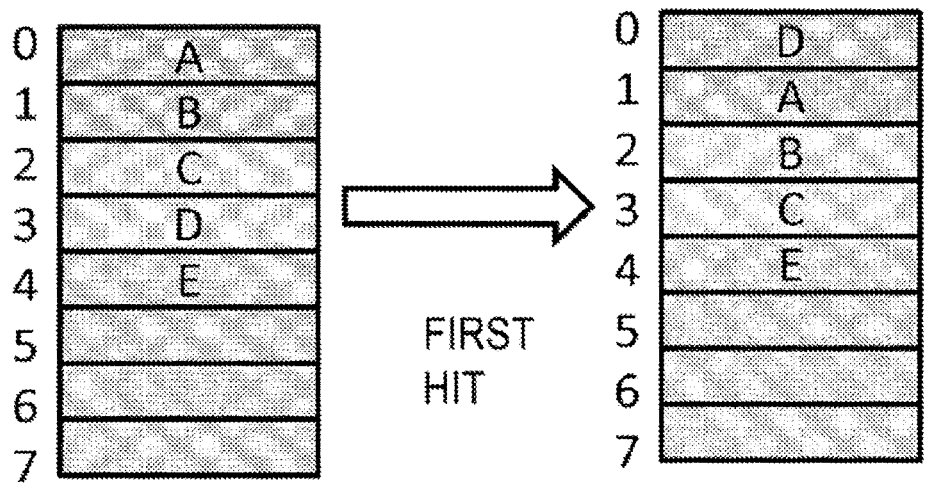
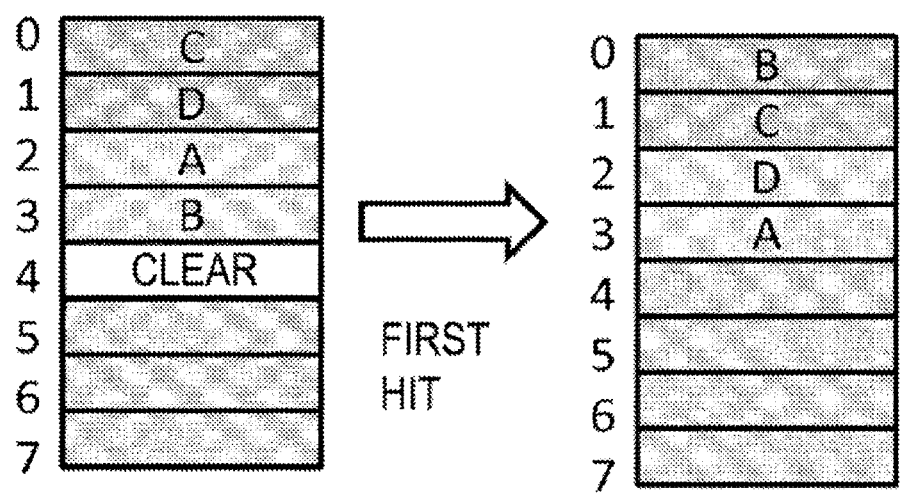

FIG. 39

|  | TRANSMIT INDEX (TYPE 3) | TRANSMIT ORIGINAL SYMBOL (TYPE 4) |
|---|---|---|
| RESERVE ENTRY FOR COMMAND (TYPE 1) | Reserve Entry, Transmit Index (RETI) (FIRST METHOD) | Reserve Entry, Transmit Original (RETO) (SECOND METHOD) |
| DO NOT RESERVE ENTRY FOR COMMAND (TYPE 2) | Free Entry, Transmit Index (FETI) (THIRD METHOD) | Free Entry, Transmit Original (FETO) (FOURTH METHOD) |

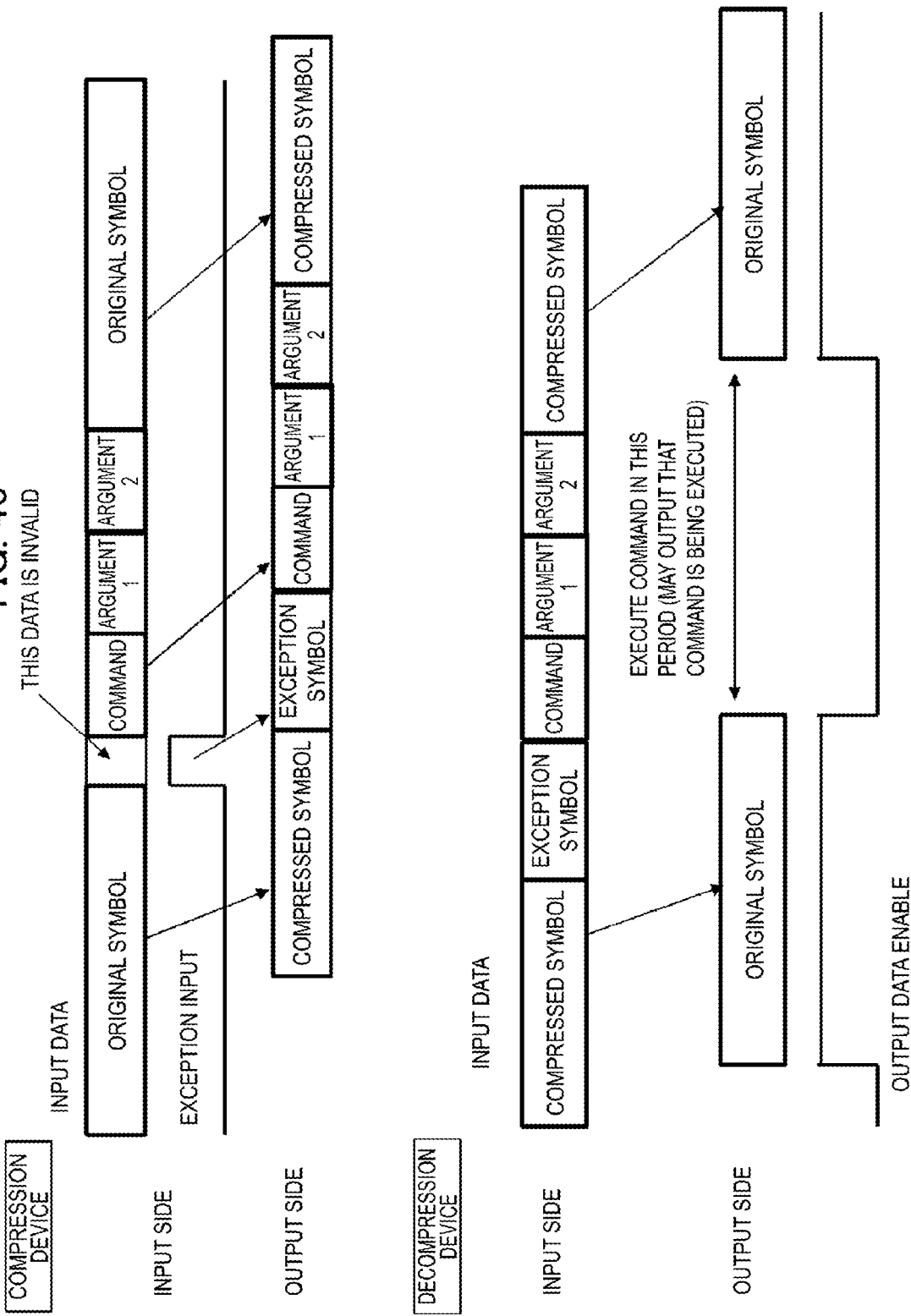

ORIGINAL SYMBOL(INPUT):
ABAC(RET)BACAGFHJK(EOS)  ENTROPY CALCULATION VALUE:

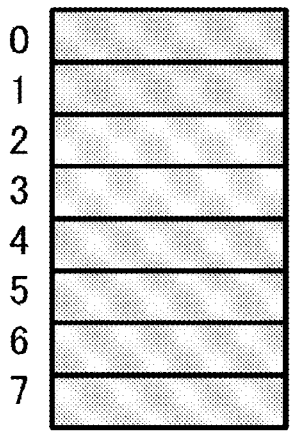

FIG. 41A

COMPRESSION SYMBOL:
Cmark BIT:
DATA MASK:

ORIGINAL SYMBOL(INPUT):
<u>A</u>BAC(RET)BACAGFHJK(EOS)  ENTROPY CALCULATION VALUE: 0

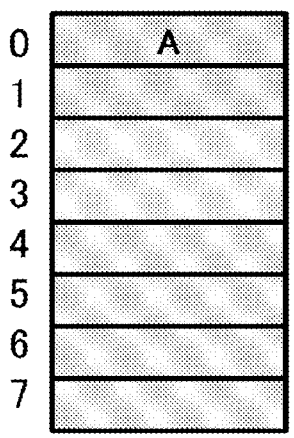

FIG. 41B

COMPRESSION SYMBOL: <u>A</u>
Cmark BIT : <u>0</u>
DATA MASK:
<u>11111111</u>

ORIGINAL SYMBOL(INPUT):
A<u>B</u>AC(RET)BACAGFHJK(EOS)  ENTROPY CALCULATION VALUE: 1

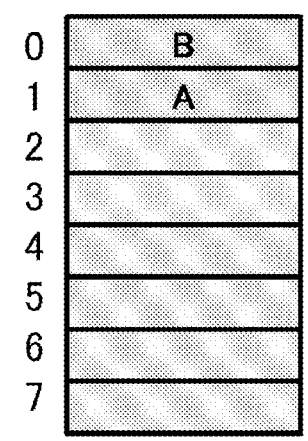

FIG. 41C

COMPRESSION SYMBOL: A<u>B</u>
Cmark BIT : 0<u>0</u>
DATA MASK:
11111111
<u>11111111</u>

FIG. 42A

ORIGINAL SYMBOL(INPUT):
AB<u>A</u>C(RET)BACAGFHJK(EOS)   ENTROPYCALCULATION VALUE:1

| 0 | A |
|---|---|
| 1 | B |
| 2 | |
| 3 | |
| 4 | |
| 5 | |
| 6 | |
| 7 | |

COMPRESSION SYMBOL: AB1
Cmark BIT : 001
DATA MASK:
11111111
11111111
00000001

FIG. 42B

ORIGINAL SYMBOL(INPUT):
ABA<u>C</u>(RET)BACAGFHJK(EOS)   ENTROPYCALCULATION VALUE: 2

| 0 | C |
|---|---|
| 1 | A |
| 2 | B |
| 3 | |
| 4 | |
| 5 | |
| 6 | |
| 7 | |

COMPRESSION SYMBOL: AB1<u>C</u>
Cmark BIT : 001<u>0</u>
DATA MASK:
11111111
11111111
00000001
<u>11111111</u>

FIG. 42C

ORIGINAL SYMBOL(INPUT):
ABAC<u>(RET)</u>BACAGFHJK(EOS)   ENTROPYCALCULATION VALUE:2

| 0 | C |
|---|---|
| 1 | A |
| 2 | B |
| 3 | |
| 4 | |
| 5 | |
| 6 | |
| 7 | |

COMPRESSION SYMBOL: AB1C<u>CE</u>
Cmark BIT : 0010<u>00</u>
DATA MASK:
11111111
11111111
00000001
11111111
<u>11111111</u>
<u>11111111</u>

COMMAND SYMBOL

PERFORM COPING WITH FETO AND USE ENTRY OF INDEX 0

OUTPUT COMMAND SYMBOL

FIG. 43A

ORIGINAL SYMBOL (INPUT):
ABAC(RET)BACAGFHJK(EOS)    ENTROPYCALCULATION VALUE:

Table indices 0-7 (empty)

COMPRESSION SYMBOL: AB1CCE
Cmark BIT : 001000
DATA MASK:
11111111
11111111
00000001
11111111
11111111
11111111

INITIALIZE TABLE

FIG. 43B

ORIGINAL SYMBOL (INPUT):
ABAC(RET)B̲ACAGFHJK(EOS)    ENTROPYCALCULATION VALUE: 0

Table: 0: B, 1-7: empty

COMPRESSION SYMBOL: AB1CCEB̲
Cmark BIT : 0010000̲
DATA MASK:
11111111
11111111
00000001
11111111
11111111
11111111
1̲1̲1̲1̲1̲1̲1̲1̲

FIG. 43C

ORIGINAL SYMBOL (INPUT):
ABAC(RET)BA̲CAGFHJK(EOS)   ENTROPYCALCULATION VALUE: 1

Table: 0: A, 1: B, 2-7: empty

COMPRESSION SYMBOL: AB1CCEBA̲
Cmark BIT : 00100000̲
DATA MASK:
11111111
11111111
00000001
11111111
11111111
11111111
11111111
1̲1̲1̲1̲1̲1̲1̲1̲

FIG. 44A

ORIGINAL SYMBOL(INPUT):
ABAC(RET)BA<u>C</u>AGFHJK(EOS)   ENTROPYCALCULATION VALUE: 2

| 0 | C |
|---|---|
| 1 | A |
| 2 | B |
| 3 |   |
| 4 |   |
| 5 |   |
| 6 |   |
| 7 |   |

COMPRESSION SYMBOL: AB1CCEBA<u>C</u>
Cmark BIT    : 00100000<u>0</u>
DATA MASK:
11111111    <u>11111111</u>
11111111
00000001
11111111
11111111
11111111
11111111
11111111

FIG. 44B

ORIGINAL SYMBOL(INPUT):
ABAC(RET)BAC<u>A</u>GFHJK(EOS)   ENTROPYCALCULATION VALUE: 2

| 0 | A |
|---|---|
| 1 | C |
| 2 | B |
| 3 |   |
| 4 |   |
| 5 |   |
| 6 |   |
| 7 |   |

COMPRESSION SYMBOL: AB1CCEBAC<u>1</u>
Cmark BIT    : 0010000<u>001</u>
DATA MASK:
11111111    11111111
11111111    <u>00000011</u>
00000001
11111111
11111111
11111111
11111111
11111111

FIG. 44C

ORIGINAL SYMBOL(INPUT):
ABAC(RET)BACA<u>G</u>FHJK(EOS)   ENTROPYCALCULATION VALUE: 2

| 0 | G |
|---|---|
| 1 | A |
| 2 | C |
| 3 | B |
| 4 |   |
| 5 |   |
| 6 |   |
| 7 |   |

COMPRESSION SYMBOL: AB1CCEBAC1<u>G</u>
Cmark BIT    : 0010000001<u>0</u>
DATA MASK:
11111111    11111111
11111111    00000011
00000001    <u>11111111</u>
11111111
11111111
11111111
11111111
11111111

FIG. 45A

ORIGINAL SYMBOL(INPUT):
ABAC(RET)BACAGF̲HJK(EOS)   ENTROPYCALCULATION VALUE:3

| 0 | F |
|---|---|
| 1 | G |
| 2 | A |
| 3 | C |
| 4 | B |
| 5 | |
| 6 | |
| 7 | |

COMPRESSION SYMBOL:AB1CCEBAC1GF̲
Cmark BIT   :001000000010̲0
DATA MASK:
11111111   11111111
11111111   00000011
00000001   11111111
11111111   11111111̲
11111111
11111111
11111111
11111111

FIG. 45B

ORIGINAL SYMBOL(INPUT):
ABAC(RET)BACAGFH̲JK(EOS)   ENTROPYCALCULATION VALUE:3

| 0 | H |
|---|---|
| 1 | F |
| 2 | G |
| 3 | A |
| 4 | C |
| 5 | B |
| 6 | |
| 7 | |

COMPRESSION SYMBOL:AB1CCEBAC1GFH̲
Cmark BIT   :0010000001000̲
DATA MASK:
11111111   11111111
11111111   00000011
00000001   11111111
11111111   11111111
11111111   11111111̲
11111111
11111111
11111111

FIG. 45C

ORIGINAL SYMBOL(INPUT):
ABAC(RET)BACAGFHJ̲K(EOS)   ENTROPYCALCULATION VALUE:3

| 0 | J |
|---|---|
| 1 | H |
| 2 | F |
| 3 | G |
| 4 | A |
| 5 | C |
| 6 | B |
| 7 | |

COMPRESSION SYMBOL:AB1CCEBAC1GFHJ̲
Cmark BIT   :00100000010000̲
DATA MASK:
11111111   11111111
11111111   00000011
00000001   11111111
11111111   11111111
11111111   11111111
11111111   11111111̲
11111111
11111111

FIG. 46A

ORIGINAL SYMBOL(INPUT): ABAC(RET)BACAGFHJK(EOS)

ENTROPYCALCULATION VALUE: 3

| Index | Symbol |
|---|---|
| 0 | K |
| 1 | J |
| 2 | H |
| 3 | F |
| 4 | G |
| 5 | A |
| 6 | C |
| 7 | B |

COMPRESSION SYMBOL:
AB1CCEBAC1GFHJK
Cmark BIT :001000000100000
DATA MASK:
11111111  11111111
11111111  00000011
00000001  11111111
11111111  11111111
11111111  11111111
11111111  11111111
11111111  11111111
11111111

FIG. 46B

ORIGINAL SYMBOL(INPUT): ABAC(RET)BACAGFHJK(EOS)

ENTROPYCALCULATION VALUE: 3

| Index | Symbol |
|---|---|
| 0 | K |
| 1 | J |
| 2 | H |
| 3 | F |
| 4 | G |
| 5 | A |
| 6 | C |
| 7 | B |

COMPRESSION SYMBOL:
AB1CCEBAC1GFHJKKF
Cmark BIT :00100000010000000
DATA MASK:
11111111  11111111  11111111
11111111  00000011
00000001  11111111
11111111  11111111
11111111  11111111
11111111  11111111
11111111  11111111
11111111  11111111

OUTPUT COMMAND SYMBOL

PERFORM COPING WITH FIFO AND UNSE ENTRY OF INDEX 0

FIG. 50A

INPUT: 0"C"

```
0  C
1  A
2  B
3
4
5
6
7
```

ENTROPY CALCULATION VALUE: 2
DECOMPRESSION SYMBOL: ABACBAC
Cmark BIT    :0010000
DATA MASK:
11111111
11111111
00000001
11111111
11111111
11111111
11111111

FIG. 50B

INPUT: 11

```
0  A
1  C
2  B
3
4
5
6
7
```

ENTROPY CALCULATION VALUE: 2
DECOMPRESSION SYMBOL: ABACBACA
Cmark BIT    :00100001
DATA MASK:
11111111
11111111
00000001
11111111
11111111
11111111
11111111
00000011

FIG. 50C

INPUT: 0"G"

```
0  G
1  A
2  C
3  B
4
5
6
7
```

ENTROPY CALCULATION VALUE: 2
DECOMPRESSION SYMBOL: ABACBACAG
Cmark BIT    :001000010
DATA MASK:
11111111    11111111
11111111
00000001
11111111
11111111
11111111
11111111
00000011

FIG. 51A

INPUT: 0"F"

| | |
|---|---|
| 0 | F |
| 1 | G |
| 2 | A |
| 3 | C |
| 4 | B |
| 5 | |
| 6 | |
| 7 | |

ENTROPY CALCULATION VALUE: 3
DECOMPRESSION SYMBOL:
ABACBACAGF
Cmark BIT :0010000100
DATA MASK:
11111111　11111111
11111111　11111111
00000001
11111111
11111111
11111111
11111111
00000011

FIG. 51B

INPUT: 0"H"

| | |
|---|---|
| 0 | H |
| 1 | F |
| 2 | G |
| 3 | A |
| 4 | C |
| 5 | B |
| 6 | |
| 7 | |

ENTROPYCALCULATION VALUE: 3
DECOMPRESSION SYMBOL:
AB1CCEBAC1GFH
Cmark BIT :0010000001000
DATA MASK:
11111111　11111111
11111111　11111111
00000001　11111111
11111111
11111111
11111111
11111111
00000011

FIG. 51C

INPUT: 0"J"

| | |
|---|---|
| 0 | J |
| 1 | H |
| 2 | F |
| 3 | G |
| 4 | A |
| 5 | C |
| 6 | B |
| 7 | |

ENTROPYCALCULATION VALUE:3
DECOMPRESSION SYMBOL:
AB1CCEBAC1GFHJ
Cmark BIT :00100000010000
DATA MASK:
11111111　11111111
11111111　11111111
00000001　11111111
11111111　11111111
11111111
11111111
11111111
00000011

FIG. 52A

INPUT: 0"K"

| 0 | K |
| 1 | J |
| 2 | H |
| 3 | F |
| 4 | G |
| 5 | A |
| 6 | C |
| 7 | B |

ENTROPYCALCULATION VALUE: 3
DECOMPRESSION SYMBOL:
ABACBACAGFHJK
Cmark BIT : 0010000100000
DATA MASK:
11111111  11111111
11111111  11111111
00000001  11111111
11111111  11111111
11111111  11111111
11111111
11111111
00000011

FIG. 52B

INPUT: 0"K", 0"F"

| 0 | K |
| 1 | J |
| 2 | H |
| 3 | F |
| 4 | G |
| 5 | A |
| 6 | C |
| 7 | B |

ENTROPYCALCULATION VALUE: 3
DECOMPRESSION SYMBOL:
ABACBACAGFHJK
Cmark BIT : 001000000100000
DATA MASK:
11111111  11111111
11111111  11111111
00000001  11111111
11111111  11111111
11111111  11111111
11111111  11111111
11111111
00000011

- CONFLICT OCCURS BECAUSE K
HAS ALREADY BEEN REGISTERED
- RECOGNIZE AND EXECUTE
COMMAND EOS FROM NEXT "F"

FIG. 54A

ORIGINAL SYMBOL(INPUT):
AB<u>A</u>C(RET)BACAGFHJK(EOS)    ENTROPYCALCULATION VALUE: 2

| 0 | C |
|---|---|
| 1 | F |
| 2 | A |
| 3 | B |
| 4 |   |
| 5 |   |
| 6 |   |
| 7 |   |

COMPRESSION SYMBOL: AB3

Cmark BIT : 001

DATA MASK:
11111111
11111111
00000011

FIG. 54B

ORIGINAL SYMBOL(INPUT):
AB<u>AC</u>(RET)BACAGFHJK(EOS)    ENTROPYCALCULATION VALUE: 2

| 0 | C |
|---|---|
| 1 | F |
| 2 | A |
| 3 | B |
| 4 |   |
| 5 |   |
| 6 |   |
| 7 |   |

COMPRESSION SYMBOL: AB30

Cmark BIT : 0011

DATA MASK:
11111111
11111111
00000011
00000011

USE RESERVED COMMAND SYMBOL FOR COMPRESSION

FIG. 54C

ORIGINAL SYMBOL(INPUT):
ABAC<u>(RET)</u>BACAGFHJK(EOS)    ENTROPYCALCULATION VALUE: 1

| 0 | C |
|---|---|
| 1 | F |
| 2 |   |
| 3 |   |
| 4 |   |
| 5 |   |
| 6 |   |
| 7 |   |

COMPRESSION SYMBOL: AB30C

Cmark BIT : 00110

DATA MASK:
11111111
11111111
00000011
00000011
11111111

OUTPUT ORIGINAL SYMBOL BY RETO

RESET

FIG. 55A

ORIGINAL SYMBOL(INPUT):
ABAC(RET)B<u>A</u>CAGFHJK(EOS)  ENTROPYCALCULATION VALUE:2

| 0 | C |
| 1 | F |
| 2 | B |
| 3 |   |
| 4 |   |
| 5 |   |
| 6 |   |
| 7 |   |

COMPRESSION SYMBOL:AB30CB

Cmark BIT :001100

DATA MASK:
11111111
11111111
00000011
00000011
11111111
11111111

FIG. 55B

ORIGINAL SYMBOL(INPUT):
ABAC(RET)B<u>A</u>CAGFHJK(EOS)  ENTROPYCALCULATION VALUE:2

| 0 | C |
| 1 | F |
| 2 | A |
| 3 | B |
| 4 |   |
| 5 |   |
| 6 |   |
| 7 |   |

COMPRESSION SYMBOL:AB30CBA

Cmark BIT:0011000

DATA MASK:
11111111
11111111
00000011
00000011
11111111
11111111
11111111

FIG. 55C

ORIGINAL SYMBOL(INPUT):
ABAC(RET)BA<u>C</u>AGFHJK(EOS)  ENTROPYCALCULATION VALUE:2

| 0 | C |
| 1 | F |
| 2 | A |
| 3 | B |
| 4 |   |
| 5 |   |
| 6 |   |
| 7 |   |

COMPRESSION SYMBOL:AB30CBA0

Cmark BIT:00110001

DATA MASK:
11111111
11111111
00000011
00000011
11111111
11111111
11111111
00000011

FIG. 56A

ORIGINAL SYMBOL(INPUT):
ABAC(RET)BAC<u>A</u>GFHJK(EOS)   ENTROPYCALCULATION VALUE:2

| 0 | C |
|---|---|
| 1 | F |
| 2 | A |
| 3 | B |
| 4 |   |
| 5 |   |
| 6 |   |
| 7 |   |

COMPRESSION SYMBOL:AB30CBA02

Cmark BIT   :001100011

DATA MASK:
11111111   00000011
11111111
00000011
00000011
11111111
11111111
11111111
00000011

FIG. 56B

ORIGINAL SYMBOL(INPUT):
ABAC(RET)BACA<u>G</u>FHJK(EOS)   ENTROPYCALCULATION VALUE:3

| 0 | C |
|---|---|
| 1 | F |
| 2 | G |
| 3 | A |
| 4 | B |
| 5 |   |
| 6 |   |
| 7 |   |

COMPRESSION SYMBOL:AB30CBA02G

Cmark BIT   :0011000110

DATA MASK:
11111111   00000011
11111111   11111111
00000011
00000011
11111111
11111111
11111111
00000011

FIG. 56C

ORIGINAL SYMBOL(INPUT):
ABAC(RET)BACAG<u>F</u>HJK(EOS)   ENTROPYCALCULATION VALUE: 3

| 0 | C |
|---|---|
| 1 | F |
| 2 | G |
| 3 | A |
| 4 | B |
| 5 |   |
| 6 |   |
| 7 |   |

COMPRESSION SYMBOL:AB30CBA02G1

Cmark BIT   :00110001101

DATA MASK:
11111111   00000011
11111111   11111111
00000011   00000111
00000011
11111111
11111111
11111111
00000011

FIG. 57A

ORIGINAL SYMBOL(INPUT):
ABAC(RET)BACAGF<u>H</u>JK(EOS)  ENTROPYCALCULATION VALUE:3

| 0 | C |
|---|---|
| 1 | F |
| 2 | H |
| 3 | G |
| 4 | A |
| 5 | B |
| 6 |   |
| 7 |   |

COMPRESSION SYMBOL:
AB30CBA02G1H
Cmark BIT  :001100011010

DATA MASK:
11111111   00000011
11111111   11111111
00000011   00000111
00000011   11111111
11111111
11111111
11111111
00000011

FIG. 57B

ORIGINAL SYMBOL(INPUT):
ABAC(RET)BACAGFH<u>J</u>K(EOS)  ENTROPYCALCULATION VALUE: 3

| 0 | C |
|---|---|
| 1 | F |
| 2 | J |
| 3 | H |
| 4 | G |
| 5 | A |
| 6 | B |
| 7 |   |

COMPRESSION SYMBOL:
AB30CBA02G1HJ
Cmark BIT  :0011000110100

DATA MASK:
11111111   00000011
11111111   11111111
00000011   00000111
00000011   11111111
11111111   11111111
11111111
11111111
00000011

FIG. 57C

ORIGINAL SYMBOL(INPUT):
ABAC(RET)BACAGFHJ<u>K</u>(EOS)  ENTROPYCALCULATION VALUE: 3

| 0 | C |
|---|---|
| 1 | F |
| 2 | K |
| 3 | J |
| 4 | H |
| 5 | G |
| 6 | A |
| 7 | B |

COMPRESSION SYMBOL:
AB30CBA02G1HJK
Cmark BIT  :00110001101000

DATA MASK:
11111111   00000011
11111111   11111111
00000011   00000111
00000011   11111111
11111111   11111111
11111111   11111111
11111111
00000011

ORIGINAL SYMBOL(INPUT):
ABAC(RET)BACAGFHJK_(EOS)

ENTROPY
CALCULATION VALUE:3

COMPRESSION SYMBOL:AB30CBA02G1HJKF

Cmark BIT  :001100011010000

DATA MASK:
11111111  00000011
11111111  11111111
00000011  00000111
00000011  11111111
11111111  11111111
11111111  11111111
11111111  11111111
00000011

| 0 | C |
| 1 | F |
| 2 | K |
| 3 | J |
| 4 | H |
| 5 | G |
| 6 | A |
| 7 | B |

OUTPUT ORIGINAL SYMBOL BY RETO

FIG. 60A

INPUT: 1̲11

| 0 | C |
| 1 | F |
| 2 | A |
| 3 | B |
| 4 |   |
| 5 |   |
| 6 |   |
| 7 |   |

ENTROPYCALCULATION VALUE: 2

DECOMPRESSION SYMBOL: ABA

Cmark BIT : 001

DATA MASK:
11111111
11111111
00000011

FIG. 60B

INPUT: 1̲00

| 0 | C |
| 1 | F |
| 2 | A |
| 3 | B |
| 4 |   |
| 5 |   |
| 6 |   |
| 7 |   |

ENTROPYCALCULATION VALUE: 2

DECOMPRESSION SYMBOL: ABAC

Cmark BIT : 0011

DATA MASK:
11111111
11111111
00000011
00000011

FIG. 60C

INPUT: 0̲"C(=RET)"

| 0 | C |
| 1 | F |
| 2 |   |
| 3 |   |
| 4 |   |
| 5 |   |
| 6 |   |
| 7 |   | → RESET

ENTROPYCALCULATION VALUE: 1

DECOMPRESSION SYMBOL: ABAC(RET)

Cmark BIT : 00110

DATA MASK:
11111111
11111111
00000011
00000011
11111111

FIG. 61A

INPUT:
0"B"

| 0 | C |
| 1 | F |
| 2 | B |
| 3 |   |
| 4 |   |
| 5 |   |
| 6 |   |
| 7 |   |

ENTROPYCALCULATION VALUE: 2

DECOMPRESSION SYMBOL: ABAC(RET)B

Cmark BIT : 001100

DATA MASK:
11111111
11111111
00000011
00000011
11111111
11111111

FIG. 61B

INPUT:
0"A"

| 0 | C |
| 1 | F |
| 2 | A |
| 3 | B |
| 4 |   |
| 5 |   |
| 6 |   |
| 7 |   |

ENTROPYCALCULATION VALUE: 2

DECOMPRESSION SYMBOL: ABAC(RET)BA

Cmark BIT : 0011000

DATA MASK:
11111111
11111111
00000011
00000011
11111111
11111111
11111111

FIG. 61C

INPUT:
100

| 0 | C |
| 1 | F |
| 2 | A |
| 3 | B |
| 4 |   |
| 5 |   |
| 6 |   |
| 7 |   |

ENTROPYCALCULATION VALUE: 2

DECOMPRESSION SYMBOL: ABAC(RET)BAC

Cmark BIT : 00110001

DATA MASK:
11111111    00000011
11111111
00000011
00000011
11111111
11111111
11111111

FIG. 62A

INPUT:
<u>1</u>10

| 0 | C |
| 1 | F |
| 2 | A |
| 3 | B |
| 4 |   |
| 5 |   |
| 6 |   |
| 7 |   |

ENTROPYCALCULATION VALUE: 2

DECOMPRESSION SYMBOL: ABAC(RET)BACA
Cmark BIT : 001100011
DATA MASK:
11111111  00000011
11111111  00000011
00000011
00000011
11111111
11111111
11111111

FIG. 62B

INPUT:
<u>0</u>"G"

| 0 | C |
| 1 | F |
| 2 | G |
| 3 | A |
| 4 | B |
| 5 |   |
| 6 |   |
| 7 |   |

ENTROPYCALCULATION VALUE: 3

DECOMPRESSION SYMBOL: ABAC(RET)BACAG
Cmark BIT : 0011000110
DATA MASK:
11111111  00000011
11111111  00000011
00000011  11111111
00000011
11111111
11111111
11111111

FIG. 62C

INPUT:
<u>0</u>"F"

| 0 | C |
| 1 | F |
| 2 | G |
| 3 | A |
| 4 | B |
| 5 |   |
| 6 |   |
| 7 |   |

ENTROPYCALCULATION VALUE: 3

DECOMPRESSION SYMBOL: ABAC(RET)BACAGF
Cmark BIT : 00110001101
DATA MASK:
11111111  00000011
11111111  00000011
00000011  11111111
00000011  00000111
11111111
11111111
11111111

FIG. 63A

INPUT: 0"H"

| 0 | C |
|---|---|
| 1 | F |
| 2 | H |
| 3 | G |
| 4 | A |
| 5 | B |
| 6 |   |
| 7 |   |

ENTROPYCALCULATION VALUE:3
DECOMPRESSION SYMBOL:
ABAC(RET)BACAGFH
Cmark BIT :001100011010
DATA MASK:
11111111    00000011
11111111    00000011
00000011    11111111
00000011    00000111
1111111     11111111
11111111
11111111

FIG. 63B

INPUT: 0"J"

| 0 | C |
| 1 | F |
| 2 | J |
| 3 | H |
| 4 | G |
| 5 | A |
| 6 | B |
| 7 |   |

ENTROPYCALCULATION VALUE:3
DECOMPRESSION SYMBOL:
ABAC(RET)BACAGFHJ
Cmark BIT :0011000110100
DATA MASK:
11111111    00000011
11111111    00000011
00000011    11111111
00000011    00000111
1111111     11111111
11111111    11111111
11111111

FIG. 63C

INPUT: 0"K"

| 0 | C |
| 1 | F |
| 2 | K |
| 3 | J |
| 4 | H |
| 5 | G |
| 6 | A |
| 7 | B |

ENTROPYCALCULATION VALUE:3
DECOMPRESSION SYMBOL:
ABAC(RET)BACAGFHJK
Cmark BIT :00110001101000
DATA MASK:
11111111    00000011
11111111    00000011
00000011    11111111
00000011    00000111
1111111     11111111
11111111    11111111
11111111    11111111

FIG. 64

INPUT:
<u>0</u>"F(=EOS)"

| | |
|---|---|
| 0 | C |
| 1 | F |
| 2 | K |
| 3 | J |
| 4 | H |
| 5 | G |
| 6 | A |
| 7 | B |

ENTROPYCALCULATION VALUE: 3

DECOMPRESSION SYMBOL:
ABACBACAGFHJKF
Cmark BIT :001100011010001

DATA MASK:
11111111  00000011  00000111
11111111  00000011
00000011  11111111
00000011  00000111
1111111   11111111
11111111  11111111
11111111  11111111

ORIGINAL SYMBOL(INPUT): ABACDBC(EOS)

ENTROPY CALCULATION VALUE: 2
HIT COUNT : 1

COMPRESSION SYMBOL: AB2
Cmark BIT: 001
DATA MASK:
11111111
11111111
00000011

FIG. 66A

| 0 | COMMAND1 |
| 1 | A |
| 2 | B |
| 3 | |
| 4 | |
| 5 | |
| 6 | |
| 7 | |

ORIGINAL SYMBOL(INPUT): ABACDBC(EOS)

ENTROPY CALCULATION VALUE: 2
HIT COUNT : 1

COMPRESSION SYMBOL: AB2C
Cmark BIT : 0010
DATA MASK:
11111111
11111111
00000011
11111111

FIG. 66B

| 0 | COMMAND1 |
| 1 | C |
| 2 | A |
| 3 | B |
| 4 | |
| 5 | |
| 6 | |
| 7 | |

ORIGINAL SYMBOL(INPUT): ABACDBC(EOS)

ENTROPY CALCULATION VALUE: 3
HIT COUNT : 1

COMPRESSION SYMBOL: AB2CD
Cmark BIT : 00100
DATA MASK:
11111111
11111111
00000011
11111111
11111111

FIG. 66C

| 0 | COMMAND1 |
| 1 | D |
| 2 | C |
| 3 | A |
| 4 | B |
| 5 | |
| 6 | |
| 7 | |

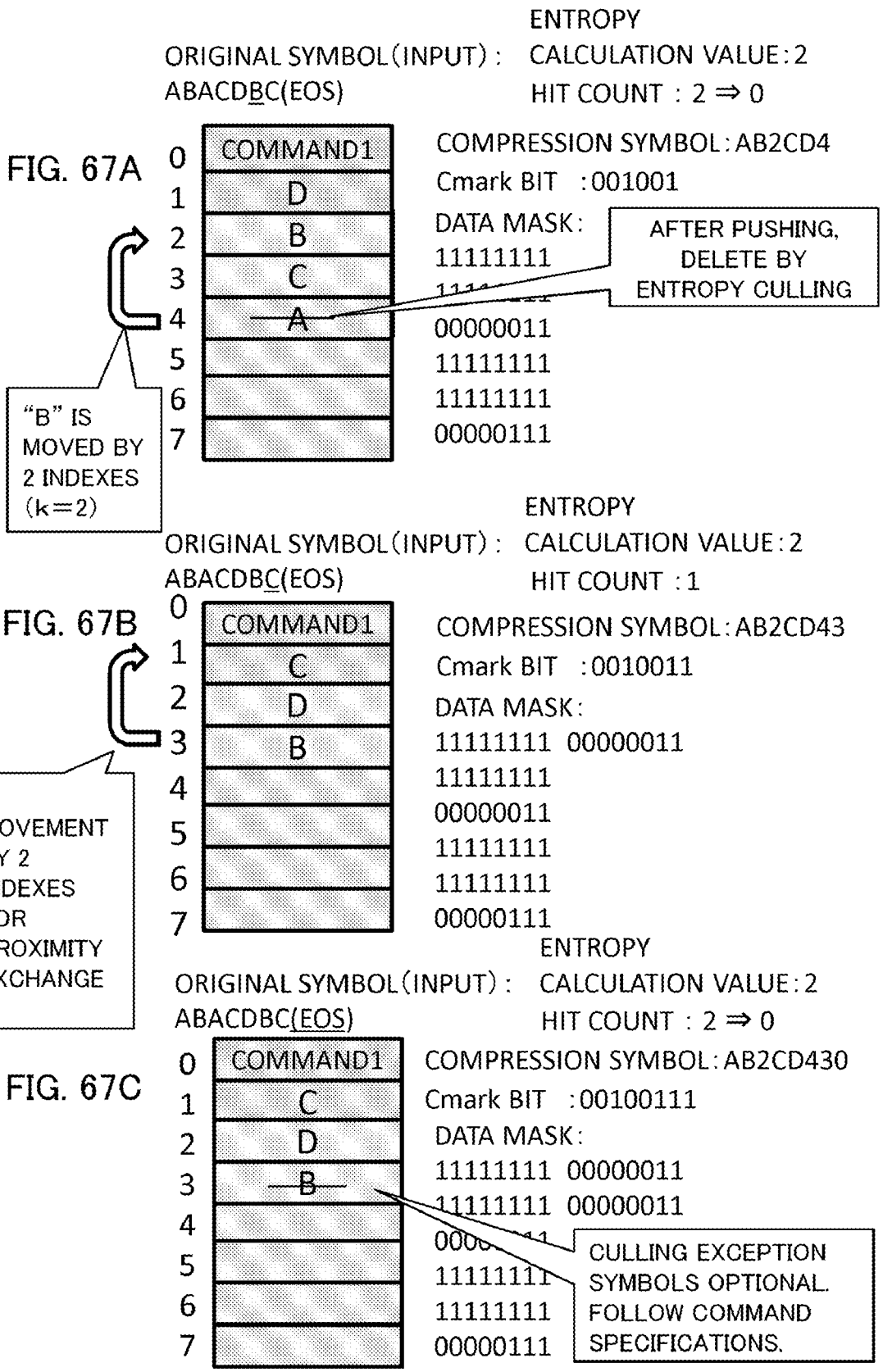

FIG. 69A

INPUT: 1̲10

| 0 | COMMAND1 |
| 1 | A |
| 2 | B |
| 3 | |
| 4 | |
| 5 | |
| 6 | |
| 7 | |

ENTROPYCALCULATION VALUE : 2
HIT COUNT : 1

DECOMPRESSION SYMBOL : ABA

Cmark BIT : 001

DATA MASK :
11111111
11111111
00000011

FIG. 69B

INPUT: 0̲"C"

| 0 | COMMAND1 |
| 1 | C |
| 2 | A |
| 3 | B |
| 4 | |
| 5 | |
| 6 | |
| 7 | |

ENTROPYCALCULATION VALUE : 2
HIT COUNT : 1

DECOMPRESSION SYMBOL : ABAC

Cmark BIT : 0010

DATA MASK :
11111111
11111111
00000011
11111111

FIG. 69C

INPUT: 0̲"D"

| 0 | COMMAND1 |
| 1 | D |
| 2 | C |
| 3 | A |
| 4 | B |
| 5 | |
| 6 | |
| 7 | |

ENTROPYCALCULATION VALUE : 3
HIT COUNT : 1

DECOMPRESSION SYMBOL : ABACD

Cmark BIT : 00100

DATA MASK :
11111111
11111111
00000011
11111111
11111111

FIG. 70A

INPUT: 1100

| 0 | COMMAND1 |
| 1 | D |
| 2 | B |
| 3 | C |
| 4 | A |
| 5 | |
| 6 | |
| 7 | |

近接交換
のため
2つ移動

ENTROPYCALCULATION VALUE: 2 ⇒ 0
HIT COUNT : 0
DECOMPRESSION SYMBOL: ABACDB
Cmark BIT : 001001
DATA MASK:
11111111
11111111
00000011
11111111
11111111
00000111

ENTROPYCALCULATION VALUE: 2
HIT COUNT : 1

FIG. 70B

INPUT: 111

| 0 | COMMAND1 |
| 1 | C |
| 2 | D |
| 3 | B |
| 4 | |
| 5 | |
| 6 | |
| 7 | |

近接交換
のため
2つ移動

DECOMPRESSION SYMBOL: ABACDBC
Cmark BIT : 0010011
DATA MASK:
11111111
11111111
00000011
11111111
11111111
00000111
00000011

ENTROPYCALCULATION VALUE: 2
HIT COUNT : 0
DECOMPRESSION SYMBOL:
ABACDBC(EOS)
Cmark BIT : 00100111
DATA MASK:
11111111  0000011
11111111
00000011
11111111
11111111
00000111
00000011

FIG. 70C

INPUT: 100

| 0 | COMMAND1 |
| 1 | C |
| 2 | D |
| 3 | B |
| 4 | |
| 5 | |
| 6 | |
| 7 | |

FIG. 81A

INPUT DATA: ABCABABDAB

| | CONVERSION TABLE |
|---|---|
| 0 | |
| 1 | |
| 2 | |
| 3 | |

USAGE RATE: 0/20
HIT RATE: 5/5
ENTROPY: 0   ←ceil(log2((0/20 / 5/5)*4)) = ceil(0)

| | BEFORE 4 INPUTS | BEFORE 3 INPUTS | BEFORE 2 INPUTS | BEFORE 1 INPUT | CURRENT | AVERAGE VALUE |
|---|---|---|---|---|---|---|
| USAGE RATE | 0/4 | 0/4 | 0/4 | 0/4 | 0/4 | 0/20 |
| HIT RATE | 1 | 1 | 1 | 1 | 1 | 5/5 |

FIG. 81B

INPUT DATA: ABCABABDAB

| | CONVERSION TABLE |
|---|---|
| 0 | A |
| 1 | |
| 2 | |
| 3 | |

USAGE RATE: 1/20
HIT RATE: 4/5
ENTROPY: 0   ←ceil(log2((1/20 / 4/5)*4))
              = ceil(-2)

| | BEFORE 4 INPUTS | BEFORE 3 INPUTS | BEFORE 2 INPUTS | BEFORE 1 INPUT | CURRENT | AVERAGE VALUE |
|---|---|---|---|---|---|---|
| USAGE RATE | 0/4 | 0/4 | 0/4 | 0/4 | 1/4 | 1/20 |
| HIT RATE | 1 | 1 | 1 | 1 | 0 | 4/5 |

FIG. 82A

INPUT DATA: A B C A B A B D A B

| | CONVERSION TABLE |
|---|---|
| 0 | B |
| 1 | A |
| 2 | |
| 3 | |

USAGE RATE: 3/20
HIT RATE: 3/5
ENTROPY: 0 ← ceil(log2((3/20 / 3/5)*4))
         = ceil(0)

| | BEFORE 4 INPUTS | BEFORE 3 INPUTS | BEFORE 2 INPUTS | BEFORE 1 INPUT | CURRENT | AVERAGE VALUE |
|---|---|---|---|---|---|---|
| USAGE RATE | 0/4 | 0/4 | 0/4 | 1/4 | 2/4 | 3/20 |
| HIT RATE | 1 | 1 | 1 | 0 | 0 | 3/5 |

FIG. 82B

INPUT DATA: A B C A B A B D A B

| | CONVERSION TABLE |
|---|---|
| 0 | C |
| 1 | B |
| 2 | A |
| 3 | |

USAGE RATE: 6/20
HIT RATE: 2/5
ENTROPY: 2 ← ceil(log2((6/20 / 2/5)*4)) =
         ceil(1.58)=2

| | BEFORE 4 INPUTS | BEFORE 3 INPUTS | BEFORE 2 INPUTS | BEFORE 1 INPUT | CURRENT | AVERAGE VALUE |
|---|---|---|---|---|---|---|
| USAGE RATE | 0/4 | 0/4 | 1/4 | 2/4 | 3/4 | 6/20 |
| HIT RATE | 1 | 1 | 0 | 0 | 0 | 2/5 |

FIG. 83A

INPUT DATA: ABCABABDAB

CONVERSION TABLE

| | |
|---|---|
| 0 | C |
| 1 | B |
| 2 | A |
| 3 | |

USAGE RATE: 9/20
HIT RATE: 2/5
ENTROPY: 2 ← ceil(log2((9/20 / 2/5)*4))
     =ceil(2.16)=3

| | BEFORE 4 INPUTS | BEFORE 3 INPUTS | BEFORE 2 INPUTS | BEFORE 1 INPUT | CURRENT | AVERAGE VALUE |
|---|---|---|---|---|---|---|
| USAGE RATE | 0/4 | 1/4 | 2/4 | 3/4 | 3/4 | 9/20 |
| HIT RATE | 1 | 0 | 0 | 0 | 1 | 2/5 |

FIG. 83B

INPUT DATA: ABCABABDAB

CONVERSION TABLE

| | |
|---|---|
| 0 | C |
| 1 | B |
| 2 | A |
| 3 | |

USAGE RATE: 12/20
HIT RATE: 2/5
ENTROPY: 2 ← ceil(log2((12/20 / 2/5)*4))
     =ceil(2.58)=3

| | BEFORE 4 INPUTS | BEFORE 3 INPUTS | BEFORE 2 INPUTS | BEFORE 1 INPUT | CURRENT | AVERAGE VALUE |
|---|---|---|---|---|---|---|
| USAGE RATE | 1/4 | 2/4 | 3/4 | 3/4 | 3/4 | 12/20 |
| HIT RATE | 0 | 0 | 0 | 1 | 1 | 2/5 |

FIG. 84A

INPUT DATA: AB<u>C</u>AB<u>A</u>B<u>D</u>AB

| | CONVERSION TABLE |
|---|---|
| 0 | C |
| 1 | B |
| 2 | A |
| 3 | |

USAGE RATE: 14/20
HIT RATE: 3/5
ENTROPY: 2 ← ceil(log2((14/20 / 3/5)*4)
= ceil(2.22) = 3

| | BEFORE 4 INPUTS | BEFORE 3 INPUTS | BEFORE 2 INPUTS | BEFORE 1 INPUT | CURRENT | AVERAGE VALUE |
|---|---|---|---|---|---|---|
| USAGE RATE | 2/4 | 3/4 | 3/4 | 3/4 | 3/4 | 14/20 |
| HIT RATE | 0 | 0 | 1 | 1 | 1 | 3/5 |

FIG. 84B

INPUT DATA: AB<u>C</u>AB<u>A</u>B<u>D</u>AB

| | CONVERSION TABLE |
|---|---|
| 0 | C |
| 1 | B |
| 2 | A |
| 3 | |

USAGE RATE: 15/20
HIT RATE: 4/5
ENTROPY: 2 ← ceil(log2((15/20 / 4/5)*4))
= ceil(1.90) = 2

| | BEFORE 4 INPUTS | BEFORE 3 INPUTS | BEFORE 2 INPUTS | BEFORE 1 INPUT | CURRENT | AVERAGE VALUE |
|---|---|---|---|---|---|---|
| USAGE RATE | 3/4 | 3/4 | 3/4 | 3/4 | 3/4 | 15/20 |
| HIT RATE | 0 | 1 | 1 | 1 | 1 | 4/5 |

FIG. 85A

INPUT DATA: ABC<u>ABAB</u>D<u>AB</u>

| CONVERSION TABLE | |
|---|---|
| 0 | D |
| 1 | C |
| 2 | B |
| 3 | A |

USAGE RATE: 16/20
HIT RATE: 4/5
ENTROPY: 2 ← ceil(log2((16/20 / 4/5)*4))
= ceil(2) = 2

| | BEFORE 4 INPUTS | BEFORE 3 INPUTS | BEFORE 2 INPUTS | BEFORE 1 INPUT | CURRENT | AVERAGE VALUE |
|---|---|---|---|---|---|---|
| USAGE RATE | 3/4 | 3/4 | 3/4 | 3/4 | 4/4 | 16/20 |
| HIT RATE | 1 | 1 | 1 | 1 | 0 | 4/5 |

FIG. 85B

INPUT DATA: ABC<u>ABAB</u>D<u>AB</u>

| CONVERSION TABLE | |
|---|---|
| 0 | D |
| 1 | C |
| 2 | B |
| 3 | A |

USAGE RATE: 17/20
HIT RATE: 4/5
ENTROPY: 2 ← ceil(log2((17/20 / 4/5)*4))
= ceil(2.08) = 3

| | BEFORE 4 INPUTS | BEFORE 3 INPUTS | BEFORE 2 INPUTS | BEFORE 1 INPUT | CURRENT | AVERAGE VALUE |
|---|---|---|---|---|---|---|
| USAGE RATE | 3/4 | 3/4 | 3/4 | 4/4 | 4/4 | 17/20 |
| HIT RATE | 1 | 1 | 1 | 0 | 1 | 4/5 |

FIG. 86

INPUT DATA: ABCAB<u>AB</u>D<u>AB</u>

| CONVERSION TABLE |
|---|
| 0 | D |
| 1 | C |
| 2 | B |
| 3 | A |

USAGE RATE: 18/20
HIT RATE: 4/5
ENTROPY: 2

| | BEFORE 4 INPUTS | BEFORE 3 INPUTS | BEFORE 2 INPUTS | BEFORE 1 INPUT | CURRENT | AVERAGE VALUE |
|---|---|---|---|---|---|---|
| USAGE RATE | 3/4 | 3/4 | 4/4 | 4/4 | 4/4 | 18/20 |
| HIT RATE | 1 | 1 | 0 | 1 | 1 | 4/5 |

DATA COMPRESSION AND DECOMPRESSION METHODS, DATA COMPRESSION DEVICE, AND DATA DECOMPRESSION DEVICE

CROSS-REFERENCE TO RELATED APPLICATIONS

This application the U.S. national stage of PCT/JP2020/018146 filed Apr. 28, 2020, which claims the benefit of JP 2019-087870 filed May 7, 2019, the entire respective disclosures of which are incorporated herein by reference.

TECHNICAL FIELD

The present invention relates to data compression and decompression methods, a data compression apparatus, and a data decompression apparatus.

BACKGROUND ART

In the related art, there has been a data compressor including a conversion unit and an output unit (for example, PTL 1). The conversion unit converts two or more symbols into one symbol in a case where two or more consecutive symbols, included in an input data sequence constituted by a plurality of symbols having a fixed length, are registered. The output unit outputs one symbol in a case where the two or more symbols are converted into one symbol by the conversion unit, and otherwise, the output unit outputs two or more symbols.

In addition, there has also been a data compression method as follows. That is, a data sequence is compressed in units of symbols that are data having a fixed length. In addition, a conversion table in which entries indicating association between two or more symbols before conversion and one symbol after conversion are registered is retrieved. In a case where it is determined that two or more symbols continuous in a data sequence are not registered as two or more symbols before conversion, entries having the two or more continuous symbols as two or more symbols before conversion are registered in the conversion table. Further, in a case where two or more continuous symbols are output without being converted, and two or more symbols continuous in a data sequence are registered in entries of the conversion table as two or more symbols before conversion, the two or more continuous symbols are converted into one symbol after conversion which is associated with the entries (for example, PTL 2).

CITATION LIST

Patent Literature

PTL 1: JP 2014-236449 A
PTL 2: JP 2016-184830 A

SUMMARY OF INVENTION

Technical Problem

In the above-described prior art, compression is performed by converting two symbols having a fixed length into one symbol having a fixed length, and there is no point of view from which a data length after compression is made variable in accordance with the usage conditions of a table.

The present invention is contrived in view of the above-described problems, and an object thereof is to provide a technique capable of increasing a data compression rate in accordance with the usage conditions of a table.

Solution to Problem

An aspect of the present invention is a data compression and decompression method including causing a compression apparatus to perform processing of registering a symbol, which is input, in one of a plurality of entries in a case where the symbol is not registered in a first table having the plurality of entries and outputting the symbol and index data indicating non-compression, and processing of outputting index data indicating compression and positional information indicating a position of the entry having the symbol registered therein and having a size smaller than a size of the symbol in a case where the symbol has been registered in the table, causing a decompression apparatus to perform processing of registering the symbol in a second table having the same data structure as that of the first table by the same method as a method of registering the symbol in the compression apparatus and outputting the symbol in a case where the index data indicating non-compression and the symbol have been received, and processing of reading and outputting the symbol registered in an entry in the second table indicated by the positional information in a case where the index data indicating compression and the positional information have been received, causing the compression apparatus to output positional information of an entry in use in the first table which is represented by a first number of bits, which is a least number of bits capable of representing the positional information, based on information indicating usage conditions of the plurality of entries of the first table in a case where the index data indicating compression and the positional information are output, and causing the decompression apparatus to extract positional information of an entry in use in the second table from a bit sequence which is transmitted from the compression apparatus and input to the decompression apparatus using a second number of bits which is a least number of bits capable of representing the positional information in a case where the decompression apparatus has received the index data indicating non-compression and the symbol and has registered the symbol in the second table, the second number of bits being calculated by the same calculation method as a method of calculating the first number of bits based on information indicating usage conditions of the plurality of entries of the second table.

Another aspect of the present invention can include the above-described compression apparatus and decompression apparatus, a data compression method and a data decompression method using the apparatus, a program causing a computer to operate as a compression apparatus and a decompression apparatus, and the like.

Advantageous Effects of Invention

According to the present invention, it is possible to increase a data compression rate in accordance with the usage conditions of a table.

BRIEF DESCRIPTION OF DRAWINGS

FIG. 1 schematically illustrates a conversion table implemented in a compressor and a decompressor according to a reference example.

FIGS. 2A to 2C are diagrams illustrating a compression method in the reference example.

FIGS. 3A to 3C are diagrams illustrating the compression method in the reference example.

FIGS. 4A and 4B are diagrams illustrating the compression method in the reference example.

FIGS. 5A and 5B are diagrams illustrating the compression method in the reference example.

FIGS. 6A to 6C are diagrams illustrating a decompression method in the reference example.

FIGS. 7A to 7C are diagrams illustrating the decompression method in the reference example.

FIGS. 8A and 8B are diagrams illustrating the decompression method in the reference example.

FIGS. 9A and 9B are diagrams illustrating the decompression method in the reference example.

FIG. 10 illustrates a configuration example of a compression apparatus in a first embodiment.

FIG. 12 is a table illustrating a relationship between a compressed symbol, a Cmark bit, and a data mask, and an output of a serializer.

FIG. 14 illustrates an example of a data structure of a conversion table.

FIG. 19 illustrates a configuration example of a decompression apparatus in the first embodiment.

FIGS. 25A to 25C are diagrams illustrating an operational example of the compression apparatus.

FIGS. 26A to 26C are diagrams illustrating an operational example of the compression apparatus.

FIGS. 27A to 27C are diagrams illustrating an operational example of the compression apparatus.

FIG. 28 is a diagram illustrating an operational example of the compression apparatus.

FIGS. 30A to 30C are diagrams illustrating an operational example of the decompression apparatus.

FIGS. 31A to 31C are diagrams illustrating an operational example of the decompression apparatus.

FIGS. 32A to 32C are diagrams illustrating an operational example of the decompression apparatus.

FIGS. 33A to 33C are diagrams illustrating an operational example of the decompression apparatus.

FIG. 34 is a diagram illustrating an operational example of the decompression apparatus.

FIG. 35 illustrates an example of entropy culling according to a second embodiment.

FIG. 39 is a table in which first to fourth transmission methods are summarized.

FIG. 40 illustrates a timing chart in a case where exception symbols are used.

FIGS. 41A to 41C are diagrams illustrating an operational example of a compression apparatus in a third embodiment.

FIGS. 42A to 42C are diagrams illustrating an operational example of the compression apparatus in the third embodiment.

FIGS. 43A to 43C are diagrams illustrating an operational example of the compression apparatus in the third embodiment.

FIGS. 44A to 44C are diagrams illustrating an operational example of the compression apparatus in the third embodiment.

FIGS. 45A to 45C are diagrams illustrating an operational example of the compression apparatus in the third embodiment.

FIGS. 46A and 46B are diagrams illustrating an operational example of the compression apparatus in the third embodiment.

FIGS. 50A to 50C are diagrams illustrating an operational example of the decompression apparatus in the third embodiment.

FIGS. 51A to 51C are diagrams illustrating an operational example of the decompression apparatus in the third embodiment.

FIGS. 52A and 52B are diagrams illustrating an operational example of the decompression apparatus in the third embodiment.

FIGS. 54A to 54C illustrate an operational example of the compression apparatus in the fourth embodiment.

FIGS. 56A to 56C illustrate an operational example of the compression apparatus in the fourth embodiment.

FIGS. 55A to 55C illustrate an operational example of the compression apparatus in the fourth embodiment.

FIGS. 57A to 57C illustrate an operational example of the compression apparatus in the fourth embodiment.

FIGS. 60A to 60C illustrate an operational example of the decompression apparatus in the fourth embodiment.

FIGS. 61A to 61C illustrate an operational example of the decompression apparatus in the fourth embodiment.

FIGS. 62A to 62C illustrate an operational example of the decompression apparatus in the fourth embodiment.

FIGS. 63A to 63C illustrate an operational example of the decompression apparatus in the fourth embodiment.

FIG. 64 illustrates an operational example of the decompression apparatus in the fourth embodiment.

FIGS. 66A to 66C illustrate an operational example of the compression apparatus in the fifth embodiment.

FIGS. 67A to 67C illustrate an operational example of the compression apparatus in the fifth embodiment.

FIGS. 69A to 69C illustrate an operational example of the decompression apparatus in the fifth embodiment.

FIGS. 70A to 70C illustrate an operational example of the decompression apparatus in the fifth embodiment.

FIGS. 81A and 81B are diagrams illustrating a second calculation method.

FIGS. 82A and 82B are diagrams illustrating the second calculation method.

FIGS. 83A and 83B are diagrams illustrating the second calculation method.

FIGS. 84A and 84B are diagrams illustrating the second calculation method.

FIGS. 85A and 85B are diagrams illustrating the second calculation method.

FIG. 86 is a diagram illustrating the second calculation method.

DESCRIPTION OF EMBODIMENTS

Figure 11:
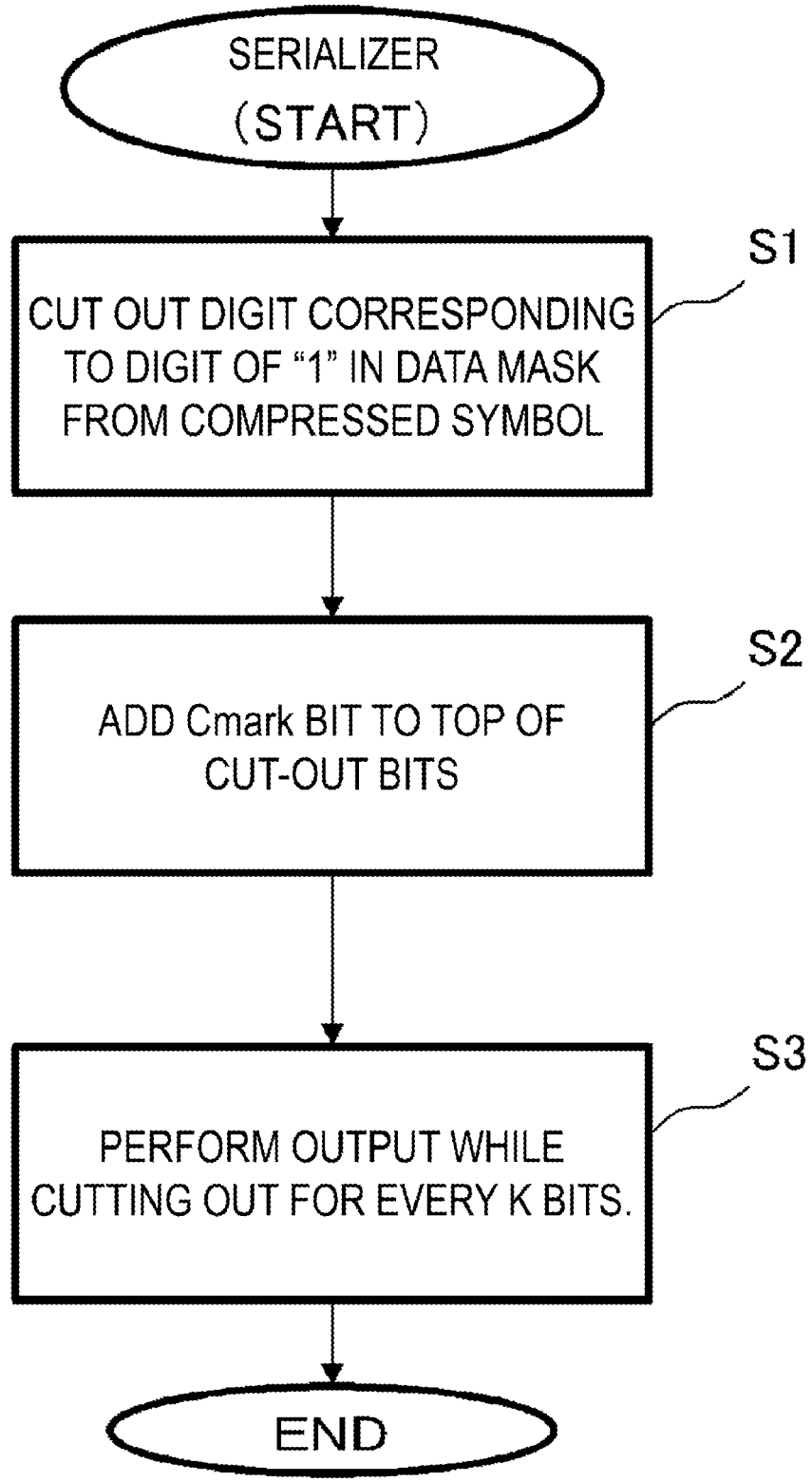
FIG. 11 is a flowchart illustrating an example of processing in a serializer.

A data compression and decompression method according to an embodiment includes the following:

(1) A compression apparatus performs processing of registering a symbol, which is input, in one of a plurality of entries in a case where the symbol is unregistered in a first table having the plurality of entries and outputting the symbol and index data indicating non-compression, processing of outputting index data indicating compression in a case where the symbol is registered in the table and positional information indicating the position of an entry in which the symbol is registered and having a size smaller than the size of the symbol, and processing of changing the size of the positional information in accordance with usage conditions of the plurality of entries.

(2) A decompression apparatus performs processing of registering the symbol in a second table having the same data structure as that of the first table and outputting the symbol by the same method as the method of registering the symbol in the compression apparatus in a case where the index data indicating non-compression and the symbol have been received, and processing of reading and outputting the symbol registered in an entry in the second table indicated by the positional information in a case where the index data indicating compression and the positional information have been received.

The compression apparatus according to the embodiment may calculate the number of bits representing positional information based on information indicating the usage conditions of the plurality of entries of the first table, and may output the positional information represented by the number of bits. In this case, the decompression apparatus may calculate the number of bits representing the positional information based on information indicating usage conditions of a plurality of entries of the second table, and may extract positional information from a bit sequence which is input to the decompression apparatus using the number of bits.

The compression apparatus according to the embodiment may calculate information indicating the usage conditions of the plurality of entries of the first table using the number of entries k in use of the first table and the following Formula 1, and the decompression apparatus may calculate information indicating usage conditions of the plurality of entries of the second table using the number of entries k in use of the second table and the following Formula 1.

$$\text{ceil}(\log_2 k) \qquad \text{Formula 1:}$$

Alternatively, the compression apparatus according to the embodiment may calculate information indicating the usage conditions of the plurality of entries of the first table using a usage rate of the first table in results of compression processing for a predetermined number of symbols, a hit rate of an entry in which a symbol is registered, and the following Formula 2. In this case, the decompression apparatus may calculate information indicating usage conditions of the plurality of entries of the second table using a usage rate of the first table in results of decompression processing for a predetermined number of symbols, a hit rate of an entry in which a symbol is registered, and the following Formula 2.

$$\text{ceil}(\log_2((\text{usage rate/hit rate})*\text{the number of entries})) \qquad \text{Formula 2:}$$

For example, in a case where the size of a symbol is N bits and the original size of positional information is M bits, an M-bit data mask that indicates the number of valid bits, corresponding to information indicating usage conditions of a plurality of entries, which is smaller than N may be generated, and positional information represented by the number of valid bits may be generated by excluding invalid bits from the positional information having the original size based on the data mask.

The above-described positional information may be, for example, index numbers assigned sequentially from a leading entry to the plurality of entries of the first and second tables. In this case, the compression apparatus may move a symbol to the leading entry in the first table in a case where an entry in which the symbol is registered is hit during the retrieval of the first table of symbols, and may move a symbol registered in an entry between the leading entry in the first table and one entry prior to the hit entry to the next entry. In this case, the decompression apparatus moves a symbol to the leading entry in the second table in a case where an entry in which the symbol is registered is hit during the retrieval of the second table of symbols, and moves a symbol registered in an entry between the leading entry in the second table and one entry prior to the hit entry to the next entry. The leading entry may be a reserved entry.

The compression apparatus according to the embodiment may register a symbol registered in a hit entry in a predetermined moving destination entry located on a side closer to the head than the hit entry with respect to the first table in a case where an entry having a symbol registered herein is hit in the retrieval of a symbol in the first table, and may move a symbol registered in an entry between the moving destination entry and one entry prior to the hit entry to the next entry. In this case, the decompression apparatus registers the symbol in the hit entry in a predetermined moving destination entry on a side closer to the head than the hit entry with respect to the second table in a case where an entry having a symbol registered therein is hit in the retrieval of a symbol in the second table, and moves a symbol registered in an entry between the moving destination entry and one entry prior to the hit entry to the next entry.

The predetermined moving destination entry described above may be a first entry in the first table and the second table. In addition, the entry may be an entry in the first table and the second table in a position that has been moved back from the hit entry by a predetermined number in the direction toward the head. In this case, the compression apparatus and the decompression apparatus may set the leading entry to the destination if the predetermined number of retrospective positions is greater than that at the head. The predetermined moving destination entry may be a reserved entry.

The compression apparatus according to the embodiment may register a symbol in the leading entry in the first table in a case where an entry in which the symbol is registered is not hit during the retrieval of the first table of symbols in a state where all entries of the first table are in use, and may move a symbol registered in an entry between the leading entry in the first table and one entry prior to the last entry to the next entry to delete the symbol registered in the last entry. In this case, the decompression apparatus registers a symbol in the leading entry in the second table in a case where an entry in which the symbol is registered is not hit during the retrieval of the second table of symbols in a state where all entries of the second table are in use, and moves a symbol registered in an entry between the leading entry in the second table and one entry prior to the last entry to the next entry to delete the symbol registered in the last entry.

The compression apparatus according to the embodiment may register a symbol in a first entry in the first table when the first entry in the first table is in an empty state in a case where an entry in which a symbol is registered is not hit during the retrieval of the first table of symbols, and may register the symbol in the first entry in the first table in an overwriting manner when all entries of the first table are in use. In this case, the decompression apparatus registers a symbol in a first entry in the second table when the first entry in the second table is in an empty state in a case where an entry in which a symbol is registered is not hit during the retrieval of the second table of symbols, and registers the symbol in the first entry in the second table in an overwriting manner when all entries of the second table are in use. For example, the first entry in the first table may be the last entry in the first table, and the first entry in the second table may be the last entry in the second table. However, other entries may be set to be the first entries.

The compression apparatus according to the embodiment may delete a symbol in an entry having the largest index number among entries in which a symbol is registered, in a case where the number of hits of entries in which a symbol is registered or the number of mis-hits of entries in which a symbol is registered has reached a predetermined value with respect to the first table. In this case, the decompression apparatus deletes a symbol in an entry having the largest index number among entries in which a symbol is registered, in a case where the number of hits of entries in which a symbol is registered or the number of mis-hits of entries in which a symbol is registered has reached a predetermined value with respect to the second table.

The compression apparatus according to the embodiment may not delete a symbol in an entry having the largest index number in a case where the entry having the largest index number corresponds to an entry within a predetermined range from the leading entry with respect to the first table. In this case, the decompression apparatus does not delete a symbol in an entry having the largest index number in a case where the entry having the largest index number corresponds to an entry within a predetermined range from the leading entry with respect to the second table.

Further, in the embodiment, in a case where a command symbol indicating a command is registered in the same predetermined entry in the first table and the second table, the compression apparatus may output index data indicating compression and positional information indicating the predetermined entry, and may execute the command indicated by the command symbol. In this case, the decompression apparatus reads the command symbol registered in the predetermined entry in the second table based on the index data indicating compression and the positional information indicating the predetermined entry, which are received from the compression apparatus, and executes the command indicated by the command symbol.

In the embodiment, the compression apparatus may output index data indicating non-compression and a command symbol in a case where the command symbol indicating a command to be executed by the decompression apparatus is registered in the same predetermined entry in the first table and the second table. In this case, the decompression apparatus executes the command indicated by the command symbol as exception processing with respect to the command symbol being already registered in the second table in command symbol registration processing based on the index data indicating non-compression.

The compression apparatus according to the embodiment may output index data indicating compression and positional information indicating an entry in an empty state of the first table in a case where the decompression apparatus is caused to execute a command. In this case, the decompression apparatus may acquire and execute information indicating a command at the time of the occurrence of an exception generated due to a symbol not being registered in an entry in the second table indicated by positional information in symbol reading processing based on the index data indicating compression and the positional information which is received from the compression apparatus.

The compression apparatus according to the embodiment may output index data indicating compression and positional information indicating an entry in an empty state of the first table, and then may output index data indicating non-compression and a command symbol indicating a command. In this case, the decompression apparatus executes the command indicated by the command symbol at the time of occurrence of an exception.

In addition, the compression apparatus according to the embodiment may output index data indicating non-compression and a symbol registered in the first table in a case where the decompression apparatus is caused to execute a command. In this case, the decompression apparatus acquires and executes information indicating a command at the time of occurrence of an exception generated due to the same symbol being registered in the second table in symbol registration processing based on index data indicating non-compression which is received from the compression apparatus.

In addition, the compression apparatus according to the embodiment may output index data indicating non-compression and a symbol registered in the first table, and then may output index data indicating non-compression and a command symbol indicating the command. In this case, the decompression apparatus executes the command indicated by the command symbol at the time of occurrence of an exception.

A symbol is a symbol constituting a symbol sequence subjected to compression processing by another compression apparatus positioned at a stage before the compression apparatus, and it is possible to adopt a configuration in which a symbol output by the decompression apparatus is input to another decompression apparatus positioned at a stage after the decompression apparatus as a portion of the symbol sequence. In this manner, the compression apparatus and the decompression apparatus can be cascade-connected.

Each of the first table and the second table is one of a plurality of banks obtained by the division of a table, and a configuration in which the selection of the first table and the second table is performed using the same hash function may be adopted.

In addition, the compression apparatus and the decompression apparatus may perform the following exchanges related to encryption. That is, the compression apparatus transmits a common key including a combination of two or more parameters selected from among a plurality of parameters set for compression processing on symbols to the decompression apparatus. Thereafter, the compression apparatus performs encryption using a common key on a combination of index data indicating non-compression and a symbol and a combination of index data indicating compression and positional information, and transmits a result of the encryption to the decompression apparatus. The decompression apparatus sets two or more parameters in a common key transmitted from the compression apparatus for decompression processing of outputting a symbol using a combination of index data indicating non-compression and a symbol or a combination of index data indicating compression and positional information, and performs decryption of a result of the encryption by using the common key and performs decompression processing on the result of the decryption.

Although this will be described later, a plurality of parameters include the number of bits N of a symbol, the number of bits M of a result (symbol or positional information) of compression processing on a symbol, K indicating the unit of the number of bits to be output from the compression apparatus, the number of hits or the number of mis-hits used for entropy culling, the setting of an exception symbol, the type of scramble operation, a scramble key, a close entry exchange offset k, a bank configuration (the number of banks), and the like.

In addition, prior to the transmission of the result of the encryption from the compression apparatus, the compression apparatus may perform processing of initializing the state of the first table, may transmit information for initializing the state of the second table to the decompression apparatus, and the decompression apparatus may initialize the state of the second table based on the initialized information.

Reference Example

Before describing the embodiment of the present invention, a compressor and a decompressor (compression and decompression method) according to a reference example will be described. FIG. 1 schematically illustrates a conversion table implemented in the compressor and the decompressor according to the reference example. The conversion table is constituted by a plurality of entries having an index. As the number of entries, the same appropriate number is determined for the compressor and the decompressor. A maximum number of entries will be a number obtained by adding 1 to a maximum index value. In the example illustrated in FIG. 1, an index value is 0 to 3, and the number of entries is 4.

A symbol before compression and a count value are registered in an entry. A registration pointer and a deletion pointer are set in the conversion table. The initial positions of the registration pointer and the deletion pointer are an index "0". The registration pointer indicates an entry position at which an unregistered entry before compression is registered. When a symbol is registered in an entry pointed to by the registration pointer, the registration pointer moves in a direction in which an index value increases in order to point the next unregistered entry. However, in a case where the current position of the registration pointer is the last entry (an entry of an index "3" in the reference example), the registration pointer returns to the index "0" and then is set at an unregistered entry position.

The deletion pointer indicates an entry in which a count value is decremented. The count value is a value used for aging processing of an entry. In a case where a count value is 0, a registration content (a symbol before compression) of the entry is deleted, and the entry is set to be in an unregistered state. In a case where a symbol before compression is registered in an entry, an initial value of the counter value (2 in the example of FIG. 1) is set. A count value of an entry pointed to by the deletion pointer is decremented by one. At this time, the deletion pointer moves by one in a direction in which an index value increases. However, in a case where the current position of the deletion pointer is the last entry (an entry of an index "3"), the deletion pointer returns to the index 0. In a case where an entry is hit, an index value of the entry is increased by one. The deletion pointer may move in a round-robin manner.

Operational Example of Compressor in Reference Example

Next, an operational example of the compressor (compression method) will be described. FIGS. 2A to 2C, FIGS. 3A to 3C, FIGS. 4A and 4B, and FIGS. 5A and 5B are diagrams illustrating a compression method in the reference example. FIG. 2A illustrates a conversion table according to an operational example. The conversion table has a structure described using FIG. 1. The number of all entries of the conversion table is four, and an initial value of a count value is 2. As an example, an input is a data sequence in which data (symbols) of 8 bits (1 byte) is connected. In the conversion table in an initial state, all entries are in an unregistered state. The registration pointer and the deletion pointer indicate an entry of an index "0" in a case where the conversion table is in an initial state. In the following description, an entry may be specified by an index value (for example, an entry of an index value "0" is simply referred to as an index "0").

In a case where the conversion table is in an initial state, it is assumed that symbol sequences "ABAC0ADBCFGDEDA1AB . . . " before compression (also referred to as an "original symbol") input to the compressor have been input. The compressor performs compression processing for every two symbols among the symbol sequences. FIG. 2A illustrates the processing of a first symbol sequence "AB" among the symbol sequences. In this case, the symbol sequence "AB" is retrieved from the conversion table. However, the symbol sequence "AB" is not registered in the conversion table ("AB" is not hit). In this case, the original symbol sequence "AB" and the initial value "2" of the count value are registered (stored) in an entry (an index "0") pointed to by the registration pointer. At this time, the original symbol sequence "AB" is output as it is as an output of the compressor (a symbol after the compression processing). In addition, the deletion pointer is set for an index "0" in which a symbol is newly registered, and the registration pointer proceeds to an index "1" which is the next unregistered entry.

FIG. 2B illustrates the processing of an original symbol sequence "AC" following the symbol sequence "AB". The symbol "AC" is not registered in the conversion table. For this reason, the original symbol sequence "AC" and the count value "2" are registered in an entry (an index "1") pointed to by the registration pointer. In addition, the original symbol sequence "AC" is output from the compressor. In addition, the registration pointer proceeds to the next unregistered entry (an index "2"). In addition, a count value of the index "0" is decremented by one (2→1), and the deletion pointer proceeds to the next index "1".

FIG. 2C illustrates the processing of the original symbol sequence "AB" following the symbol sequence "AC". Since the symbol sequence "AB" has been registered, the symbol sequence "AB" is retrieved from the conversion table (hit). In this case, the index value "0" of the entry in which the symbol sequence "AB" is registered is output as a symbol after compression. Thereby, the original symbol sequence of 2 bytes is compressed into a compressed symbol of 1 byte. At this time, the count value of the index "0" is incremented (1→2). In addition, the count value of the index "1" pointed to by the deletion pointer is decremented (2→1), and the deletion pointer proceeds to the index "0". In addition, the registration pointer proceeds to an index "2", which is the next unregistered entry.

FIG. 3A illustrates the processing of an original symbol sequence "AD" following the symbol sequence "AB". The symbol sequence "AD" is not registered in the conversion table. For this reason, the original symbol sequence "AD" and the count value "2" are registered in an entry (an index "2") pointed to by the registration pointer. The registration pointer proceeds to the next index "3". In addition, the count value of the index "0" pointed to by the deletion pointer is decremented by one (2→1), and the deletion pointer proceeds to the next index "1".

FIG. 3B illustrates the processing of an original symbol sequence "BC" following the symbol sequence "AD". The symbol sequence "BC" is not registered in the conversion table. Thus, the original symbol sequence "BC" and the count value "2" are registered in an entry (an index "3") pointed to by the registration pointer. The original symbol sequence "BC" is output from the compressor. In addition, the count value of the index "1" pointed to by the deletion pointer is decremented, and the deletion pointer proceeds to the next index "2". In the index "1", the count value is set to 0, and thus the symbol "AC" is deleted, the index "1" is set to be in an unregistered state, and the registration pointer is set.

FIG. 3C illustrates the processing of an original symbol sequence "FG" following the symbol sequence "BC". The symbol sequence "FG" is not registered in the conversion table. For this reason, the original symbol sequence "FG" and the count value "2" are registered in an entry (an index "1") pointed to by the registration pointer. The original symbol sequence "FG" is output from the compressor. At this point in time, all entries in the conversion table have been registered (there is no entry in an empty state). In this case, the registration pointer may point any entry. However, for the purpose of explanation, in the example illustrated in FIG. 3C, the next index "2" is pointed to in accordance with a rule that an index value is incremented by one in a direction in which the index value increases. In addition, the count value of the index "2" pointed to by the deletion pointer is decremented, and the deletion pointer proceeds to the next index "3".

FIG. 4A illustrates the processing of an original symbol sequence "DE" following the symbol sequence "FG". The symbol "DE" is not registered in the conversion table. However, the conversion table is full (no empty entry), and thus the symbol sequence "DE" cannot be registered. In this case, the registration processing is not performed, and the input symbol sequence "DE" is output as it is. Thereby, a throughput is maintained. In addition, the count value of an entry (an index "3") pointed to by the deletion pointer is decremented, and the deletion pointer proceeds to the next position (an index "0"). Also in this case, the position of the registration pointer may be any position. In the example illustrated in FIG. 4A, an index "3" is pointed to as an example.

FIG. 4B illustrates the processing of an original symbol sequence "DA" following the symbol "DE". The symbol sequence "DA" is not registered in the conversion table. However, there is no empty entry in the conversion table. For this reason, the symbol sequence "DA" is output to maintain a throughput without registering the symbol sequence "DA". At this time, the count value of the index "0" pointed to by the deletion pointer is decremented (1→0), and the deletion pointer proceeds to the index "1". The count value of the index "0" is set to 0 due to the decrementing, and the index "0" is set to be in an unregistered state, and the registration pointer is set.

FIG. 5A illustrates the processing of an original symbol sequence "FG" following the symbol "DA". The symbol "FG" is registered in the conversion table. For this reason, the index value "1" of the corresponding entry is output. At this time, the incrementing and decrementing of the index "1" are performed, and the count value "2" is maintained. At this time, the deletion pointer proceeds to the index "2". The registration pointer does not move.

FIG. 5B illustrates the processing of the original symbol sequence "AB" following the symbol sequence "FG". The symbol "AB" is not registered in the conversion table. For this reason, the symbol sequence "AB" is output. In addition, the symbol sequence "AB" and the count value "2" are registered in the index "0". In addition, the count value of the index "2" pointed to by the deletion pointer is decremented by one (1→0), and the deletion pointer proceeds to an index "3". Thereby, the count value of the index "2" is set to 0, and thus the entry is set to be in an unregistered state, and the registration pointer is set. In this manner, "ABAC0ADBCFGDEDA0AB . . . " is output from the compressor as a symbol sequence after compression.

Operational Example of Decompressor in Reference Example

Next, an operational example (decompression method) of a decompressor will be described. A data sequence (symbol sequence) "ABAC0ADBCFGDEDA0AB . . . " output from the compressor is input to the decompressor. FIGS. 6A to 6C, FIGS. 7A to 7C, FIGS. 8A and 8B, and FIGS. 9A and 9B are diagrams illustrating a decompression method in the reference example. FIG. 6A illustrates a conversion table of the decompressor. The structure of the conversion table is the same as the structure of the conversion table included in the compressor. In addition, FIG. 6A illustrates processing related to a symbol sequence "AB" which is input to the decompressor in a case where the conversion table of the decompressor is in an initial state.

First, an index "A" is retrieved from the conversion table. However, since the index "A" is not hit, it can be understood that the index "A" falls outside a range or is not registered. In this case, the next input symbol is read and output as it is. Here, the symbol sequence "AB" including the symbol "A" and the subsequent symbol "B" is output as a result of the decompression. Additionally, the symbol sequence "AB" and a count value "2" are registered in an index "0". In addition, the deletion pointer is set in the index "0", and the registration pointer proceeds to an index "1".

FIG. 6B illustrates processing related to a subsequent symbol sequence "AC". Also in this case, an index of the conversion table which matches the symbol "A" is retrieved. However, no corresponding index is retrieved. For this reason, the symbol sequence "AC" including the next symbol "C" is output as it is. In addition, the symbol sequence "AC" and the count value "2" are registered in an entry (the index "1") pointed to by the registration pointer, and the registration pointer proceeds to the next index "2". In addition, the count value of the index "0" is decremented by one, and then the deletion pointer proceeds to the index "1".

FIG. 6C illustrates processing related to a subsequent symbol "0". In this case, the corresponding index "0" is retrieved from the conversion table. In this case, the symbol sequence "AB" registered in the entry of the index "0" is output from the decompressor. At this time, 1 is added to the count value of the index "0" (1→2), and the deletion pointer is set. In addition, the position of the registration pointer stops at the index "2".

FIG. 7A illustrates processing related to a subsequent symbol sequence "AD". At this time, there is no index of the conversion table which matches the symbol "A". For this reason, the symbol sequence "AD" including the symbol "A" and the subsequent symbol "D" is output from the decompressor. In addition, the symbol sequence "AD" and the count value "2" are registered in an entry (an index "2") pointed to by the registration pointer. The registration pointer proceeds to the next index "3". The count value of the index "0" pointed to by the deletion pointer is decremented by one, and the deletion pointer proceeds to the next index "1".

FIG. 7B illustrates processing related to a subsequent symbol sequence "BC". In this case, there is no index of the conversion table which corresponds to the symbol "B". For this reason, the symbol sequence "BC" including the symbol "B" and the next symbol "C" is output from the decompressor. In addition, the symbol sequence "BC" and the count value "2" are registered in an entry (an index "3") pointed to by the registration pointer. In addition, the count value of the index "1" pointed to by the deletion pointer is decremented by one (1→0), and the deletion pointer proceeds to the next index "2". When the count value of the index "1" is set to 0, and thus the entry of the index "1" is set to be in an unregistered state. The registration pointer is set in an index "1".

FIG. 7C illustrates processing related to a subsequent symbol sequence "FG". In this case, there is no index matching a symbol "F". For this reason, the symbol sequence "FG" including the symbol "F" and the next symbol "G" is output from the decompressor. In addition, the symbol sequence "FG" and the count value "2" are registered in an entry (an index "1") pointed to by the registration pointer. In addition, the count value of the index "2" pointed to by the deletion pointer is decremented by one, and the deletion pointer proceeds to the next index "3". The position of the registration pointer may be any position because the conversion table is full. However, in the present operational example, an example in which one registration pointer proceeds regardless of a registered state or an unregistered state is represented. FIG. 7C illustrates a case where the registration pointer proceeds to the index "2".

FIG. 8A illustrates processing according to a subsequent symbol sequence "DE". In this case, there is no index corresponding to the symbol "D". For this reason, the symbol sequence "DE" including the symbol "D" and the next symbol "E" is output from the decompressor. However, since the conversion table is full, the registration of the symbol sequence "DE" is not performed. The count value of the index "3" pointed to by the deletion pointer is decremented by one, and the deletion pointer returns to the index "0". The position of the registration pointer may be any position. FIG. 8A illustrates an example in which the registration pointer proceeds to the index "3" according to a rule in which the registration pointer proceeds by one from the current position.

FIG. 8B illustrates processing related to a subsequent symbol sequence "DA". In this case, there is no index matching the symbol "D". For this reason, the symbol sequence "DA" including the symbol "D" and the symbol "A" is output. However, since there is no empty entry in the conversion table, the symbol "DA" is not registered. At this time, the count value of the index "0" pointed to by the deletion pointer is decremented by one, and the deletion pointer proceeds to the index "1". The count value of the index "0" is 0, the index "0" is set to be in an unregistered state, and the registration pointer is set.

FIG. 9A illustrates processing related to a subsequent symbol "1". In this case, there is an index "1" matching the conversion table. For this reason, the symbol sequence "FG" registered in the entry of the index "1" is output from the decompressor. At this time, the decrementing of the count value of the index "1" pointed to by the deletion pointer and the incrementing of the count value of the index "1" are performed, and the count value of the index "1" is set to "2". A deletion counter proceeds to the index "2", and a registration counter points an index "0".

FIG. 9B illustrates processing related to a subsequent symbol sequence "AB". In this case, the symbol "A" is not registered in the conversion table. For this reason, the symbol sequence "AB" including the symbol "A" and the next symbol "B" is output from the decompressor. In addition, the symbol sequence "AB" and the count value "2" are registered in the index "0" which is an empty entry. At this time, the count value of the index "2" pointed to by the deletion pointer is decremented by one, and the deletion pointer proceeds to the index "3". Since the count value of the entry of the index "2" is set to 0, the index "2" is set to be in an unregistered state, and the registration pointer is set.

In the reference example described above, a conversion table having the same registration content as that of the compressor can be generated by the decompressor without representing the registration content of the conversion table in the compressor, and decompression processing can be performed using the conversion table.

Note that, in the operational example of the reference example, it is premised that a symbol after compression (for example, "0") is not used as a symbol before compression. However, in reality, all combinations (256 types) are usually used for 8-bit data. For this reason, it is not possible to distinguish between the original symbol "0" and "0" indicating being compressed. Consequently, a bit indicating compression (conversion)/non-compression (non-conversion), which is referred to as "Cmark bit", is added to a symbol or a symbol sequence after compression. A value "0" of the Cmark bit indicates non-compression, and a value "1" indicates compression. However, this may be reversed.

Problem According to Reference Example

<<Problem 1>>

In the compression and decompression method according to the reference example, a symbol length after compression is a fixed length. As represented as an example, in compression in which inputs of two symbols are converted into one symbol, a compression rate was at most 50%. For this reason, there is a demand for further improvement in a compression rate.

Here, a Shannon average information amount (also referred to as a Shannon information amount or an entropy) is considered. The average information amount is an index representing "complexity of data", and is represented by the following Formula (1). In Formula (1), i denotes data, and pi denotes an appearance ratio of the data i.

[Math. 1]

$$\text{average information amount } H = -\Sigma_i p_i \log_2(p_i) \qquad (1)$$

For example, in a case where a data symbol sequence (1 symbol 8 bits) is "ABACABADBC", appearance probabilities of the symbols "A", "B", "C", and "D" are as follows.

Appearance probability of A: 4/10=0.4
Appearance probability of B: 3/10=0.3
Appearance probability of C: 2/10=0.2
Appearance probability of D: 1/10=0.1

When an average information amount H for the data symbol sequence is calculated using Formula (1), H=1.84643934465. In other words, the data symbol sequence is constituted by a combination of 2 to the power of 1.84643934465 and can be represented by 1.84643934465 bits. Elements (symbols) in the data symbol sequence are Ceil(1.84643934465)=2, and thus can be represented by 2 bits.

For example, in a case where A=00, B=01, C=10, and D=11 are defined, the data symbol sequence is "00010010000100110110". Since data of 8 bits can be compressed into 2 bits, the amount of data is ¼.

<<Problem 2>>

In the above-described compression and decompression method according to the reference example, a terminal end of compressed data is unclear. When a special code can be embedded, the decompressor can be notified of a terminal end of a compressed data sequence.

The inventors of the present application considered if a compression rate could be improved by changing a symbol length after compression in accordance with a usage rate of a conversion table using an idea of the above-described average information amount (entropy). As a result of intensive research, the inventors have invented a compression and decompression method as described in the following embodiments.

EMBODIMENTS

Embodiments of a data compression and decompression method, a data compression method, and a data compression apparatus, a data compression program, a data decompression method, a data decompression apparatus, and a data decompression program will be described below with reference to the drawings. Configurations of the embodiments are exemplary, and the present invention is not limited to the configurations of the embodiments.

First Embodiment

<Configuration of Compression Apparatus>>

FIG. 10 illustrates a configuration example of a compression apparatus according to a first embodiment. In FIG. 10, a compression apparatus 10 includes a compressor 11 and a serializer 12. Original symbol data of N bits (N is a positive integer) is input to the compressor 11. The compressor 11 outputs a compressed symbol of M bits (M is a positive integer), a Cmark bit, and a data mask of M bits. The following description of the embodiments will be given focusing on a case where N=M is set. However, there may be a case of N<M or a case of N>M. When M is set to be "$\log_2$(the number of entries)", N<M is set when the number of entries is greater than the N-th power of 2. In the opposite case, N>M.

The compressed symbol indicates symbol data after compression processing, the symbol data being output from the compressor 11. The Cmark bit is a bit indicating whether the symbol data output from the compressor 11 is compressed by the compressor 11. As an example, a case where a bit value is "0" indicates non-compression, and a case where a bit value is "1" indicates compression. The bit values and the meanings may be opposite to each other. The data mask is used to represent a valid bit digit or the number of valid bits in a bit sequence that forms the compressed symbol. For example, in the data mask, a valid bit digit is indicated by "1". In addition, the data mask may also be a bit sequence indicating the number of valid bits.

The serializer 12 receives the compressed symbol, the Cmark bit, and the data mask, and outputs data in which the Cmark bit and the valid bit in the compressed symbol indicated by the data mask are connected to each other in series. The output data is transmission data which is transmitted toward a decompression apparatus. Even when an output from the compressor 11 is N>M, the number of valid bits indicated by the data mask is a value up to N. Thus, an output of the compression apparatus 10 has a length of a maximum of N+1 bits with respect to the original symbol of N bits. The transmission data is transmitted to the decompression apparatus via a transmission path (network).

<<Serializer>>

FIG. 11 is a flowchart illustrating an example of processing in the serializer 12. In S1, the serializer 12 removes unnecessary (invalid) bits from the compressed symbol based on the data mask. That is, the serializer 12 cuts out a portion corresponding to a digit indicated by "1" in the data mask from the compressed symbol.

In S2, the serializer 12 adds a Cmark bit to the top of the cut-out portion of the compressed symbol. In S3, the serializer 12 outputs bits for every K bits in accordance with an appropriate rule for the Cmark bit and the compressed symbol after cutting-out.

FIG. 12 is a table illustrating a relationship between a compressed symbol, a Cmark bit, and a data mask, and an output of the serializer. For example, in the case of big endian, it is assumed that compressed symbol data, a Cmark bit, and a data mask sequence are "0001000" (M=7), "1", and "0011111" (M=7), respectively. In this case, in the data mask, bits up to a fifth bit from the least significant bit (LSB) are represented as valid bits. For this reason, in the serializer 12, bits up to a second bit from the most significant bit (MSB) are removed from the compressed symbol, and a bit sequence (serial data) "101000" of a Cmark bit "1" and the valid bit sequence "01000" is output.

In a case where the next output from the compressor 11 is compressed symbol data "1110100", a Cmark bit "0", and a data mask "1111111", an output of the serializer 12 is serial data "01110100" of the Cmark bit "1" and the valid bits "1110100". FIG. 12 also illustrates an output of the serializer 12 related to combinations of other compressed symbols and Cmark bits.

<<Compressor>>

Figure 13:
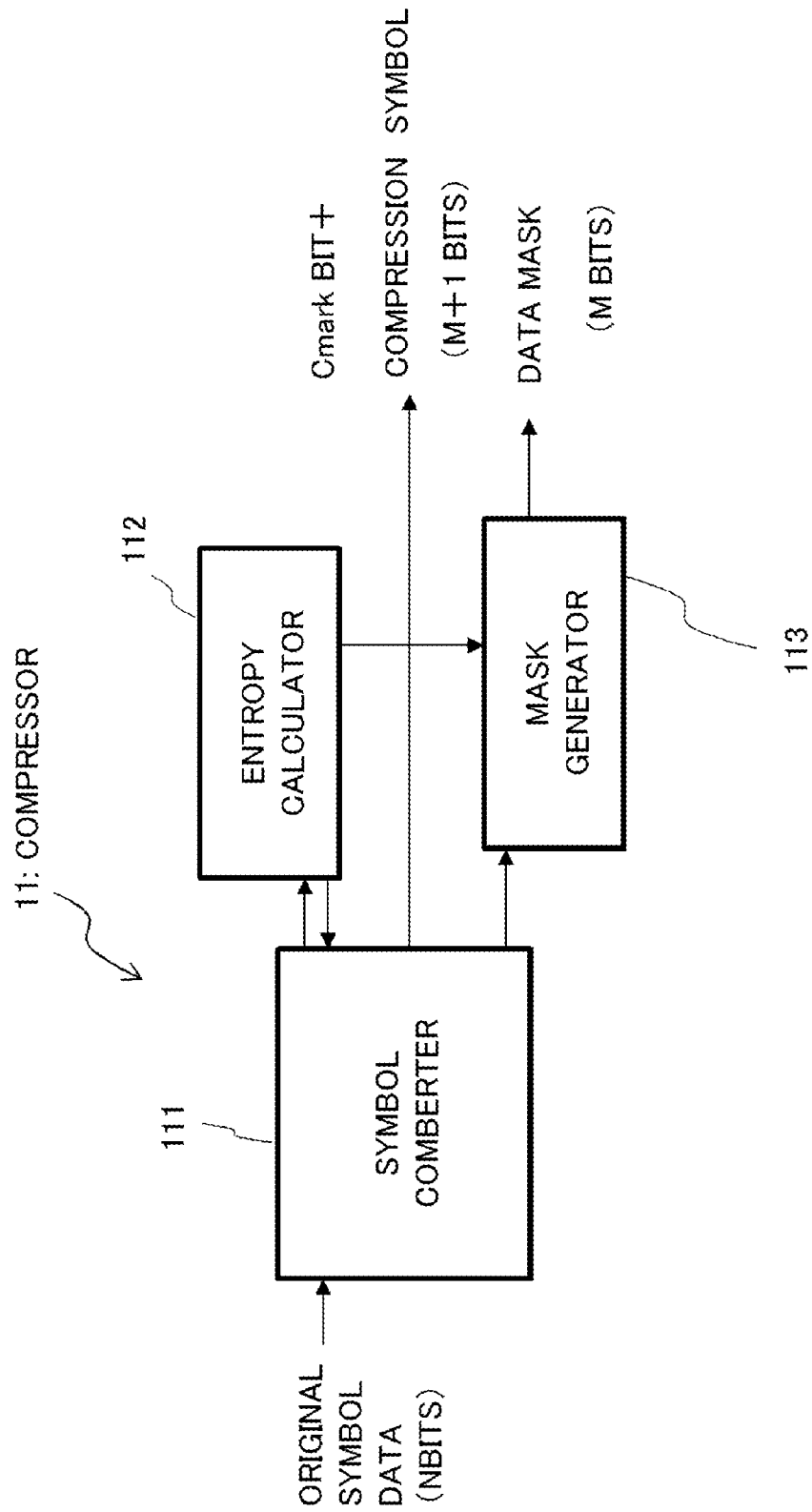
FIG. 13 illustrates a configuration example of a compressor.

FIG. 13 illustrates a configuration example of the compressor 11. The compressor 11 includes a symbol conversion unit (symbol converter) 111, an entropy calculation unit (entropy calculator) 112, and a mask generation unit (mask generator) 113. The symbol conversion unit 111 performs symbol conversion processing using a conversion table.

FIG. 14 illustrates an example of a data structure of a conversion table included in each of a compression apparatus and a decompression apparatus. The conversion table is constituted by a plurality of entries. Index numbers (index values) having values increasing in order from the leading entry are assigned to the plurality of entries. Assuming that a maximum number of bits of a symbol after compression is X (X is a positive integer), the number of entries is 2x. An example of the conversion table illustrated in FIG. 14 represents a case where X=2, and the number of entries is four. In the conversion table in an initial state, for example, all entries are empty. However, symbols may be set for all of the entries. The conversion table included in the compression apparatus is an example of a first table, and an example of the conversion table included in the decompression apparatus is an example of a second table. The index number is an example of positional information indicating the position of an entry.

The entropy calculation unit 112 calculates an entropy as information indicating the usage conditions of a plurality of entries of the conversion table by a predetermined calculation method. The mask generation unit 113 receives an entropy calculation result of the entropy calculation unit 112, and generates a corresponding data mask. In the present embodiment, a case where N=M=8 bits will be described as an example.

Figure 15:
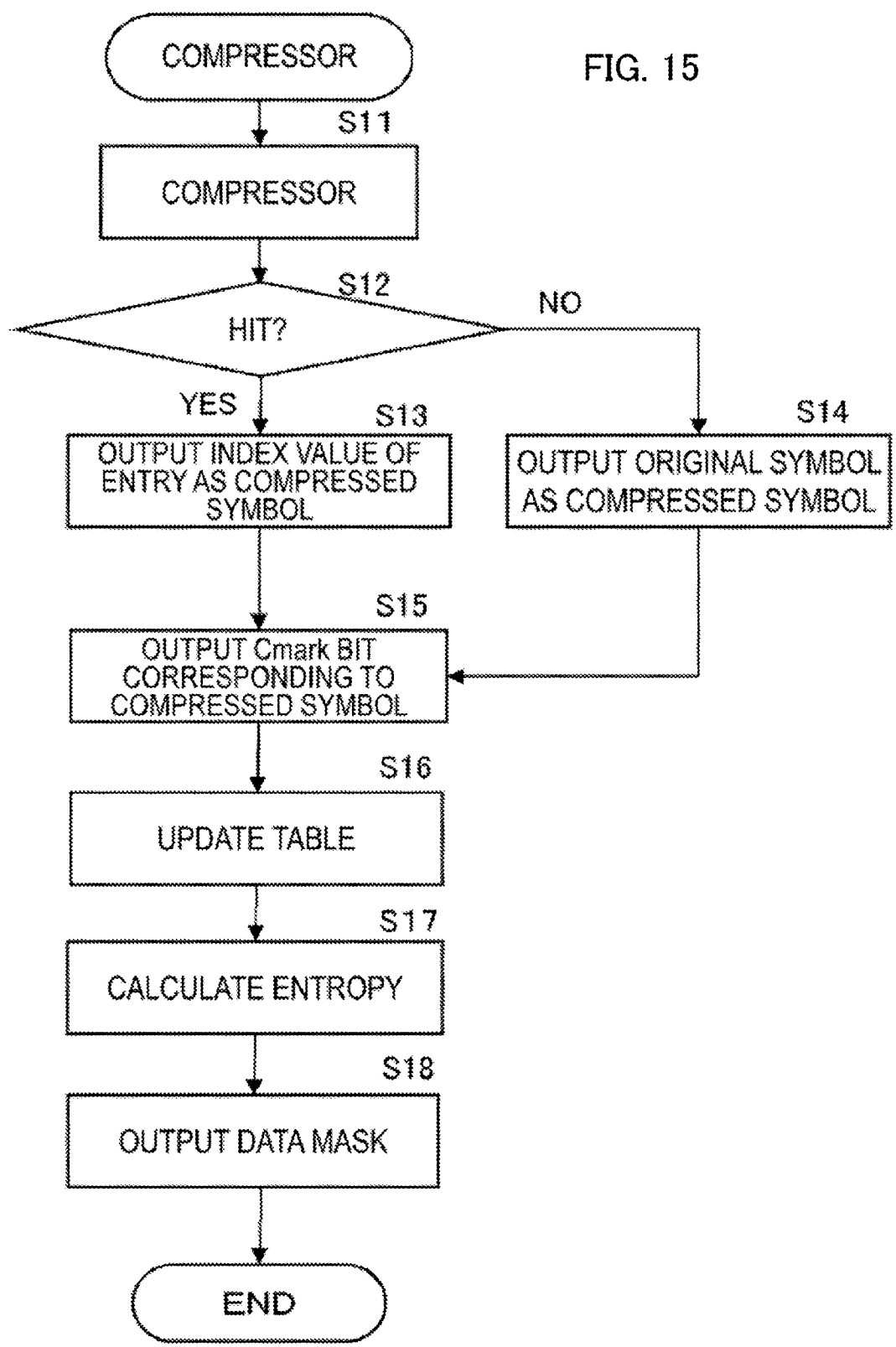
FIG. 15 is a flowchart illustrating an example of processing of a compressor 11.

FIG. 15 is a flowchart illustrating an example of processing of the compressor 11. In S11, an original symbol (N-bit) is input to the symbol conversion unit 111. Then, the symbol conversion unit 111 retrieves an entry in which the original symbol is registered from the conversion table (S12). In a case where the original symbol is registered (in a case where the entry is hit), the processing proceeds to S13, and in a case where the original symbol is not registered (in a case where the entry is hit), the processing proceeds to S14.

In a case where the processing proceeds to S13, the symbol conversion unit 111 outputs an index value of the entry in which the original symbol is registered, as a compressed symbol. Thereafter, the processing proceeds to S15. The number of bits required for representation changes depending on the index value. For example, in a case where the index value of the hit entry is "0" or "1", the index value can be represented as 1 bit. In the present embodiment, the number of valid bits representing an index value is determined based on the usage conditions of a conversion table, and the number of valid bits is indicated by a data mask. In the serializer 12, an index value (M bits) output from the compressor 11 is the number of valid bits indicated by a data mask. At this time, data is compressed by converting an index into a number of bits smaller than N.

In a case where the processing proceeds to S14, the original symbol itself is output as a compressed symbol. In S15, the symbol conversion unit 111 outputs a Cmark bit corresponding to the compressed symbol. For example, in a case where the original symbol is not hit from the conversion table (in a case where the original symbol is not registered in the conversion table), the symbol conversion unit 111 outputs a Cmark bit "0" indicating non-compression. On the other hand, in a case where the original symbol is hit (in a case where the original symbol is registered in the conversion table), the symbol conversion unit 111 outputs a Cmark bit "1" indicating compression.

In S16, the symbol conversion unit 111 performs conversion table update processing. The conversion table update processing will be described later. In S17, the entropy calculation unit 112 performs entropy calculation. The order of S16 and S17 may be reversed. In S18, the mask generation unit 113 outputs a data mask corresponding to entropy calculation results. However, in a case where a Cmark bit is "0", a data mask having all "1" may be output independent of an entropy calculation value, and the data mask may not be output (output when a Cmark bit is "1").

<First Operation Method for Conversion Table>

Figure 16A:
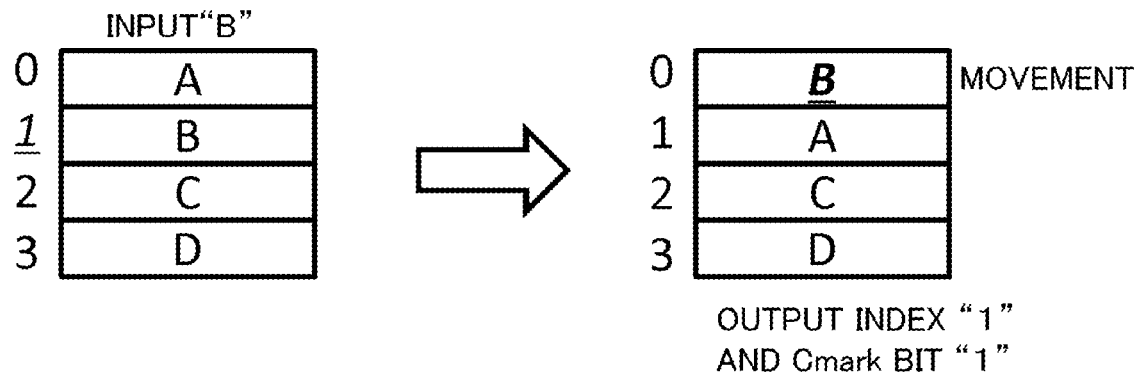
FIGS. 16A to 16C are diagrams illustrating a first operation method for a conversion table.
Figure 16B:
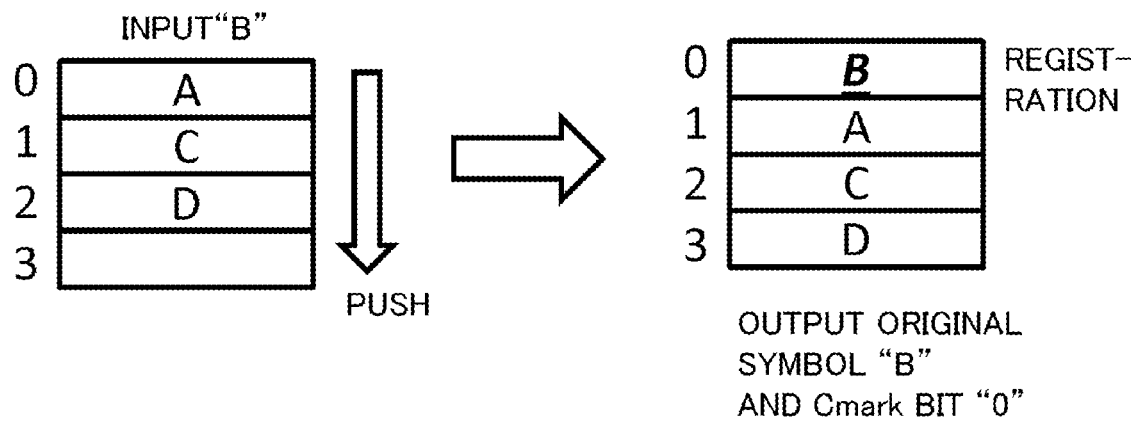
Figure 16C:
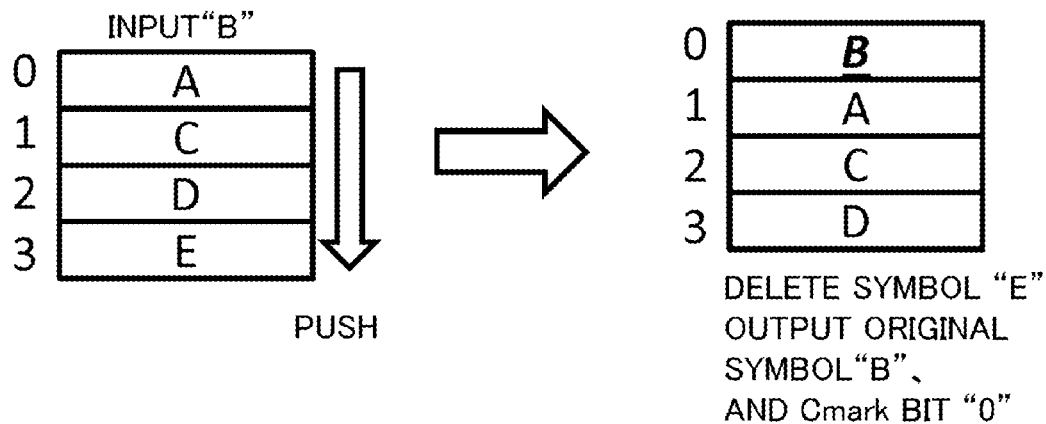

FIGS. 16A to 16C are diagrams illustrating a first operation method for a conversion table. FIG. 16A illustrates a case where an original symbol is hit. A case where an original symbol "B" is input in the registration conditions in the conversion table as illustrated in FIG. 16A is assumed. In this case, the symbol "B" has already been registered in the conversion table, and the symbol "B" is hit. At this time, the symbol conversion unit 111 moves the hit symbol "B" to the leading entry. In addition, the symbol conversion unit 111 outputs an index value "1" of an entry in which the symbol "B" is registered and a Cmark bit "1" indicating compression.

FIG. 16B illustrates a case where there is an empty entry and an original symbol is mis-hit. As illustrated in FIG. 16B, a case where an original symbol "B" is input when an entry of an index "3" is an empty entry is assumed. In this case, the symbol "B" is unregistered in the conversion table, and the symbol "B" is mis-hit. At this time, the symbol conversion unit 111 pushes the entire conversion table to move symbols ("A", "C", "D") having already been registered to positions where one index value is added. Thereby, the leading entry (an index "0") is in an empty state. The symbol conversion unit 111 registers the symbol "B" in the leading entry. In addition, the symbol conversion unit 111 outputs the original symbol "B" and a Cmark bit "0" indicating non-compression.

FIG. 16C illustrates a case where an original symbol is mis-hit without an empty entry. As illustrated in FIG. 16C, a case where the original symbol "B" is input when symbols are registered (full) in all entries in the conversion table is assumed. In this case, the symbol "B" is unregistered in the conversion table, and the symbol "B" is mis-hit. At this time, the symbol conversion unit 111 pushes the entire conversion table to move symbols ("A", "C", "D", "E") having already been registered to positions where one index value is added. However, the symbol "E" registered in the last entry (an index "3") is expelled out and deleted from the conversion table. The symbol conversion unit 111 registers the symbol "B" in the leading entry set to be in an empty state. In addition, the symbol conversion unit 111 outputs the original symbol "B" and the Cmark bit "0" indicating non-compression.

<Second Operation Method for Conversion Table>

Figure 17A:
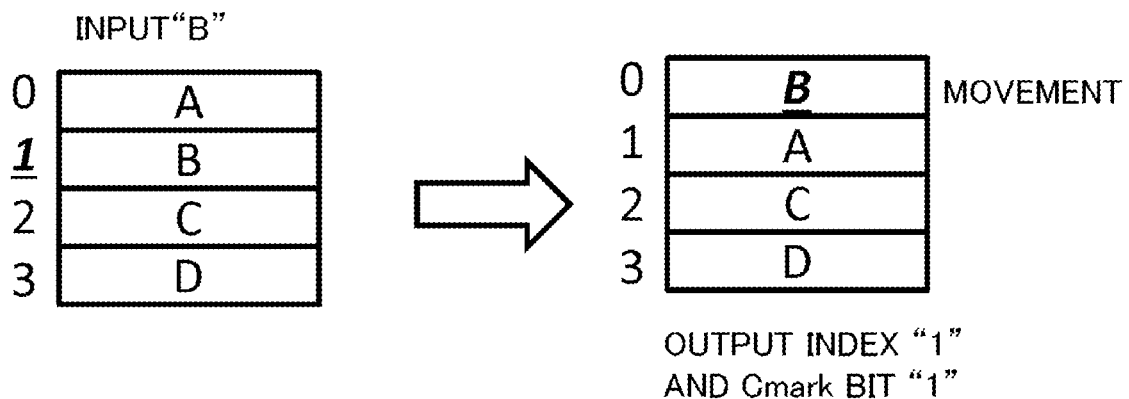
FIGS. 17A to 17C are diagrams illustrating a second operation method for a conversion table.
Figure 17B:
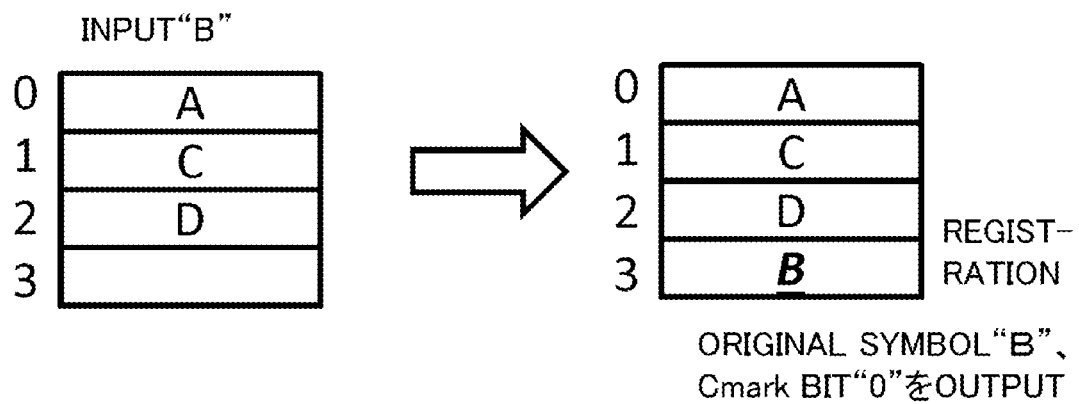
Figure 17C:
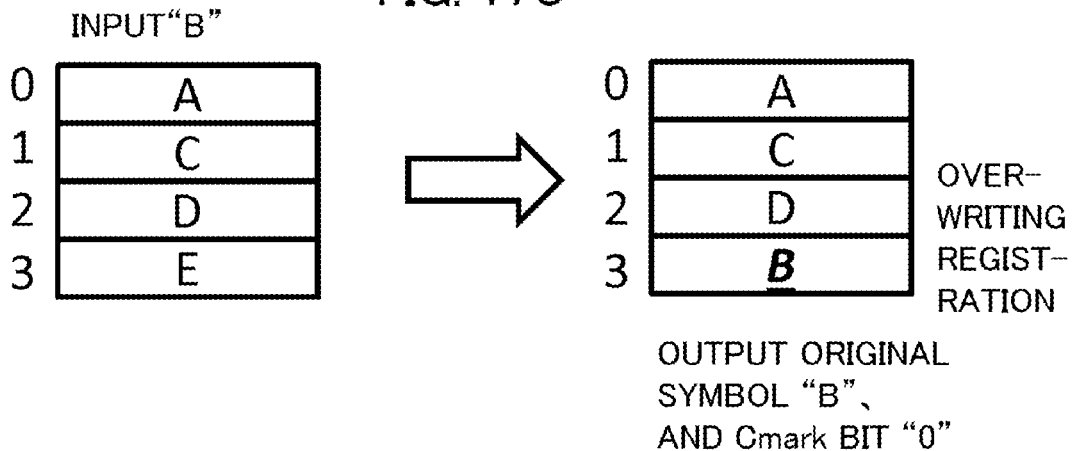

FIGS. 17A to 17C are diagrams illustrating a second operation method for a conversion table. FIG. 17A illustrates a case where an original symbol is hit. A case where an original symbol "B" is input in the registration conditions in the conversion table as illustrated in FIG. 17A is assumed. In this case, the symbol "B" is hit, and thus the symbol conversion unit 111 moves the symbol "B" to the leading entry. In addition, the symbol conversion unit 111 outputs an index value "1" and a Cmark bit "1". This is the same as the first operation method.

FIG. 17B illustrates a case where there is an empty entry and the original symbol is mis-hit. As illustrated in FIG. 17B, a case where the original symbol "B" is input when an index "3" is an empty entry is assumed. In this case, the symbol "B" is unregistered in the conversion table, and the symbol "B" is mis-hit. At this time, the symbol conversion unit 111 registers the symbol "B" in the index "3" corresponding to a predetermined position (for example, the empty entry at the end) in the empty entry. In addition, the symbol conversion unit 111 outputs the original symbol "B" and a Cmark bit "0".

FIG. 17C illustrates a case where an original symbol is mis-hit without an empty entry. As illustrated in FIG. 17C, a case where the original symbol "B" is input when the conversion table is full is assumed. In this case, the symbol "B" is mis-hit. The symbol conversion unit 111 overwrites and registers the symbol "B" in a predetermined entry (for example, an index "3" at the end) (a symbol "E" is deleted as a result). The symbol conversion unit 111 outputs the symbol "B" and the Cmark bit "0".

However, the examples illustrated in FIGS. 17B and 17C are only examples, and it is sufficient that an equivalent rule between the compressor and the decompressor be applied to a registration position of a mis-hit symbol so that a change in the registration conditions in the conversion table of the compressor can be reproduced by the conversion table of the decompressor.

The symbol conversion unit 111 may execute any of the first operation method and the second operation method. Note that, in the first operation method, hardware (circuit) that performs a pushing operation becomes complicated, and thus implementation using software (a processor and a memory) is preferable. On the other hand, in the second method, implementation using hardware is easier than that in the first operation method.

Entropy Calculation Method (First Calculation Method)

In a case where an original symbol is detected from a conversion table (in a case where the original symbol is hit), the compressor 11 outputs a Cmark bit "1" and outputs a data mask corresponding to results of entropy calculation.

In a first calculation method, in a case where an original symbol is N bits, an N-bit mask in which bits are set to "1" by the value of a ceiling function (that is, ceil($\log_2 k$)) of a binary logarithm of the number of entries k in use in the conversion table is generated. That is, an entropy value E is obtained by Formula 1 below.

$$E = \text{ceil}(\log_2 k) \quad \text{Formula 1:}$$

For example, in a case where the number of entries in use in the conversion table is one, ceil($\log_2 1$)=0. Further, in a case where the number of entries in use is two, ceil($\log_2 2$)=1. Further, in a case where the number of entries in use is three, ceil($\log_2 3$)=2. Further, in a case where the number of entries in use is five, ceil($\log_2 5$)=3.

Figure 18A:
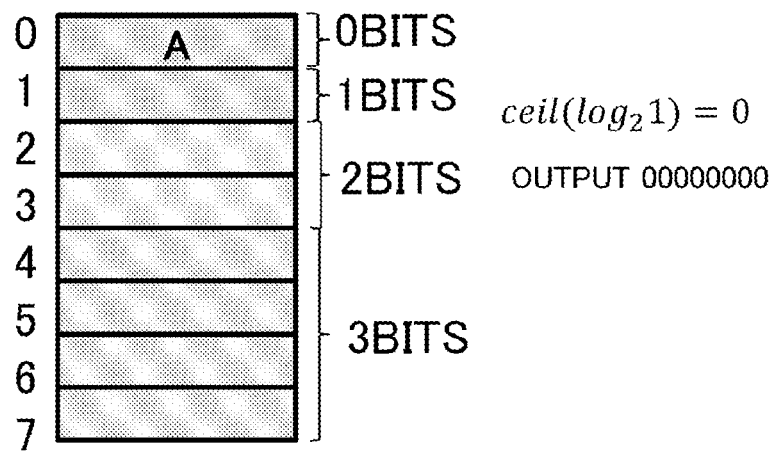
FIGS. 18A to 18C illustrate an example of a first entropy calculation method.
Figure 18B:
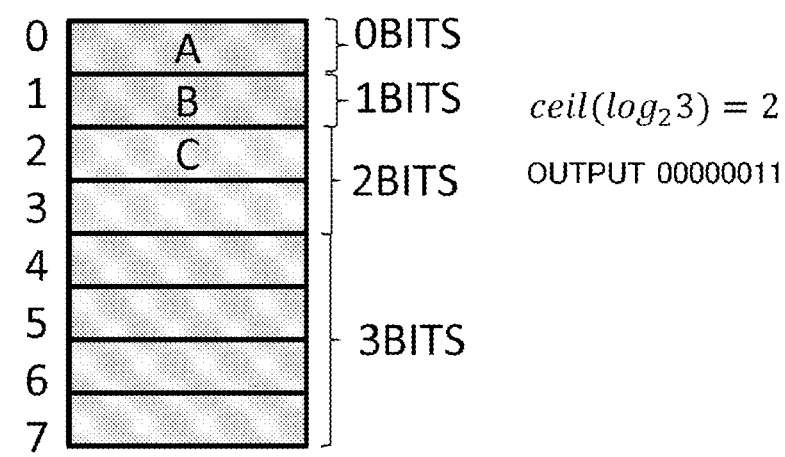
Figure 18C:
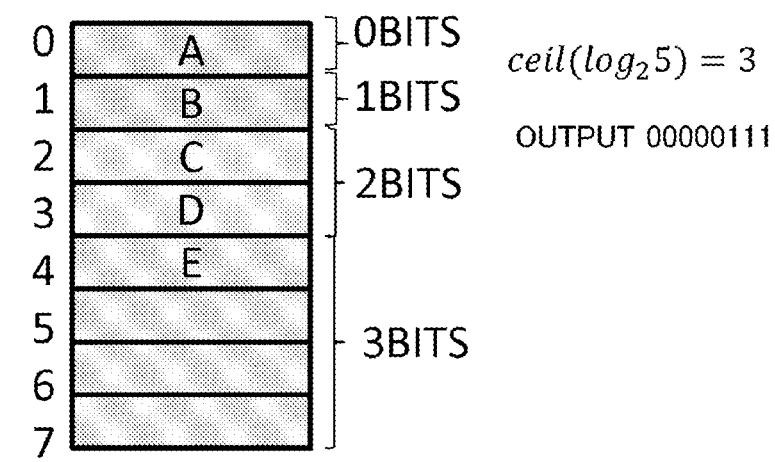

FIGS. 18A to 18C illustrate an example of the first entropy calculation method. In the examples illustrated in FIGS. 18A to 18C, the conversion table has entries in which the number of indexes is eight (index values are "0" to "7").

In the example illustrated in FIG. 18A, in a case where a symbol is registered in only the index "0", the number of entries in use is k=1. For this reason, a calculation result of an entropy calculated by the entropy calculation unit 112 is ceil($\log_2 1$)=0. In this case, the mask generation unit 113 generates and outputs "00000000" as an N-bit data mask. When a Cmark bit is "1" in the case of k=1, it is apparent that a symbol is necessarily registered in an entry of an index "0". For this reason, the index "0" is represented by 0 bits, and only the Cmark bit is output from the serializer 12.

In the example illustrated in FIG. 18B, symbols are registered in indexes "0" to "2", and the number of entries in use is three. In this case, the entropy calculation result is ceil($\log_2 3$)=2, and a data mask "00000011" in which bits of 2 digits from the least significant bit among N=8 bits are set to "1" (a valid bit indicates lower two bits) is output as a data mask. In the example illustrated in FIG. 18C, the number of entries in use is five, and thus an entropy calculation result is ceil($\log_2 5$)=3, and a data mask "00000111" in which bits of 3 digits from the least significant bit among N=8 bits are set to "1" (a valid bit indicates lower three bits) is output as a data mask.

In the conversion tables illustrated in FIGS. 18A to 18C, in a case where a symbol is registered in only the index "0", the number of valid bits in the data mask is zero. Further, in a case where a symbol is registered in the indexes "0" and "1", the number of valid bits in the data mask is one. In a case where a symbol is registered in indexes "0" to "2" or indexes "0" to "3", the number of valid bits in the data mask is two. In a case where a symbol is registered in indexes "0" to "4" and the subsequent indexes, the number of valid bits in the data mask is three.

<Configuration of Decompression Apparatus>

FIG. 19 illustrates a configuration example of a decompression apparatus in the first embodiment. In FIG. 19, a decompression apparatus 50 includes a deserializer 51 and a decompressor 52. Transmission data transmitted to be divided for every K bits is input to the deserializer 51. The deserializer 51 extracts a compressed symbol of M bits and a Cmark bit of 1 bit from the transmission data and inputs the extracted compressed symbol and Cmark bit to the decompressor 52. The decompressor 52 outputs an m-bit data mask and outputs N-bit original symbol data using the compressed symbol and the Cmark bit.

Figure 20:
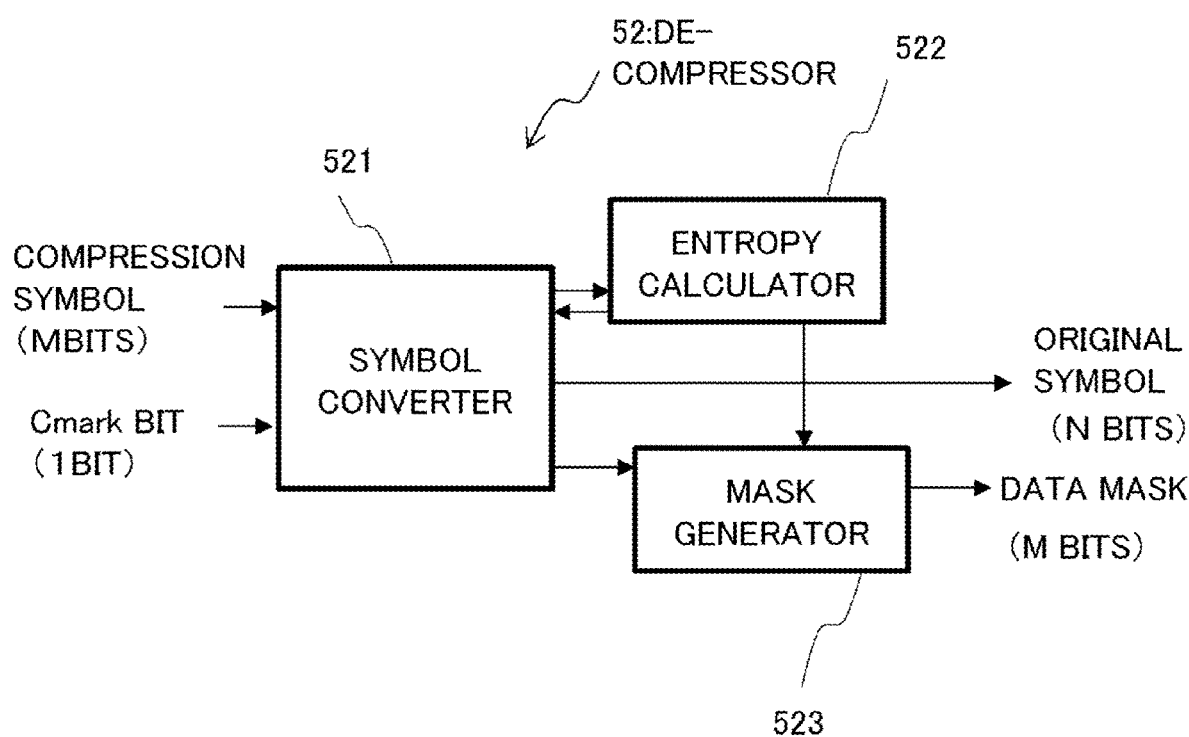
FIG. 20 illustrates a configuration example of a decompressor.

FIG. 20 illustrates a configuration example of the decompressor 52. The decompressor 52 includes a symbol conversion unit 521, an entropy calculation unit 522, and a mask generation unit 523. The symbol conversion unit 521 includes a conversion table having the same configuration as that of the conversion table included in the compressor 11. The symbol conversion unit 521 receives a compressed symbol and a Cmark bit and outputs an original symbol using the compressed symbol and Cmark bit and the conversion table.

The entropy calculation unit 522 acquires information indicating the number of entries in use of the conversion table from the symbol conversion unit 521, calculates an entropy in the same calculation method as the calculation method performed by the entropy calculation unit 112 of the compressor 11, and gives calculation results to the mask generation unit 523. The mask generation unit 523 receives a Cmark bit from the symbol conversion unit 521, outputs a data mask having all "1" in a case where a bit value is "0", and outputs a data mask having the number of valid bits corresponding to an entropy calculation result from the entropy calculation unit 522 in a case where a bit value is "1". The data mask is input to the deserializer 51.

Figure 21:
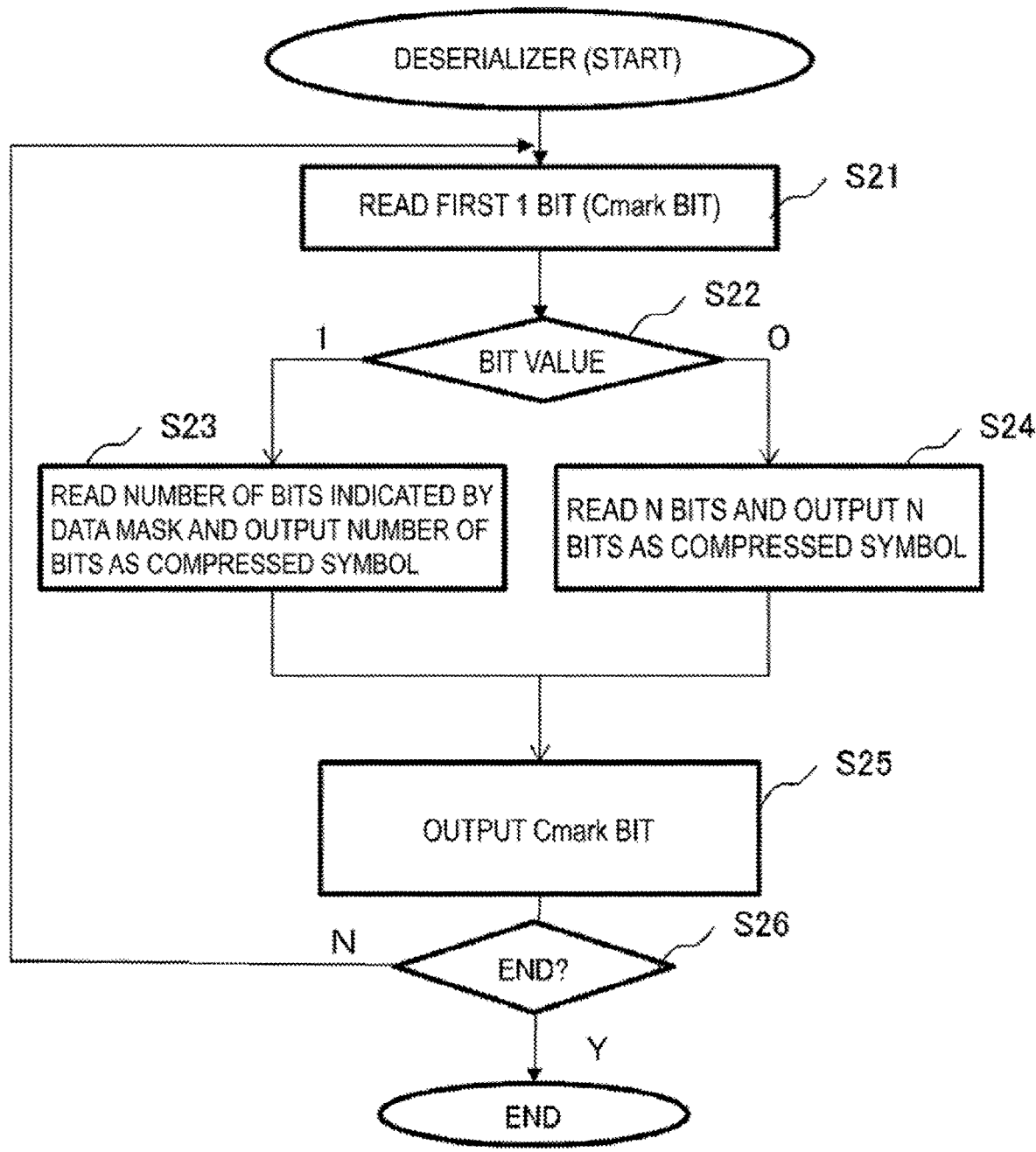
FIG. 21 is a flowchart illustrating an example of processing of a deserializer.

FIG. 21 is a flowchart illustrating an example of processing of the deserializer 51. In S21, the deserializer 51 reads the first 1 bit (corresponding to a Cmark bit) of the input transmission data.

In S22, the deserializer 51 determines whether a bit value is "1" or "0". In a case where the bit value is "1", transmission data of the number of bits indicated by a data mask input from the decompressor 52 is read and output as a compressed symbol (S23). In contrast, in a case where the bit value is "0", the deserializer 51 reads N-bit transmission data and outputs the data as a compressed symbol (S24). The output of N bits may be performed by inputting a data mask ("11111111": N=M=8 bits) in which all of the N bits indicate valid bits to the deserializer 51 and causing the deserializer 51 to refer to the data mask, or may be performed in accordance with a definition of outputting N bits independent of the value of the data mask. In the first embodiment, a mode in which a data mask "11111111" is input in a case where a Cmark bit is "0" will be described.

In S25, the bit read in S21 is output as a Cmark bit. The process of S25 may be executed before S23 and S24 or may be executed before S22. In S26, it is determined whether the transmission data has ended, and in a case where there is no transmission data, the processing is terminated. In a case where there is transmission data, the processing returns to S21.

Figure 22:
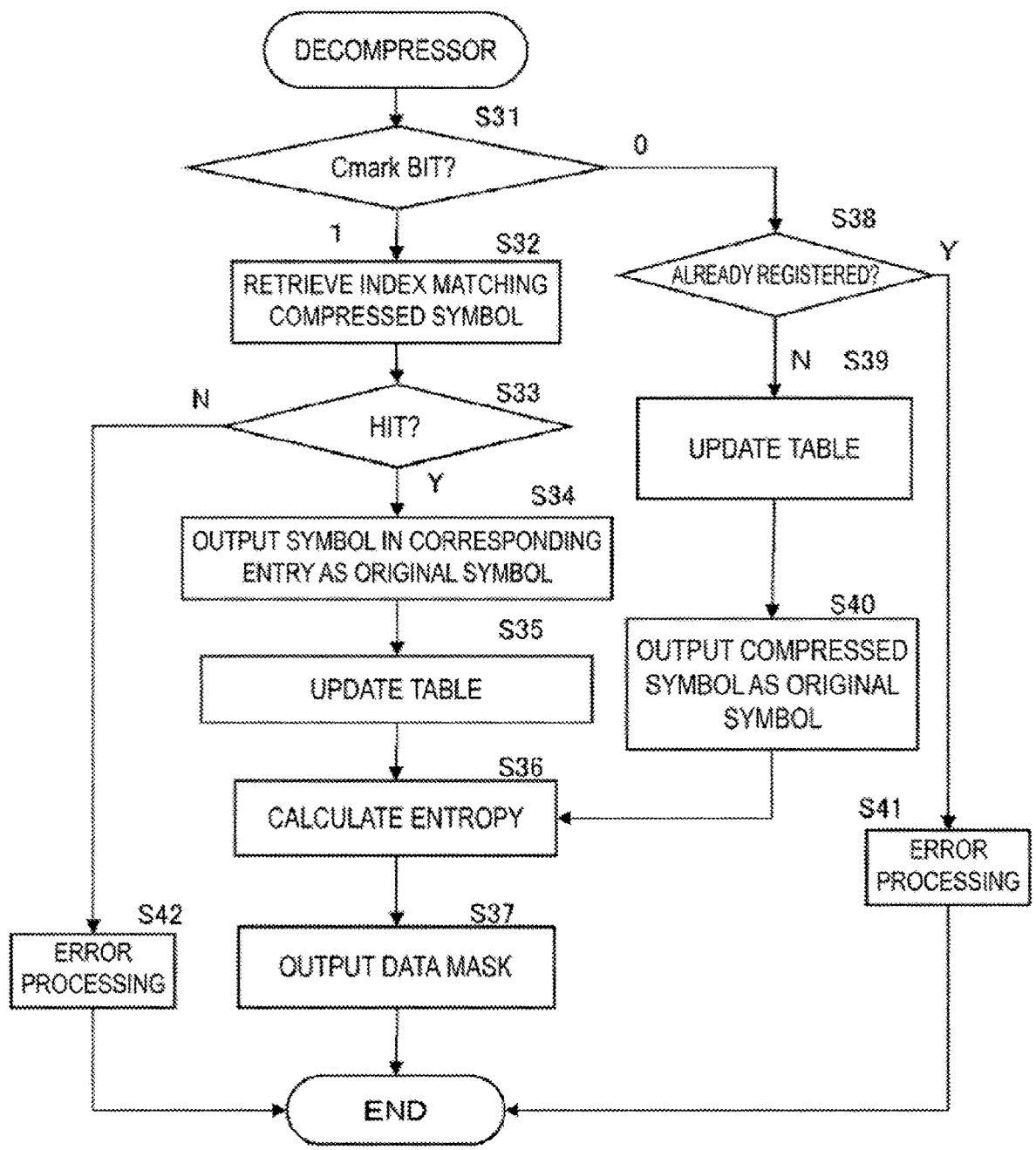
FIG. 22 is a flowchart illustrating an example of processing of a decompressor.

FIG. 22 is a flowchart illustrating an example of processing of the decompressor 52. In S31, the symbol conversion unit 521 of the decompressor 52 determines whether the value of the Cmark bit input from the deserializer 51 is "0" or "1". In a case where the value of the Cmark bit is "0" (S31, 0), the symbol conversion unit 521 determines whether a symbol to be registered has already been registered in the conversion table. At this time, in a case where it is determined that a symbol to be registered has already been registered (S38, Y), the decompressor 52 performs predetermined error processing (S41), and the processing is terminated.

On the other hand, in a case where it is determined that the symbol to be registered has not been registered (S38, N), the symbol conversion unit 521 performs processing of registering a compressed symbol in the conversion table (table update) (S39). Thereafter, the symbol conversion unit 521 outputs the compressed symbol input from the deserializer 51 as the original symbol (S40). Thereafter, the processing proceeds to S36. However, the order of the process of S39 and the process of S40 may be reversed or parallel.

On the other hand, in a case where the value of the Cmark bit is "1" (S31, 1), the symbol conversion unit 521 retrieves an index matching the value of the compressed symbol, which is input from the deserializer 51, from the conversion table (S32). The symbol conversion unit 521 determines whether an index has been hit (S33), and in a case where an index has not been hit (S33, N), the symbol conversion unit 521 performs predetermined error processing (S42) and terminates the processing in FIG. 22.

On the other hand, in a case where an index has not been hit (S33, Y), the symbol conversion unit 521 outputs a symbol in an entry corresponding to the index as an original symbol (S34). In S35, the symbol conversion unit 521 performs table update processing, moves the hit symbol to a predetermined position (an index "0") and moves a symbol registered in one entry prior to the entry in which the symbol hit from the index "0" has been registered to the next entry. The order of the process of S34 and the process of S35 may be reversed or parallel.

In S36, the entropy calculation unit 522 acquires information (a usage rate, a hit rate) indicating the usage conditions of the conversion table every time the original symbol is output. Regarding the acquisition, a usage rate and the like may be acquired with reference to the conversion table, and information indicating a usage rate and the like may be acquired from the symbol conversion unit 521. The entropy calculation unit 522 performs entropy calculation using the first or second calculation method. The mask generation unit 523 acquires an entropy calculation value, generates a data mask having a valid bit corresponding to the entropy calculation value, and supplies the data mask to the deserializer 51. Thereafter, the processing in FIG. 22 is terminated. Note that, in a third embodiment, the processes of S38 and S41 and the processes of S33 and S42 are not necessarily required.

Operational Example

<<Compression Method>>

Figure 23A:
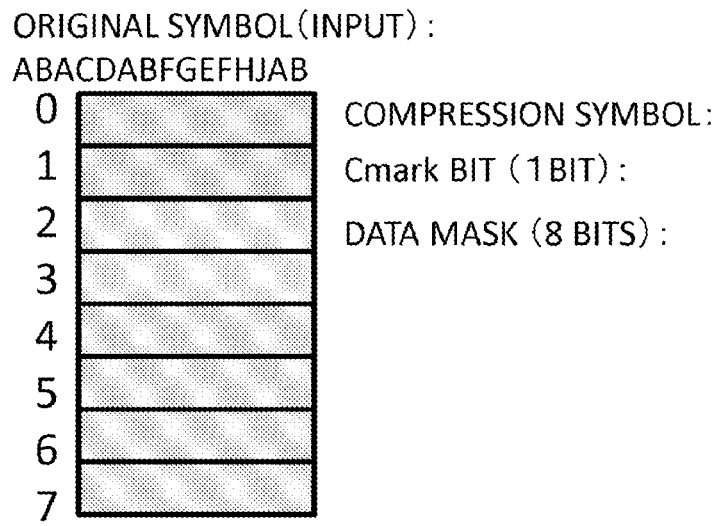
FIGS. 23A to 23C are diagrams illustrating an operational example of the compression apparatus.

FIGS. 23A to 23C, FIGS. 24A to 24C, FIGS. 25A to 25C, FIGS. 26A to 26C, FIGS. 27A to 27C, and FIG. 28 are diagrams illustrating an operational example (compression method) of the compression apparatus 10. FIG. 23A illustrates a conversion table according to an operational example. The conversion table has the structure described using FIGS. 18A to 18C. The number of all entries in the conversion table is eight (index values "0" to "7"). As an example, an input is a symbol data sequence "ABACD-ABFGEFHJAB" in which Currently Amended symbols of 8 bits are connected. In the conversion table in an initial state, it is assumed that all entries are in an unregistered state. In the following operational example, conversion table update processing is performed by the first operation method for the conversion table. The conversion table update processing is performed by the compressor 11 (symbol conversion unit 111). The entropy calculation unit 112 calculates an entropy using the first calculation method. Further, in the present operational example, a case where N=M=8 bits will be described.

Figure 23B:
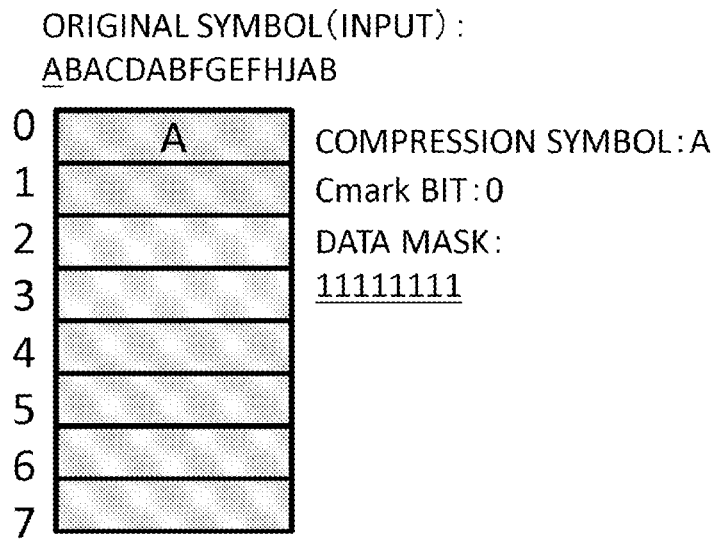

FIG. 23B illustrates the processing of an input original symbol "A". The original symbol "A" is not registered (mis-hit) in the conversion table. For this reason, the symbol conversion unit 111 registers the original symbol "A" in the leading entry (an index "0"). The symbol conversion unit 111 outputs the original symbol "A" as a compressed symbol and outputs a Cmark bit "0" indicating non-compression.

The mask generation unit 113 outputs a data mask "11111111" indicating that all 8 bits are valid bits. The serializer 12 performs the processing illustrated in FIG. 11 and outputs serial data "0A" obtained by connecting a symbol "A" to the Cmark bit "0" (ASCII code: 01000001) in accordance with the data mask "11111111". However, the symbols may be represented by a code other than the ASCII code.

Figure 23C:
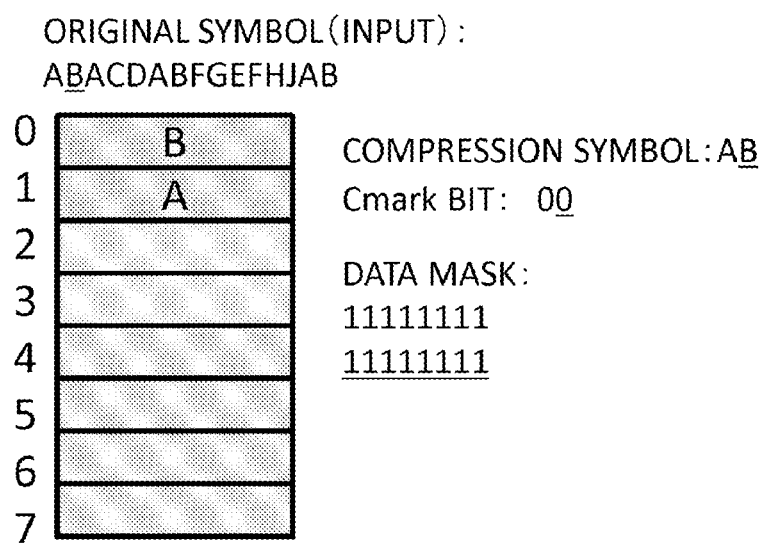

FIG. 23C illustrates the processing of the original symbol "B" which is input after the original symbol "A". Since the original symbol "B" is unregistered, the symbol conversion unit 111 performs pushing processing to register the symbol "B" in the index "0" and register the symbol "A" in the index "1" which is the next entry. The symbol conversion unit 111 outputs the symbol "B" and the Cmark bit "0". At this time, the mask generation unit 113 outputs a data mask "11111111". The serializer 12 outputs serial data "0B" obtained by connecting the symbol "B" to the Cmark bit "0" (ASCII code: 01000010) in accordance with the data mask.

Figure 24A:
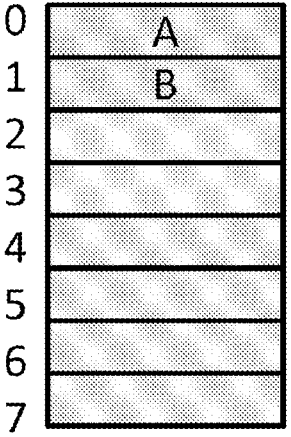
FIGS. 24A to 24C are diagrams illustrating an operational example of the compression apparatus.

FIG. 24A illustrates the processing of the original symbol "A" which is input after the original symbol "B". The symbol "A" is registered in the index "1". For this reason, the symbol "A" is hit. In this case, the symbol conversion unit 111 outputs a bit value "1" indicating the index value "1" of the entry in which the symbol "A" has been registered as a compressed symbol, and outputs a Cmark bit "1" indicating compression. The symbol conversion unit 111 moves the hit symbol "A" to the leading entry (an index "0"), while moving the symbol "B" that has been registered in the index "0" to the next entry (an index "1").

In this case, an entropy calculation result in the entropy calculation unit 112 is ceil($\log_2 2$)=1. For this reason, the mask generation unit 113 generates and outputs a data mask "00000001". In a case where a symbol has been compressed (symbol conversion has been performed), the serializer 12 outputs a bit "1" of the number of valid bits (=1) indicated by the data mask as a compressed symbol in a case where a Cmark bit is "1" (FIG. 21, S23). Thereby, the serializer 12 outputs serial data "11" of 2 bits in which the compressed symbol "1" follows the Cmark bit "1".

Figure 24B:
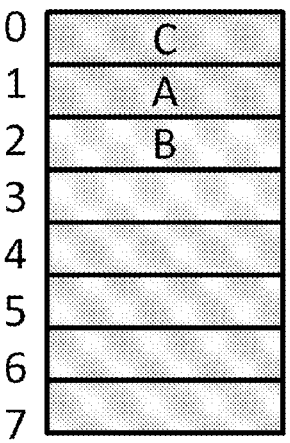

FIG. 24B illustrates the processing of the original symbol "C" which is input after the symbol "A". Since the symbol "C" is unregistered, the symbol conversion unit 111 outputs the symbol "C" and the Cmark bit "0" and performs pushing processing on the symbol "C". In other words, the symbol "C" is registered in the index "0", and symbols that have already been registered are moved to the next entry. In this case, the mask generation unit 113 generates and outputs a data mask having all "1". The serializer 12 outputs serial data "0C" in which the symbol "C" follows the Cmark bit "0" (ASCII code: 01000011) in accordance with the data mask.

Figure 24C:
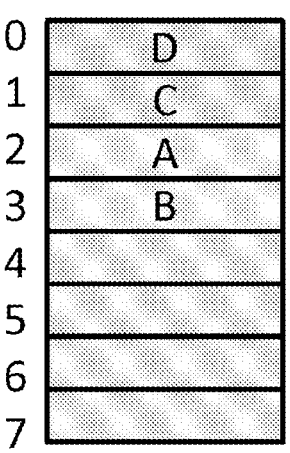

FIG. 24C illustrates the processing of the Currently Amended symbol "D" which is input after the symbol "C". Since the symbol "D" is unregistered, the symbol conversion unit 111 outputs the symbol "C" and the Cmark bit "0" and performs pushing processing on the symbol "D". The mask generation unit 113 generates and outputs a data mask having all "1". The serializer 12 outputs serial data "0D" in which the symbol "D" follows the Cmark bit "0" (ASCII code: 01000100) in accordance with the data mask.

FIG. 25A illustrates the processing of the original symbol "A" which is input after the symbol "D". The symbol "A" is registered in an index "2" (FIG. 24C). For this reason, the symbol conversion unit 111 outputs a bit value "10" indicating the index value "2" (FIG. 24C) of the entry in which the symbol "A" has been registered as a compressed symbol, and outputs a Cmark bit "1" indicating compression. The symbol conversion unit 111 moves the hit symbol "A" to an index "0", while moving symbols "D", "C", and "B" to the next entry.

In this case, an entropy calculation result in the entropy calculation unit 112 is 2. For this reason, the mask generation unit 113 generates and outputs a data mask "00000011". Since a Cmark bit is "1", the serializer 12 outputs bits "10" of the number of valid bits (=2) indicated by the data mask as a compressed symbol. Thereby, serial data "110" of 3 bits in which the compressed symbol "10" follows the Cmark bit "1" is output from the serializer 12.

FIG. 25B illustrates the processing of the original symbol "B" which is input after the symbol "A". Since the symbol "B" is registered in an index "3" (FIG. 25A), the symbol conversion unit 111 outputs a bit value "11" indicating the index value "3" of an entry in which the symbol "B" has been registered as a compressed symbol, and outputs a Cmark bit "1" indicating compression. In addition, the symbol conversion unit 111 moves the symbol "B" to an index "0", while moving symbols "A", "D", and "C" to the next entry.

In this case, an entropy calculation result in the entropy calculation unit 112 is 2, and the mask generation unit 113 generates and outputs a data mask "00000011". Since a Cmark bit is "1", the serializer 12 outputs a bit of the number of valid bits (=2) indicated by the data mask as a compressed symbol. Thereby, serial data "111" of 3 bits in which a compressed symbol "11" follows the Cmark bit "1" is output from the serializer 12.

FIG. 25C illustrates the processing of the original symbol "F" which is input after the symbol "B". Since the symbol "F" is unregistered, the symbol conversion unit 111 outputs the symbol "F" and the Cmark bit "0" and performs pushing processing on the symbol "F". In this case, the mask generation unit 113 generates and outputs a data mask having all "1". The serializer 12 outputs serial data "0F" in which the symbol "F" follows the Cmark bit "0" (ASCII code: 01000110) in accordance with the data mask.

FIG. 26A illustrates the processing of the symbol "G" following the symbol "F". Since the symbol "G" is unregistered, the symbol conversion unit 111 outputs the symbol "G" and the Cmark bit "0" and performs pushing processing on the symbol "G". In this case, the mask generation unit 113 generates and outputs a data mask having all "1". The serializer 12 outputs serial data "0G" in which the symbol "G" follows the Cmark bit "0" (ASCII code: 01000110) in accordance with the data mask.

FIG. 26B illustrates the processing of the symbol "E" following the symbol "G". Since the symbol "E" is unregistered, the symbol conversion unit 111 outputs the symbol "E" and the Cmark bit "0" and performs pushing processing on the symbol "E". In this case, the mask generation unit 113 generates and outputs a data mask having all "1". The serializer 12 outputs serial data "0E" in which the symbol "E" follows the Cmark bit "0" (ASCII code: 01000101) in accordance with the data mask.

FIG. 26C illustrates the processing of the original symbol "F" which is input after the symbol "E". The symbol "F" is registered in the index "2" (FIG. 26B). For this reason, the symbol conversion unit 111 outputs a bit value "10" indicating an index value "2" and a Cmark bit "1". In addition, the symbol "F" is moved to the index "0", while the symbols "E" and "G" are moved to the next entry (the symbols "B", "A", "D", and "C" remain as they are).

In this case, the entropy calculation unit 112 outputs an entropy calculation result "3", and the mask generation unit 113 generates and outputs a data mask "00000111". Since a Cmark bit is "1", the serializer 12 outputs bits "010" of the number of valid bits (=3) indicated by the data mask as a compressed symbol. Thereby, serial data "1010" of 4 bits in which a compressed symbol "010" follows the Cmark bit "1" is output from the serializer 12.

FIG. 27A illustrates the processing of the original symbol "H" which is input after the symbol "F". Since the symbol "H" is unregistered, the symbol conversion unit 111 outputs the symbol "H" and the Cmark bit "0" and performs pushing processing on the symbol "H". In this case, the mask generation unit 113 generates and outputs a data mask having all "1". The serializer 12 outputs serial data "0H" in which the symbol "H" follows the Cmark bit "0" (ASCII code: 01001000) in accordance with the data mask.

FIG. 27B illustrates the processing of the symbol "J" subsequent to the symbol "H". Since the symbol "J" is unregistered, the symbol conversion unit 111 outputs the symbol "J" and the Cmark bit "0" and performs pushing processing on the symbol "J". At this time, the symbol "C" is expelled out and deleted from the conversion table. The mask generation unit 113 generates and outputs a data mask having all "1". The serializer 12 outputs serial data "0J" in which the symbol "J" follows the Cmark bit "0" (ASCII code: 01001010) in accordance with the data mask.

FIG. 27C illustrates the processing of the symbol "A" following the symbol "J". The symbol "A" is registered in the index "6" (FIG. 27B). For this reason, the symbol conversion unit 111 outputs a bit value "110" indicating an index value "6" and a Cmark bit "1". In addition, the symbol "A" is moved to the index "0", while the symbols "J" to "B" are moved to the next entry.

In this case, the entropy calculation unit 112 outputs an entropy calculation result "3", and the mask generation unit 113 generates and outputs a data mask "00000111". Since a Cmark bit is "1", the serializer 12 outputs bits "110" of the number of valid bits (=3) indicated by the data mask as a compressed symbol. Thereby, serial data "1110" of 4 bits in which the compressed symbol "110" follows the Cmark bit "1" is output from the serializer 12.

FIG. 28 illustrates the processing of the symbol "B" following the symbol "A". The symbol "B" is registered in the index "6" (FIG. 27C). For this reason, the symbol conversion unit 111 outputs the index value "6" (a bit value "111") and the Cmark bit "1". The symbol "B" is moved to the index "0", while the symbols "A" to "G" are moved to the next entry.

In this case, the entropy calculation unit 112 outputs an entropy calculation result "3", and the mask generation unit 113 generates and outputs a data mask "00000111". Since a Cmark bit is "1", the serializer 12 outputs bits "110" of the number of valid bits (=3) indicated by the data mask as a compressed symbol. Thereby, serial data "1110" of 4 bits in which a compressed symbol "110" follows the Cmark bit "1" is output from the serializer 12.

Note that, in the output of the compression apparatus 10 described above, an output of the serializer 12 for the original symbol sequence "ABACDABFGEFHJAB" (15× 8=120 bits) is 101 bits, and a compression rate is 84%.

<<Decompression Method>>

Figure 29A:
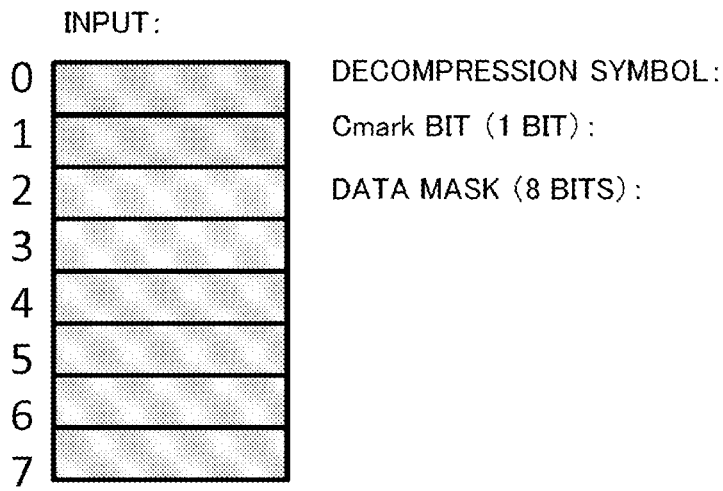
FIGS. 29A to 29C are diagrams illustrating an operational example of the decompression apparatus.

FIGS. 29A to 29C, FIGS. 30A to 30C, FIGS. 31A to 31C, FIGS. 32A to 32C, FIGS. 33A to 33C, and FIG. 34 are diagrams illustrating an operational example (compression method) of the decompression apparatus 50. FIG. 29A illustrates a conversion table according to an operational example of the decompression apparatus 50. This conversion table has the same data structure as that of the conversion table included in the compression apparatus 10 illustrated in FIG. 23A. For this reason, repeated description thereof will be omitted.

As an example, inputs to the decompression apparatus 50 may be bit sequences of serial data (a Cmark bit+a compressed symbol) output from the compression apparatus 10 in the operational example of the compression apparatus 10, that is, "0A", "0B", "11", "00", "0D", "110", "111", "0F", "0G", "0E", "1010", "0H", "0J", "1110", and "1110".

Further, in the conversion table in an initial state in the decompressor 52, it is assumed that all entries are in an unregistered state. In the following operational example, conversion table update processing is performed by the first operation method for the conversion table. The conversion table update processing is performed by the decompressor 52 (symbol conversion unit 521). The entropy calculation unit 522 calculates an entropy using the first calculation method.

Figure 29B:
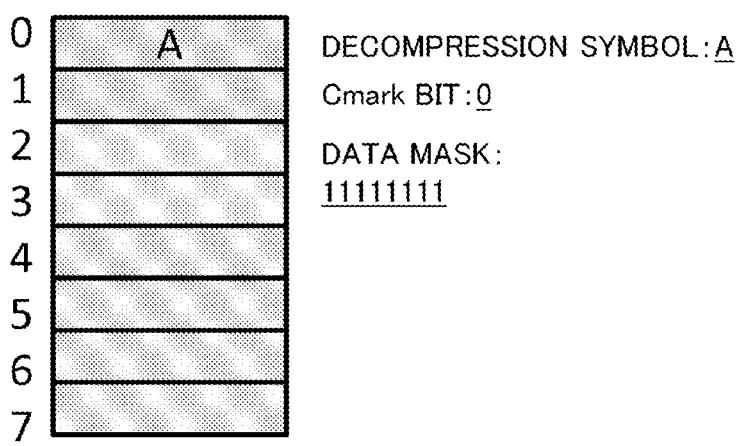

FIG. 29B illustrates processing in a case where serial data "0A" is input to the decompression apparatus 50. The serial data "0A" is separated into a Cmark bit "0" and a compressed symbol "A" by the deserializer 51, and the separated serial data is input to the decompressor 52.

Since the Cmark bit is "0", the symbol conversion unit 521 outputs the compressed symbol "A" as an original symbol (decompressed symbol). The entropy calculation unit 522 outputs 0 as a result of entropy calculation, and the data mask generation unit 523 generates and outputs a data mask "11111111" indicating all valid bits independent of the entropy calculation value.

Figure 29C:
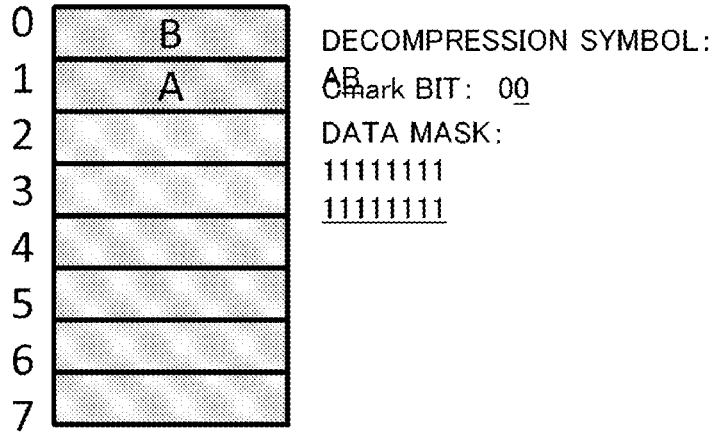

FIG. 29C illustrates processing in a case where serial data "0B" is input to the decompression apparatus 50. The deserializer 51 separates the serial data "0B" into a Cmark bit "0" and a compressed symbol "B" and inputs the separated serial data to the decompressor 52. Since the Cmark bit is "0", the symbol conversion unit 521 outputs the compressed symbol "B" as an original symbol. At this time, a data mask "11111111" is generated and output.

FIG. 30A illustrates processing in a case where serial data "11" is input to the decompression apparatus 50. The deserializer 51 determines that a Cmark bit is "1" with reference to the first "1" of the serial data "11". In this case, 1 bit is read in accordance with a data mask "00000001" from the decompressor 52 and is output as a compressed symbol. Thereby, separation into a Cmark bit "1" and a compressed symbol "1" is performed, and they are input to the decompressor 52.

Since the Cmark bit is "1", the symbol conversion unit 521 reads the symbol "A" (FIG. 29C) registered (stored) in an index indicated by the compressed symbol "1", that is, the index "1", and outputs the symbol as an original symbol. In addition, the symbol conversion unit 521 moves the symbol "A" to an index "0" and moves a symbol "B" to the next entry (an index "1"). The entropy calculation unit 522 outputs "1" as an entropy calculation result, and the mask generation unit 523 generates a data mask "00000001" and supplies the generated data mask to the deserializer 51.

FIG. 30B illustrates processing in a case where serial data "00" is input to the decompression apparatus 50. The deserializer 51 determines that a Cmark bit is "0" and performs N-bit output. Thereby, a compressed symbol "C" is output. The deserializer 51 supplies the Cmark bit "0" and the compressed symbol "C" to the decompressor 52.

Since the Cmark bit is "0", the symbol conversion unit 521 outputs the compressed symbol "C" as an original symbol, performs pushing processing on a conversion table, and registers the symbol "C" in an index "0". In this case, a data mask "11111111" is generated and output.

FIG. 30C illustrates processing in a case where serial data "0D" is input to the decompression apparatus 50. Since the Cmark bit is "0", the deserializer 51 outputs a compressed symbol "D" by N-bit output. The deserializer 51 supplies the Cmark bit "0" and the compressed symbol "D" to the decompressor 52.

Since the Cmark bit is "0", the symbol conversion unit 521 outputs the compressed symbol "D" as an original symbol, performs pushing processing on a conversion table, and registers the symbol "D" in an index "0". In this case, a data mask "11111111" is generated and output.

FIG. 31A illustrates processing in a case where serial data "110" is input to the decompression apparatus 50. The deserializer 51 determines that a Cmark bit is "1" with reference to the first "1" of the serial data "110". In this case, 2 bits are read in accordance with a data mask "00000011" from the decompressor 52, and a bit value "10" is output as a compressed symbol. Thereby, the Cmark bit "1" and the compressed symbol "10" are input to the decompressor 52.

Since the Cmark bit is "1", the symbol conversion unit 521 reads the symbol "A" (FIG. 30C) registered in an index indicated by the compressed symbol "10", that is, the index "2" and outputs the symbol as an original symbol. In addition, the symbol conversion unit 521 moves the symbol "A" to an index "0" and moves symbols "D" and "C" to the next entry. The entropy calculation unit 522 outputs "2" as an entropy calculation result, and the mask generation unit 523 generates a data mask "00000011" and supplies the generated data mask to the deserializer 51.

FIG. 31B illustrates processing in a case where serial data "111" is input to the decompression apparatus 50. The deserializer 51 determines that a Cmark bit is "1" with reference to the first "1" of the serial data "111". In this case, 2 bits are read in accordance with a data mask "00000011" from the decompressor 52, and a bit value "11" is output as a compressed symbol. Thereby, the Cmark bit "1" and the compressed symbol "11" are input to the decompressor 52.

Since the Cmark bit is "1", the symbol conversion unit 521 reads the symbol "B" (FIG. 31A) registered in an index indicated by the compressed symbol "11", that is, the index "3" and outputs the symbol as an original symbol. In addition, the symbol conversion unit 521 moves the symbol "B" to an index "0" and moves symbols "A", "D", and "C" to the next entry. The entropy calculation unit 522 outputs "2" as an entropy calculation result, and the mask generation unit 523 generates a data mask "00000011" and supplies the generated data mask to the deserializer 51.

FIG. 31C illustrates processing in a case where serial data "0F" is input to the decompression apparatus 50. Since the Cmark bit is "0", the deserializer 51 outputs a compressed symbol "F" by N-bit output. The deserializer 51 supplies the Cmark bit "0" and the compressed symbol "F" to the decompressor 52.

Since the Cmark bit is "0", the symbol conversion unit 521 outputs the compressed symbol "F" as an original symbol, performs pushing processing on a conversion table, and registers the symbol "F" in an index "0". In this case, a data mask "11111111" is generated and output.

FIG. 32A illustrates processing in a case where serial data "0G" is input to the decompression apparatus 50. Since the Cmark bit is "0", the deserializer 51 outputs a compressed symbol "G" by N-bit output. The deserializer 51 supplies the Cmark bit "0" and the compressed symbol "G" to the decompressor 52.

Since the Cmark bit is "0", the symbol conversion unit 521 outputs the compressed symbol "G" as an original symbol, performs pushing processing on a conversion table, and registers the symbol "G" in an index "0". In this case, a data mask "11111111" is generated and output.

FIG. 32B illustrates processing in a case where serial data "0E" is input to the decompression apparatus 50. Since the Cmark bit is "0", the deserializer 51 outputs a compressed symbol "E" by N-bit output. The deserializer 51 supplies the Cmark bit "0" and the compressed symbol "E" to the decompressor 52.

Since the Cmark bit is "0", the symbol conversion unit 521 outputs the compressed symbol "E" as an original symbol, performs pushing processing on a conversion table, and registers the symbol "E" in an index "0". In this case, a data mask "11111111" is generated and output.

FIG. 32C illustrates processing in a case where serial data "1010" is input to the decompression apparatus 50. The deserializer 51 determines that a Cmark bit is "1" with reference to the first "1" of the serial data "1010". In this case, 3 bits are read in accordance with a data mask "00000111" from the decompressor 52, and a bit value "010" is output as a compressed symbol. Thereby, the Cmark bit "1" and the compressed symbol "010" are input to the decompressor 52.

Since the Cmark bit is "1", the symbol conversion unit 521 reads the symbol "F" (FIG. 32B) registered in an index indicated by the compressed symbol "010", that is, the index "2" and outputs the symbol as an original symbol. In addition, the symbol conversion unit 521 moves the symbol "F" to an index "0" and moves symbols "E" and "G" to the next entry. The entropy calculation unit 522 outputs "3" as an entropy calculation result, and the mask generation unit 523 generates a data mask "00000111" and supplies the generated data mask to the deserializer 51.

FIG. 33A illustrates processing in a case where serial data "0H" is input to the decompression apparatus 50. Since the Cmark bit is "0", the deserializer 51 outputs a compressed symbol "H" by N-bit output. The deserializer 51 supplies the Cmark bit "0" and the compressed symbol "H" to the decompressor 52.

Since the Cmark bit is "0", the symbol conversion unit 521 outputs the compressed symbol "H" as an original symbol, performs pushing processing on a conversion table, and registers the symbol "H" in an index "0". In this case, a data mask "11111111" is generated and output.

FIG. 33B illustrates processing in a case where serial data "0J" is input to the decompression apparatus 50. Since the Cmark bit is "0", the deserializer 51 outputs a compressed symbol "J" by N-bit output. The deserializer 51 supplies the Cmark bit "0" and the compressed symbol "J" to the decompressor 52.

Since the Cmark bit is "0", the symbol conversion unit 521 outputs the compressed symbol "J" as an original symbol, performs pushing processing on a conversion table, and registers the symbol "J" in an index "0". At this time, the symbol "C" is expelled out and deleted from the conversion table. The entropy calculation unit 522 outputs "3" as an entropy calculation result, and the mask generation unit 523 supplies a data mask "00000111" to the deserializer 51.

FIG. 33C illustrates processing in a case where serial data "1110" is input to the decompression apparatus 50. The deserializer 51 determines that a Cmark bit is "1" with reference to the first "1" of the serial data "1110". In this case, 3 bits are read in accordance with a data mask "00000111" from the decompressor 52, and a bit value "110" is output as a compressed symbol. Thereby, the Cmark bit "1" and the compressed symbol "110" are input to the decompressor 52.

Since the Cmark bit is "1", the symbol conversion unit 521 reads the symbol "A" (FIG. 33B) registered in an index indicated by the compressed symbol "110", that is, the index "6" and outputs the symbol as an original symbol. In addition, the symbol conversion unit 521 moves the symbol "A" to an index "0" and moves the symbols "J" to "B" to the next entry. The entropy calculation unit 522 outputs "3" as an entropy calculation result, and the mask generation unit 523 generates a data mask "00000111" and supplies the generated data mask to the deserializer 51.

FIG. 34 illustrates processing in a case where serial data "1110" is input to the decompression apparatus 50. The deserializer 51 determines that a Cmark bit is "1" with reference to the first "1" of the serial data "1110". In this case, 3 bits are read in accordance with a data mask "00000111" from the decompressor 52, and a bit value "110" is output as a compressed symbol. Thereby, the Cmark bit "1" and the compressed symbol "110" are input to the decompressor 52.

Since the Cmark bit is "1", the symbol conversion unit 521 reads the symbol "B" (FIG. 33C) registered in an index indicated by the compressed symbol "110", that is, the index "6" and outputs the symbol as an original symbol. In addition, the symbol conversion unit 521 moves the symbol "A" to an index "0" and moves the symbols "A" to "G" to the next entry. The entropy calculation unit 522 outputs "3" as an entropy calculation result, and the mask generation unit 523 generates a data mask "00000111" and supplies the generated data mask to the deserializer 51.

According to the above-described decompression method, the conversion table included in the compressor 11 is reproduced in the decompressor 52, and original symbols can be decompressed (restored) using the conversion table. At this time, the length of a compressed symbol can be made variable depending on the usage conditions of the conversion table. Thus, a compression rate can be increased in accordance with the usage conditions of the table (a plurality of entries). In addition, the amount of data flowing through a transmission path between the compression apparatus 10 and the decompression apparatus 50 can be reduced.

Second Embodiment

Next, a compression apparatus and a decompression apparatus according to a second embodiment will be described. Since the second embodiment has the same configuration as that of the first embodiment, description of the same configuration will be omitted, and differences therebetween will be mainly described.

In the first embodiment, when the number of types of original symbols increases, the conversion table becomes full. In the case of a full conversion table, a data mask is M bits. Even when an original symbol is hit from the conversion table, a compressed symbol is M bits, and thus it is not possible to locally perform entropy control. For this reason, in the second embodiment, a reduction in entropy (referred to as entropy culling) is achieved by clearing a symbol in a last entry (an index value is largest) among entries in use, depending on the number of hits of symbols or the number of mis-hits.

FIG. 35 illustrates an example of entropy culling according to the second embodiment. As illustrated on the upper left side in FIG. 35, a case where symbols "A" to "E" are registered in indexes "0" to "4" in a conversion table of the compression apparatus is assumed. At this time, when the symbol "D" (8 bits) is input as an original symbol, the index "3" (a bit value: 011) is hit. At this time, an entropy calculation result obtained by a first calculation method is 3, and a data mask based on this is "00000111". Thus, an output from the compression apparatus, that is, serial data of a Cmark bit and a compressed symbol is "1011".

On the basis of the hit symbol "D", the symbol "D" is moved to the index "0", and the symbols "A", "B", and "C" are moved to the next entry in accordance with a first operation method (see a conversion table on the upper right side in the drawing).

Thereafter, it is assumed that the symbol "C" has been input as an original symbol. Also in this case, the index "3" is hit. Since there is no change in an entropy value and a data mask, serial data "1011" is output.

On the basis of the hit symbol "C", the symbol "C" is moved to the index "0", and the symbols "D", "A", and "B" are moved to the next entry in accordance with the first operation method (see a conversion table on the lower left side in the drawing). In addition, the symbol "E" in an entry having the largest index value among entries in use is deleted (cleared) using two hits as a trigger.

Thereafter, when the symbol "B" is input as an original symbol, the index "4" is hit. Here, an entropy calculation result is 2 by deleting the symbol "E", and a data mask is "00000011". Thus, serial data "111" constituted by a Cmark bit "1" and a compressed symbol "11" is output from the compression apparatus.

Thereafter, based on the hit symbol "B", the symbol "B" is moved to the index "0", and the symbols "C", "D", and "A" are moved to the next entry in accordance with the first operation method (see a conversion table on the lower right side in the drawing). Thereafter, when the symbol "C" is input as an original symbol, the index "1" is hit. An entropy calculation result at this point in time is 2, and a data mask is "00000011". Thus, serial data "101" constituted by a Cmark bit "1" and a compressed symbol "01" is output from the compression apparatus.

Similarly, in the decompression apparatus, a symbol in an entry having the largest index value among entries in use is cleared using two hits as a trigger. Thereby, the conversion table in the decompression apparatus also transitions as illustrated in FIG. 35. Except for the above description, configurations of the compression apparatus and the decompression apparatus are the same as those in the first embodiment.

Note that it is possible to define a rule in which symbols registered in entries (positioned in a predetermined range) between the head and a predetermined position are not deleted by culling. Thereby, it is possible to prevent the registered symbols from being excessively deleted by culling. For example, in the conversion table illustrated in FIG. 35, it is possible to adopt a configuration in which the symbols registered in the entries of the indexes "0" and "1" are not cleared even when conditions of culling are satisfied. The predetermined position can be set as appropriate.

Further, in the above-described example, culling is performed by a second hit, but culling may be executed using a predetermined number of mis-hits as a trigger. A mis-hit or a hit may be sandwiched between hits or mis-hits that are counted (the number of hits or mis-hits does not need to be continuous).

According to the second embodiment, it is possible to locally perform entropy control by entropy culling and to reduce the size of a compressed symbol.

Third Embodiment

Next, a compression apparatus and a decompression apparatus according to a third embodiment will be described. Since the third embodiment has the same configuration as that in the first embodiment, description of the same configuration will be omitted, and differences therebetween will be mainly described.

As represented as Problem 2 of the reference example, the end of a compressed symbol sequence cannot be recognized on a decompression side in the reference example. Consequently, entries from the head of a conversion table to a predetermined position is reserved with an exception symbol. The exception symbol is a symbol to which a predetermined command has been assigned, and a command related to control is recognized on a decompression side, the command being indicated by an exception symbol. An exception symbol registered in a reserved entry is not subjected to overwriting registration or deletion. On a compression side, an exception symbol may be output by bypassing conversion processing using a conversion table. Further, in an output from the compression apparatus, an exception symbol can be followed by arguments associated with a command with a Cmark bit "0" and an N-bit width. It is assumed that the number of arguments on the decompression side (decompression apparatus) is ascertained.

<Command Transmission>

Figure 37A:
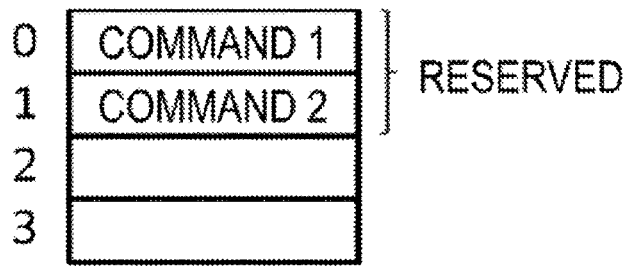
FIGS. 37A to 37C are diagrams illustrating exception symbols.
Figure 37B:
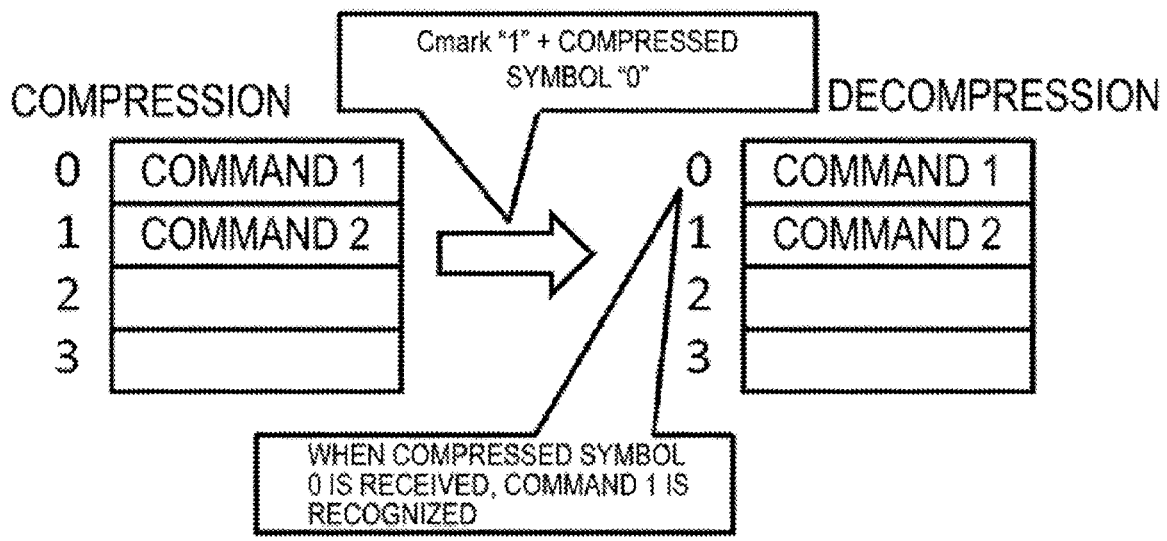
Figure 37C:
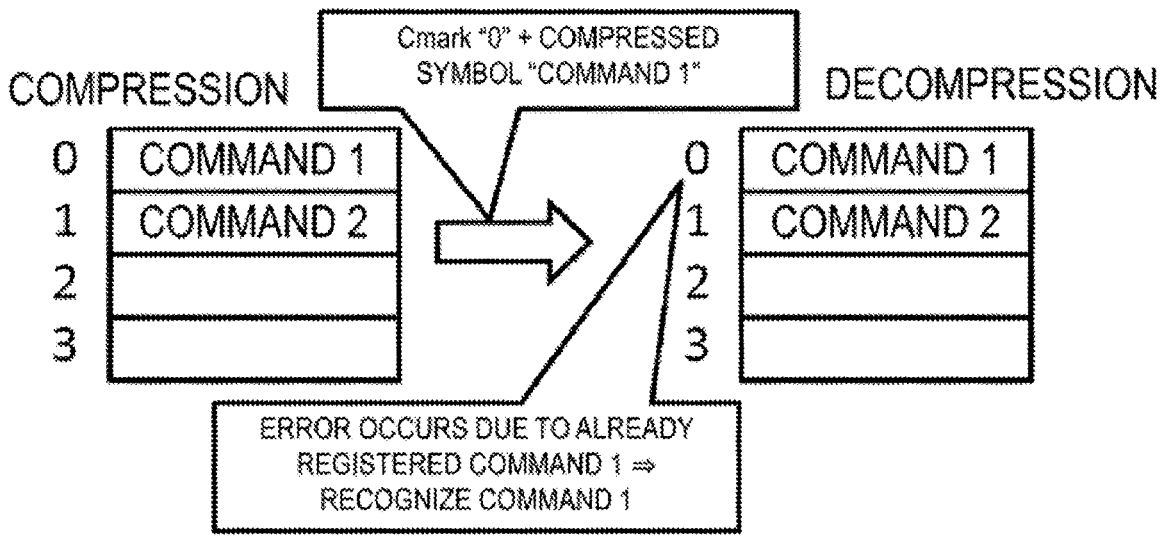

FIGS. 37A to 37C are diagrams illustrating exception symbols. FIG. 37A illustrates an example of a conversion table shared by the compression apparatus and the decompression apparatus. The conversion table has a predetermined number (four as an example) of entries (indexes "0" to "3"), the index "0" is reserved for registration of an exception symbol indicating a command 1, and the index "1" is reserved for registration of an exception symbol indicating a command 2.

FIG. 37B illustrates an example of a transmission method (first transmission method) for the command 1. In a case where the command 1 is transmitted from a compression side to a decompression side, the compression apparatus transmits a Cmark bit "1" and an index "0" as a compressed symbol to the decompression side. The decompression apparatus reads the exception symbol of the command 1 from the index "0" in accordance with the Cmark bit "1" and recognizes the command 1 to perform processing corresponding to the command 1. However, in a case where the first transmission method is used, it is required to ensure that a bit sequence (symbol) used for the command does not appear as an original symbol. Alternatively, an entry in which the command is registered needs to be reserved so as not to be used for registration of an original entry.

FIG. 37C illustrates another transmission method (second transmission method) for the command 1. In a case where the compression apparatus transmits the command 1 to the decompression apparatus, the compression apparatus transits a Cmark bit "0" and an exception symbol of the command 1 as a compressed symbol to the decompression apparatus. In the decompression apparatus, the exception symbol of the command 1 is attempted to be registered in the conversion table in accordance with the Cmark bit "0", but an error (exception) occurs because the exception symbol of the command 1 has already been registered (see FIG. 22, S38, S41). The decompression apparatus executes the command 1, which is an exception command, in exception processing for the exception.

Figure 38A:
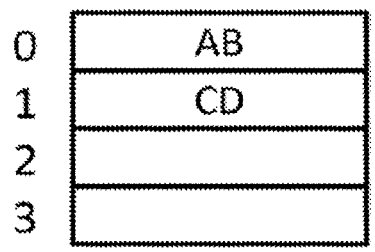
FIGS. 38A to 38C illustrate a method of transmitting a command from a compression apparatus to a decompression apparatus without reserving an entry.
Figure 38B:
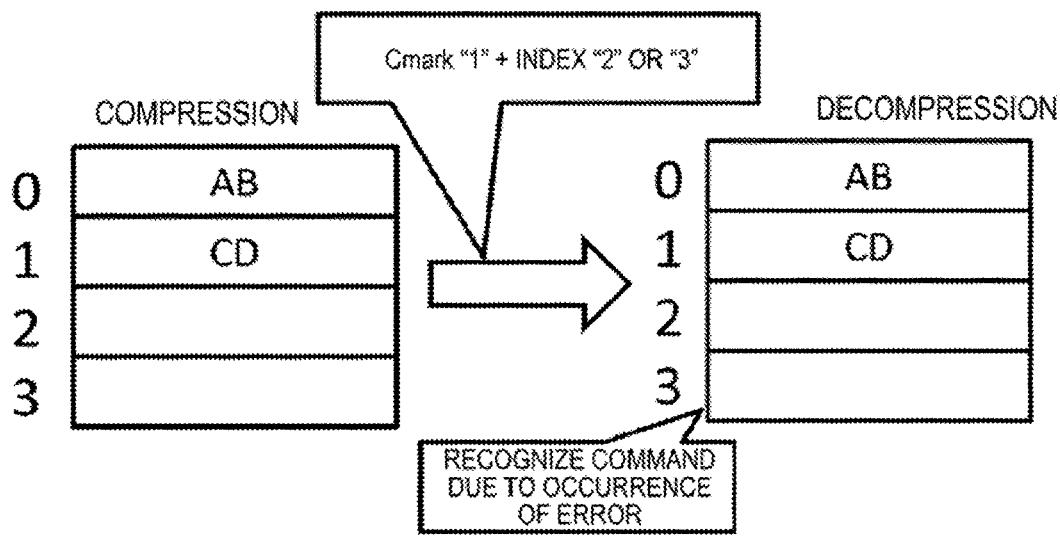
Figure 38C:
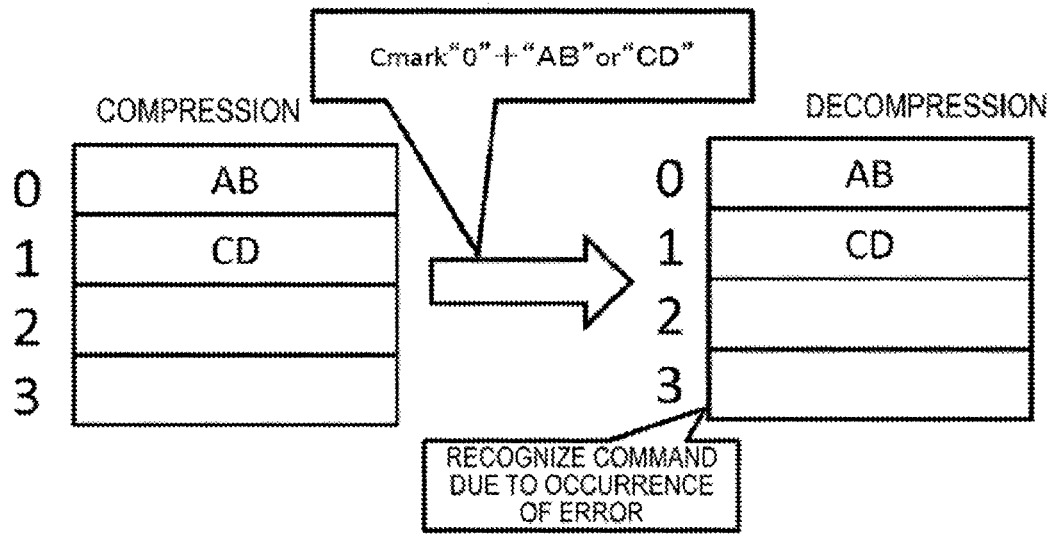

FIGS. 38A to 38C illustrate a method of transmitting a command from the compression apparatus to the decompression apparatus without reserving an entry. An example of a conversion table is illustrated in FIG. 38A. The conversion table has a predetermined number (four as an example) entries, and two symbols "AB" and "CD" are registered in indexes "0" and "1", respectively. The symbols "AB" and "CD" are normal original symbols rather than exception symbols. Note that the number of symbols is exemplary and may be one or three or more.

FIG. 38B illustrates a third transmission method for a command. In a situation where the compression apparatus and the decompression apparatus have the conversion table having the registration content illustrated in FIG. 38A, a Cmark bit "1" and an index "2" or "3" as a compressed symbol are transmitted, the index being an index in an empty entry. The decompression apparatus attempts to read a symbol from the index "2" or "3" in accordance with the Cmark bit "1", but reading cannot be performed due to the empty entry, which results in an error (see FIG. 22, S33, S42). The decompression apparatus treats the occurrence of the error as the occurrence of an exception (command execution). At this time, the index "2" can be interpreted as the command 1, and the index "3" can be interpreted as the command 2.

FIG. 38C illustrates a fourth transmission method for a command. In a situation where the compression apparatus and the decompression apparatus have the conversion table having the registration content illustrated in FIG. 38A, a Cmark bit "0" and a symbol "AB" or "CD" as a compressed symbol are transmitted. The decompression apparatus attempts to register the symbol "AB" or "CD" in accordance with the Cmark bit "0", but an error occurs because the symbols "AB" and "CD" have already been registered. The decompression apparatus treats the occurrence of the error as the occurrence of an exception (command execution). At this time, the symbol "AB" can be interpreted as the execution of the command 1, and the symbol "CD" can be interpreted as the execution of the command 2.

In executing the first to fourth transmission methods, the symbol conversion unit 111 may generate and transmit a combination of a Cmark bit corresponding to a command and a compressed symbol without performing normal processing related to a conversion table.

FIG. 39 is a table in which the first to fourth transmission methods are summarized. The first and second transmission methods described above belong to a type (type 1) in which entries for registering exception symbols as commands are reserved. On the other hand, the third and fourth transmission methods belong to a type (type 2) in which an entry for a command (exception symbol) is not reserved. Type 1 and Type 2 are classified as a type in which an index of an entry is transmitted to a decompression side (type 3) and a type in which an original symbol is transmitted to a decompression side (Type 4).

The first transmission method is a combination of Type 1 and Type 3. As described above, the compression apparatus transmits an index of a reserved entry and a Cmark bit "1" to the decompression apparatus. The decompression apparatus acquires a command registered in an entry designated by an index and executes the command. The first transmission method is referred to as a Reserve Entry, Transmit Index (RETI).

The second transmission method is a combination of Type 1 and Type 4. As described above, the compression apparatus transmits an original symbol (command) registered in a reserved entry and a Cmark bit "0" to the decompression apparatus. In the decompression apparatus, an error (exception) occur because the original symbol (command) has already been registered. The decompression apparatus executes the command as exception processing with respect to the exception. The second transmission method is referred to as a Reserve Entry, Transmit Original (RETO).

The third transmission method is a combination of Type 2 and Type 3. As described above, the compression apparatus transmits an index of an unused entry and a Cmark bit "1" to the decompression apparatus. In the decompression apparatus, an error (exception) occurs because the entry indicated by the index is unused. The decompression apparatus executes a predetermined command as exception processing with respect to the exception. The third transmission method is referred to as a Free Entry, Transmit Index (FETI).

The fourth transmission method is a combination of Type 2 and Type 4. As described above, the compression apparatus transmits an original symbol (command) registered in a reserved entry and a Cmark bit "0" to the decompression apparatus. In the decompression apparatus, an error (exception) occurs because the original symbol has already been registered. The decompression apparatus executes a predetermined command as exception processing with respect to the exception. The fourth transmission method is referred to as Free Entry, Transmit Original (FETO). In the third and fourth transmission methods, a command transmitted from the compression apparatus may be used, and the decompression apparatus may acquire and execute a command that has been locally held at the time of the occurrence of an exception. A process of acquiring a command does not matter.

An advantage of Type 1 is that all entries do not need to be retrieved. On the other hand, a disadvantage of Type 1 is that an entry that cannot be used for compression is generated or an entry for command registration is defined in advance. An advantage of Type 2 is that all entries need to be retrieved, while all entries can be used for compression. A disadvantage of Type 2 is that it is necessary to separately use the third transmission method (FETI) and the fourth transmission method (FETO) in a case where a conversion table is full and in a case where there is an empty entry. Specifically, FETO is executed in a case where the conversion table is full. In a case where there is an empty entry in the conversion table, FETI is executed. In the other cases, FETO is executed.

FIG. 40 is a timing chart illustrating an example of command transmission. When an exception is input during compression processing of the compression apparatus 10 for an original symbol sequence, the compression processing performed on the original symbol is stopped, and predetermined exception processing is executed. As the exception processing, the decompression apparatus 50 performs processing for inserting data for command execution between compressed symbol sequences. The data for command execution includes, for example, exception symbols that generate exceptions (the indexes and the symbols illustrated in FIGS. 37B and 37C and FIGS. 38B and 38C) and commands executed by the decompression apparatus 50. Further, the data for command execution can include one or two or more arguments related to command execution. In FIG. 40, two arguments are inserted after a command. When exception processing is completed, compression processing for an original symbol is restarted.

In the decompression apparatus 50, when an exception symbol is detected during decompression processing for a compressed symbol, an exception occurs, and a command is executed by interruption as exception processing. During the execution of the command, decompression processing for the compressed symbol is stopped, and no exception symbols, commands, and arguments are output as results of decompression.

Operational Example

<<Processing in Compression Apparatus>>

FIGS. 41A to 41C, FIGS. 42A to 42C, FIGS. 43A to 43C, FIGS. 44A to 44C, FIGS. 45A to 45C, and FIGS. 46A and 46B are diagrams illustrating an operational example (compression methods) of the compression apparatus 10 in the third embodiment. In the present operational example, a 8-bit original symbol is handled. A table size of a conversion table is 8 entries (indexes "0" to "7") (see FIG. 41A). Correspondence using FETI (the third transmission method) or FETO (the fourth transmission method) is performed on an exception symbol.

In the present operational example, a Reset Table (RES) command and an End of Stream (EOS) command are used as commands based on an exception symbol. The RES command is a command for resetting registration contents of a conversion table. The RES command is referred to as "RET". The RES command is represented by a symbol "E". The EOS command is a command indicating a terminal end of a compressed symbol sequence and is referred to as "EOS". The EOS command is represented by a symbol "F". In the following description, an example in which the symbol conversion units 111 and 521 execute a command will be described, but a command may be executed by a unit other than the symbol conversion units 111 and 521. For example, a command execution unit that executes a command may be provided.

A case where "ABAC(RET)BACAGFHJK(EOS)" is input to the compression apparatus 10 as an original symbol sequence is assumed. FIG. 41B illustrates processing for a first symbol "A" in an original symbol sequence, and FIG. 41C illustrates processing for a symbol "B" subsequent to the symbol "A". The processing for the symbols "A" and "B" is the same as that in the first embodiment, and thus the description thereof will be omitted.

FIG. 42A illustrates processing for a symbol "A" subsequent to the symbol "B", and FIG. 42B illustrates processing for a symbol "C" subsequent to the symbol "A". The processing for the symbols "A" and "C" is the same as that in the first embodiment, and thus the description thereof will be omitted.

FIG. 42C illustrates processing in a case where an exception command "RET" is input. When the "RET" is input, the symbol conversion unit 111 of the compressor 11 of the compression apparatus 10 performs correspondence based on FETO (fourth transmission method). In the present operational example, the symbol "C" registered in an index "0" is output as a compressed symbol, using the index "0" as an example of a registered entry. The symbol conversion unit 111 sets the value of a Cmark bit for the symbol "C" to "0". Thereby, a conflict related to the symbol "C" occurs in the decompression apparatus 50, which is a trigger of the occurrence of an exception. Next, the symbol conversion unit 111 outputs a command symbol "E"—an RES command. Note that an entry used for FETO may be anything other than the index "0" when the entry has already been registered.

FIG. 43A illustrates a case where an exception (RES command) has been executed in accordance with "RET". The compressor 11 (symbol conversion unit 111) resets a conversion table (clears all registered symbols) by executing the RES command, and initializes the conversion table. It is possible to reset the history of an entropy for different data streams in response to the RES command.

FIG. 43B illustrates processing for original symbol "B", and FIG. 43C illustrates processing for an original symbol "A" subsequent to the symbol "B". These pieces of processing are the same as those in the first embodiment, and thus the descriptions thereof will be omitted.

FIG. 44A illustrates processing for an original symbol "C", FIG. 44B illustrates processing for an original symbol "A" subsequent to the symbol "C", and FIG. 44C illustrates processing for an original symbol "G" subsequent to the symbol "A". These pieces of processing are the same as those in the first embodiment, and thus the descriptions thereof will be omitted.

FIG. 45A illustrates processing for an original symbol "F", FIG. 45B illustrates processing for an original symbol "H" subsequent to the symbol "F", and FIG. 45C illustrates processing for an original symbol "J" subsequent to the symbol "H". These pieces of processing are the same as those in the first embodiment, and thus the descriptions thereof will be omitted.

FIG. 46A illustrates processing for an Currently Amended symbol "K" subsequent to the symbol "J". These pieces of processing are the same as those in the first embodiment, and thus the descriptions thereof will be omitted. FIG. 46B illustrates processing in a case where an exception command "EOS" is input. When the "EOS" is entered, the symbol conversion unit 111 of the compressor 11 of the compression apparatus 10 outputs the symbol "K" registered in an index "0" as a compressed symbol in response to FETO (fourth transmission method). The symbol conversion unit 111 sets the value of a Cmark bit for the symbol "K" to "0". Thereby, a conflict related to the symbol "K" occurs in the decompression apparatus 50, which is a trigger of the occurrence of an exception. Next, the symbol conversion unit 111 outputs a command symbol "F" that indicates an EOS command. Thereafter, the compression apparatus 10 recognizes a terminal end of an Currently Amended symbol sequence in response to the exception command "EOS" and performs predetermined processing (may terminate compression processing).

<<Processing in Decompression Apparatus>>

Figure 47A:
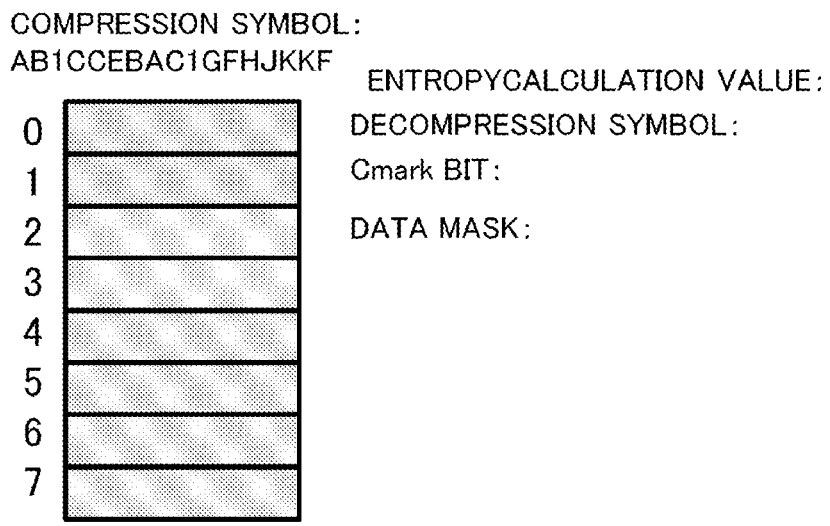
FIGS. 47A to 47C are diagrams illustrating an operational example of a decompression apparatus in the third embodiment.

FIGS. 47A to 47C, FIGS. 48A to 48C, FIGS. 49A to 49C, FIGS. 50A to 50C, FIGS. 51A to 51C, and FIGS. 52A and 52B are diagrams illustrating an operational example (decompression method) of the decompression apparatus 50 in the third embodiment. FIG. 47A illustrates a conversion table included in the decompressor 52 of the decompression apparatus 50, and the conversion table has the same structure as the conversion table included in the compression apparatus 10. In the present operational example, a case where "AB1CCEBAC1GFHJKKF" is input to the decompression apparatus 50 as a compressed symbol will be described. However, each symbol is preceded by a Cmark bit and constitutes serial data in combination with Cmark bit. This point is the same as in the first embodiment.

Figure 47B:
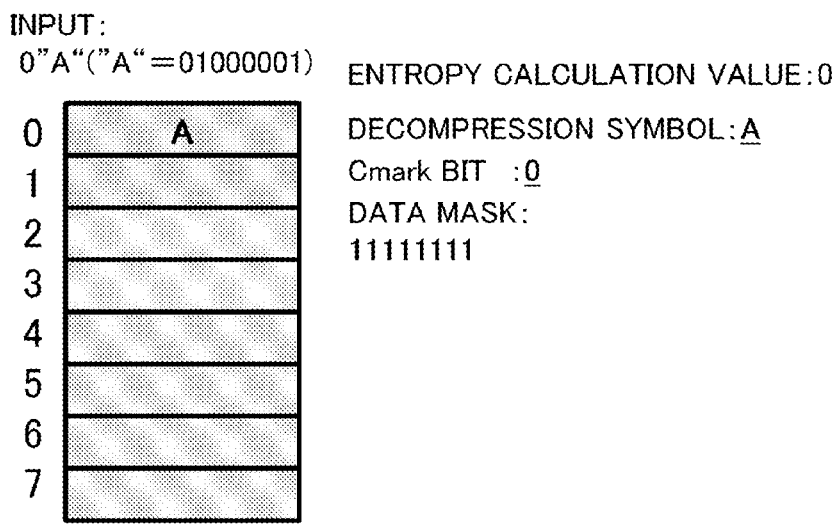

FIG. 47B illustrates processing for serial data "0A". Also in the third embodiment, the deserializer 51 separates the serial data "0A" into a Cmark bit "0" and a compressed symbol "A" and inputs the separated serial data to the decompressor 52. The decompressor 52 outputs the compressed symbol "A" as an original symbol in accordance with the Cmark bit "0". This is the same processing as that in the first embodiment.

However, in the third embodiment, in a case where the symbol conversion unit 521 registers symbols in a conversion table, the symbol conversion unit 521 confirms that symbols to be registered have not been registered in all entries and then performs the registration of the symbols. Here, the symbol conversion unit 521 confirms that the symbol "A" has not been registered, and then registers the symbol "A".

Figure 47C:
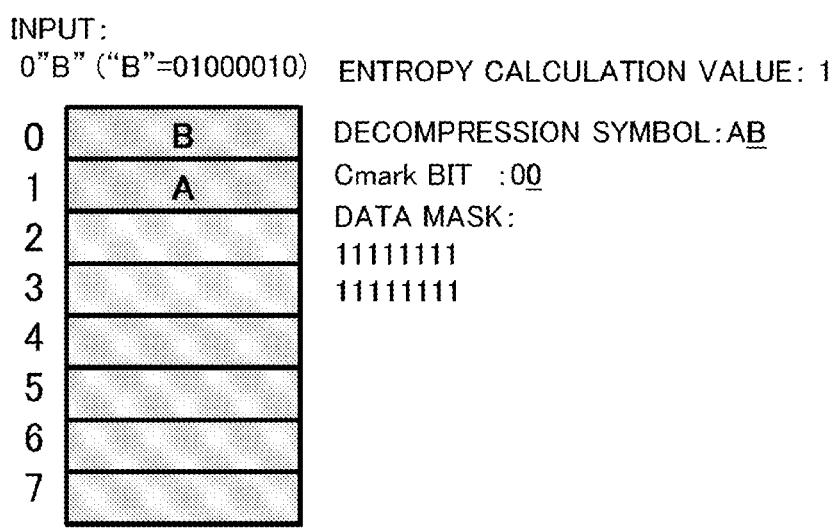
Figure 48A:
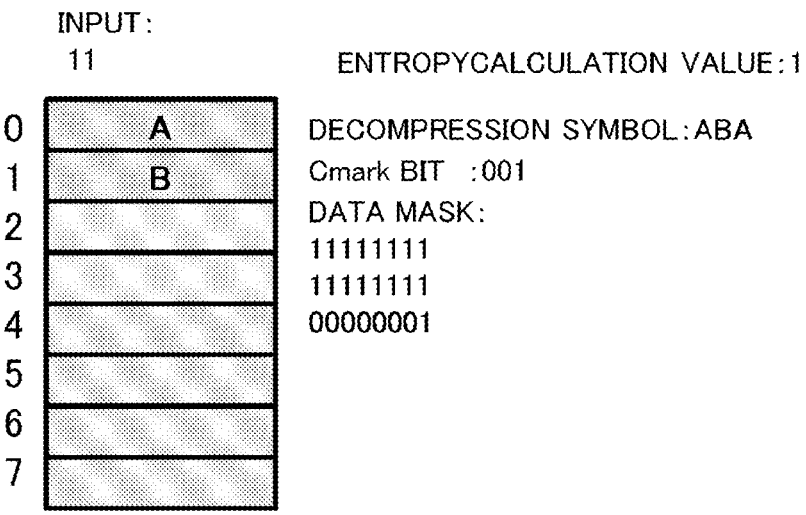
FIGS. 48A to 48C are diagrams illustrating an operational example of the decompression apparatus in the third embodiment.
Figure 48B:
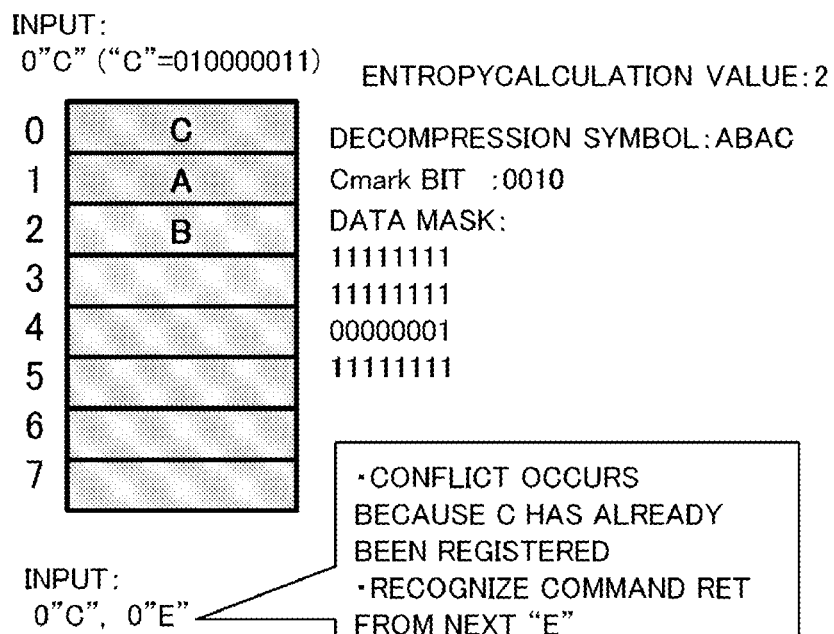

FIG. 47C illustrates processing for serial data "0B" subsequent to serial data "0A". FIG. 48A illustrates processing for serial data "11" subsequent to the serial data "0B". FIG. 48B illustrates processing for serial data "00" subsequent to the serial data "11". These pieces of processing are the same as those in the first embodiment, and thus the descriptions thereof will be omitted.

Figure 48C:
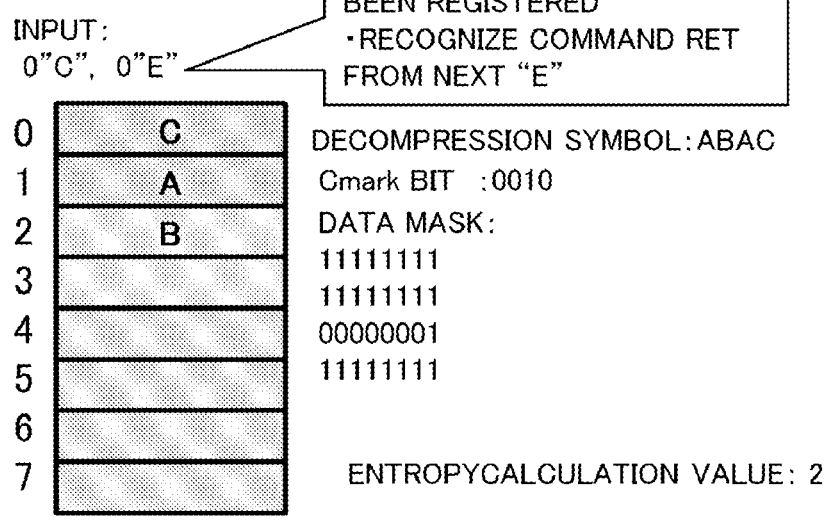

FIG. 48C illustrates processing for serial data "00". The symbol conversion unit 521 attempts to register a symbol "C" in a conversion table in accordance with a Cmark bit "0". However, the symbol "C" has already been registered in the conversion table. For this reason, a conflict (error) occurs. Then, the symbol conversion unit 521 executes a command "RET" when the value of a symbol is a symbol "E" with reference to a compressed symbol to be input next, and clears all entries in the conversion table. Thereby, table resetting is performed (see FIG. 49A). Since the symbol "C" is a symbol for conflict occurrence, and the symbol "E" is a command symbol, the symbol conversion unit 521 does not output corresponding original symbols (decompressed symbols).

Figure 49A:
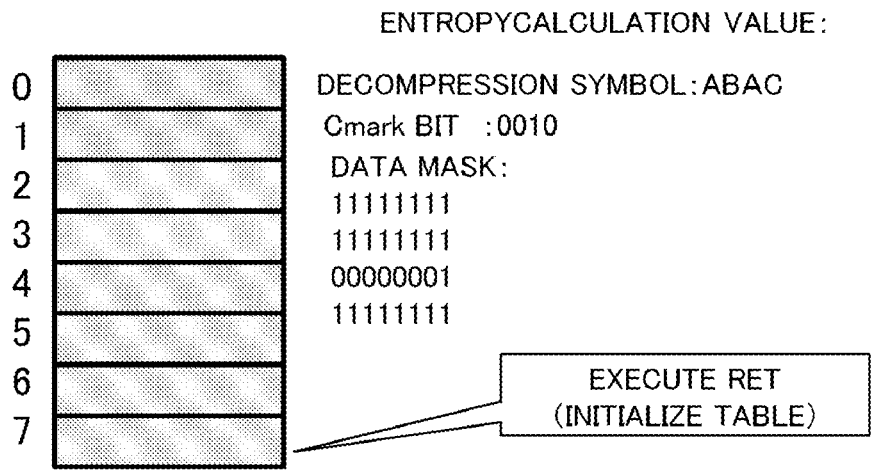
FIGS. 49A to 49C are diagrams illustrating an operational example of the decompression apparatus in the third embodiment.
Figure 49B:
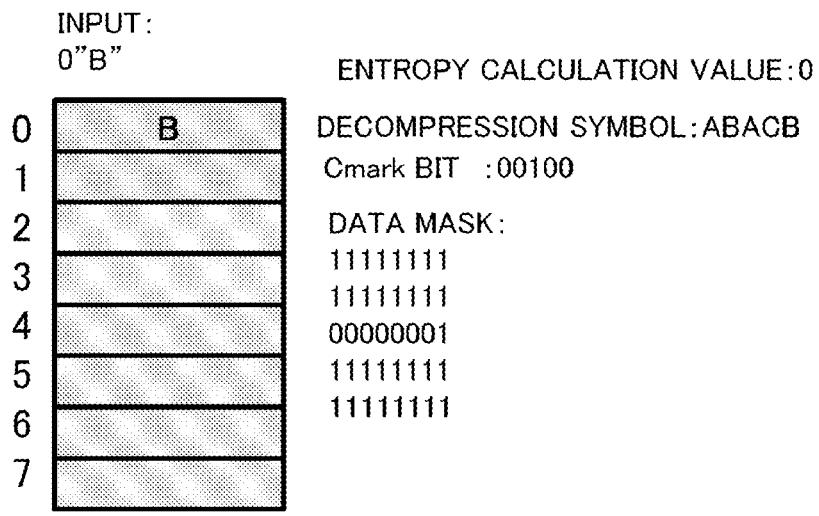
Figure 49C:
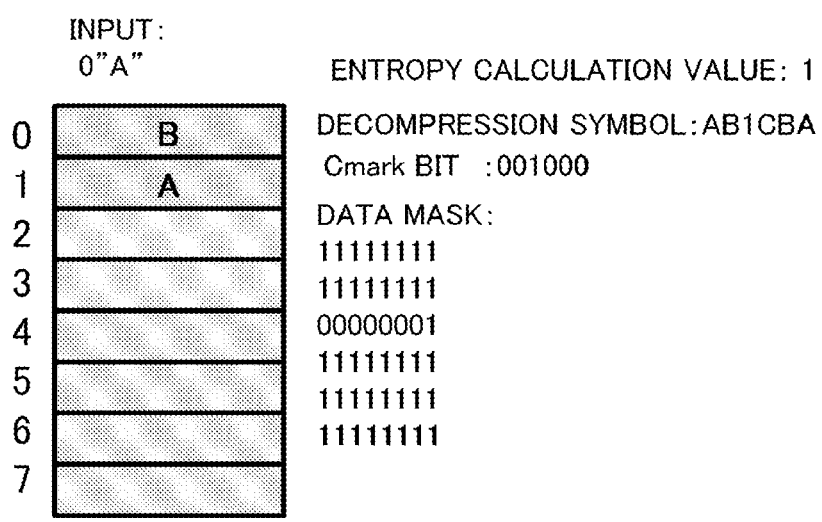

FIG. 49B illustrates processing for serial data "0B" which is input after table resetting. FIG. 49C illustrates processing for serial data "0A" subsequent to the serial data "0B". FIG. 50A illustrates processing for serial data "00" subsequent to the serial data "0A". FIG. 50B illustrates processing for serial data "11" subsequent to the serial data "00". FIG. 50C illustrates processing for serial data "0G" subsequent to the serial data "11". These pieces of processing are the same as those in the first embodiment, and thus the descriptions thereof will be omitted.

FIG. 51A illustrates processing for serial data "0F" subsequent to the serial data "0G". FIG. 51B illustrates processing for serial data "0H" subsequent to the serial data "0F". FIG. 51C illustrates processing for serial data "0J" subsequent to the serial data "0H". FIG. 52A illustrates processing for serial data "0K" subsequent to the serial data "0J". These pieces of processing are the same as those in the first embodiment, and thus the descriptions thereof will be omitted.

FIG. 52B illustrates processing for serial data "OK" which is input after serial data "0K". The symbol conversion unit 521 attempts to register a symbol "K" in a conversion table in accordance with a Cmark bit "0". However, the symbol "K" has already been registered in the conversion table, a conflict occurs. Then, the symbol conversion unit 521 refers to the next compressed symbol. When the next symbol is "F", the symbol conversion unit executes a command "EOS" and recognizes (detects) a terminal end of an original symbol sequence. Thereby, predetermined processing (the termination of decompression processing, or the like) is performed.

According to the third embodiment, a command can be transmitted from the compression apparatus 10 to the decompression apparatus 50 to perform table resetting, the recognition of position of a terminal end of an original symbol sequence, and the like. The content of the command is exemplary, and a command other than RET and EOS can also be transmitted.

Fourth Embodiment

Next, a compression apparatus and a decompression apparatus according to a fourth embodiment will be described. Since the fourth embodiment has the same configurations as those in the first and third embodiments, the description of the same configuration will be omitted, and differences therebetween will be mainly described.

Figure 53A:
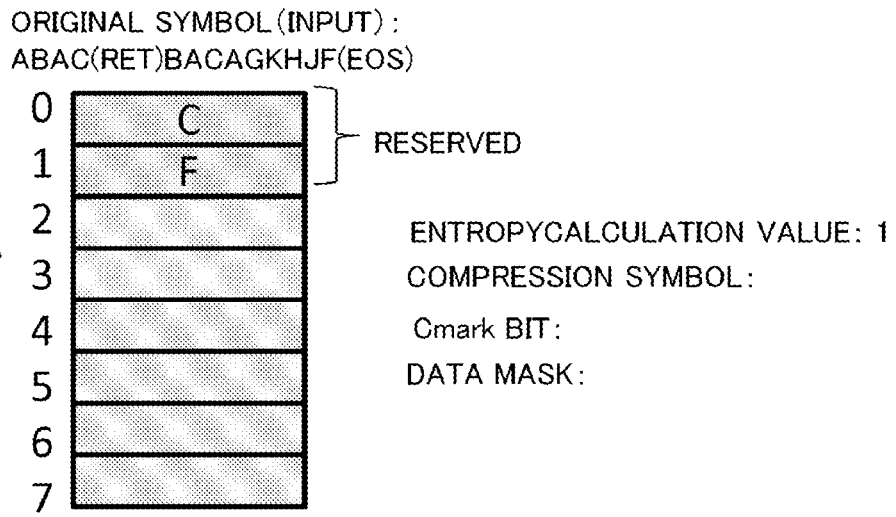
FIGS. 53A to 53C illustrate an operational example of a compression apparatus in a fourth embodiment.

In the fourth embodiment, a mode in which an entry for registering a command symbol is reserved in a conversion table, which has been described in the third embodiment, will be described. FIGS. 53A to 53C, FIGS. 54A to 54C, FIGS. 55A to 55C, FIGS. 56A to 56C, FIGS. 57A to 57C, and FIG. 58 illustrate an operational example (compression method) of a compression apparatus 10 in the fourth embodiment. As illustrated in FIG. 53A, in the fourth embodiment, indexes "0" and "1" are reserved in respective conversion tables of the compression apparatus 10 and a decompression apparatus 50, and symbols "C" and "F" for a command are registered in advance. Entries in which an original symbol can be registered are indexes "2" to "7", with the index "2" being the head.

Since symbols have already been registered in the indexes "0" and "1", the initial value of an entropy calculation value in the fourth embodiment is "1". The other conditions are the same as those in the third embodiment, and sequences of original symbols and exception symbols (commands) are the same as those in the third embodiment.

Figure 53B:
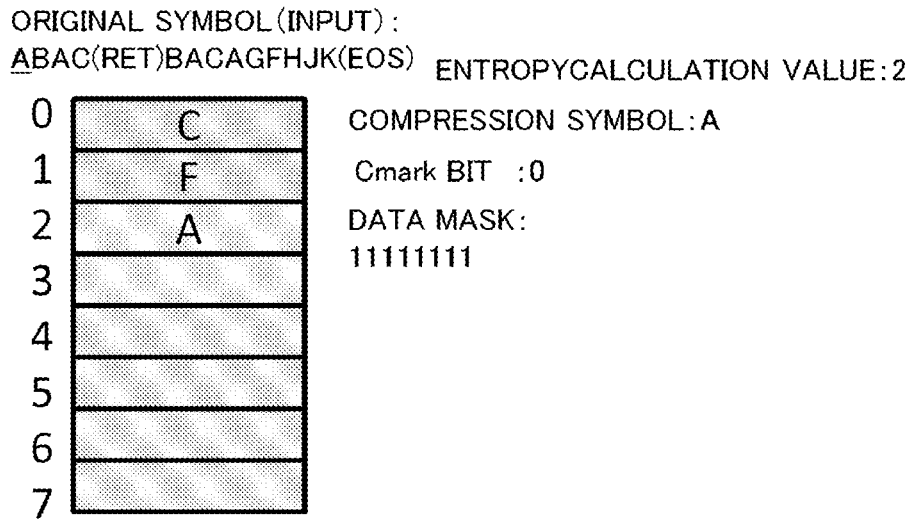
Figure 53C:
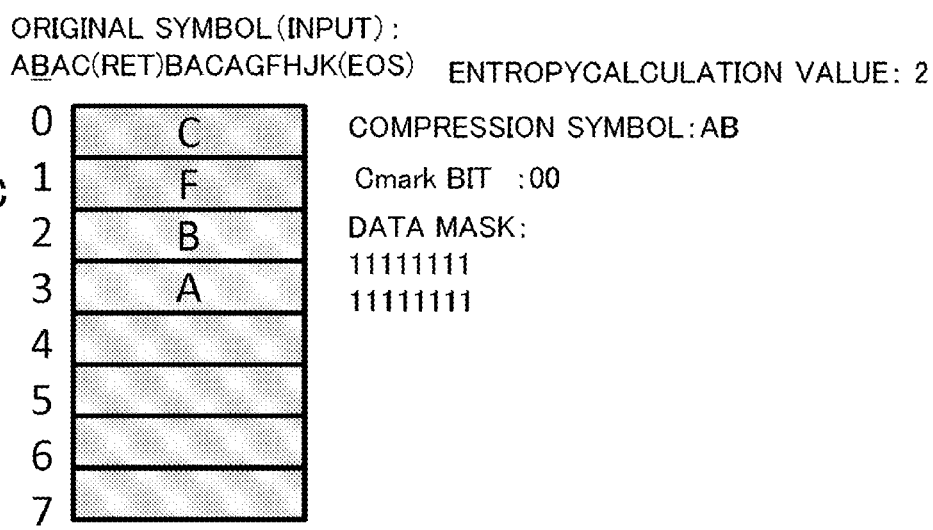

FIG. 53B illustrates processing for an original symbol "A". Since the symbol "A" is unregistered, a symbol conversion unit 111 registers the symbol "A" in the index "2" and outputs a Cmark bit "0" and the compressed symbol "A". An entropy calculation value is 2. A data mask has all "1". FIG. 53B illustrates processing for an original symbol "B". In this case, the symbol "B" is registered in the index "2", and the symbol "A" is moved to the next index "3". The Cmark bit "0" and the compressed symbol "B" are output. The entropy calculation value is 2, and the data mask has all 1s.

FIG. 54A illustrates processing for an original symbol "A". Since the symbol "A" is registered in an index "3" (FIG. 53C), a Cmark bit "1" and an index value "3" are output. An entropy calculation value at this time is 2, and a data mask is "00000011" indicating the number of valid bits 2.

FIG. 54B illustrates processing for an original symbol "C". Since the symbol C is registered in an index "0", a Cmark bit "1" and an index value "0" are output. In this manner, for the symbol "C" as an original symbol, the index "0" reserved for the registration of a command symbol "C" is used for the compression of the original symbol "C". An entropy calculation value in this case is 2, and a data mask is "00000011".

FIG. 54C illustrates processing when a command symbol "RET" is input. When the command symbol "RET" is input, the symbol conversion unit 111 outputs a command symbol "C" of RET registered in a predetermined index "0" as a compressed symbol, and outputs a Cmark bit "0" for causing a conflict in the decompression apparatus 50 by using RETO (fourth transmission method). For this reason, a data mask has all 1 s. The symbol conversion unit 111 clears symbols that have already been registered in entries after an index "2" in response to the command "RET".

FIG. 55A illustrates processing for an original symbol "B", FIG. 55B illustrates processing for an original symbol "A", and FIG. 55C illustrates processing for an original symbol "C". FIG. 56A illustrates processing for an original symbol "A", and FIG. 56B illustrates processing for an original symbol "G". These pieces of processing are performed in accordance with the first operation method similar to the third embodiment. A detailed description thereof will be omitted.

FIG. 56C illustrates processing for an original symbol "F". The symbol "F" is registered in an index "1" as a command symbol. This entry is used for compression of the original symbol "F", and the symbol conversion unit 111 outputs a Cmark bit "1" and an index value "1". An entropy calculation value at this time is 3, and a data mask "00000111" is output.

FIG. 57A illustrates processing for an original symbol "H", FIG. 57B illustrates processing for an original symbol "J", and FIG. 57C illustrates processing for an original symbol "K". These pieces of processing are performed in accordance with the first operation method, similar to the third embodiment. A detailed description thereof will be omitted.

Figure 58:
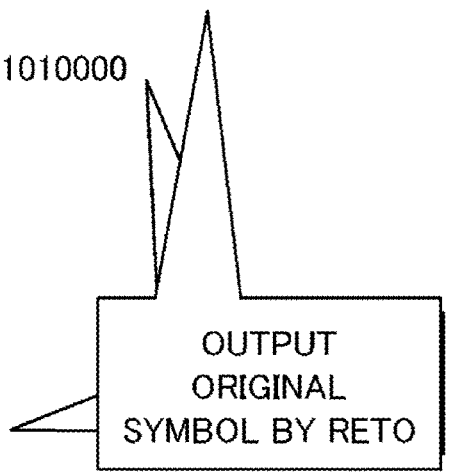
FIG. 58 illustrates an operational example of the compression apparatus in the fourth embodiment.

FIG. 58 illustrates processing when a command symbol "EOS" is input. When the command symbol "EOS" is input, the symbol conversion unit 111 outputs the EOS command symbol "F" registered in a predetermined index "1" as a compressed symbol and outputs a Cmark bit "0" for causing a conflict in the decompression apparatus 50 by using RETO (fourth transmission method). For this reason, the data mask has all 1s. A compressor 11 (compression apparatus 10) recognizes a terminal end of an original symbol sequence in response to the command "EOS" and performs predetermined processing.

Figure 59A:
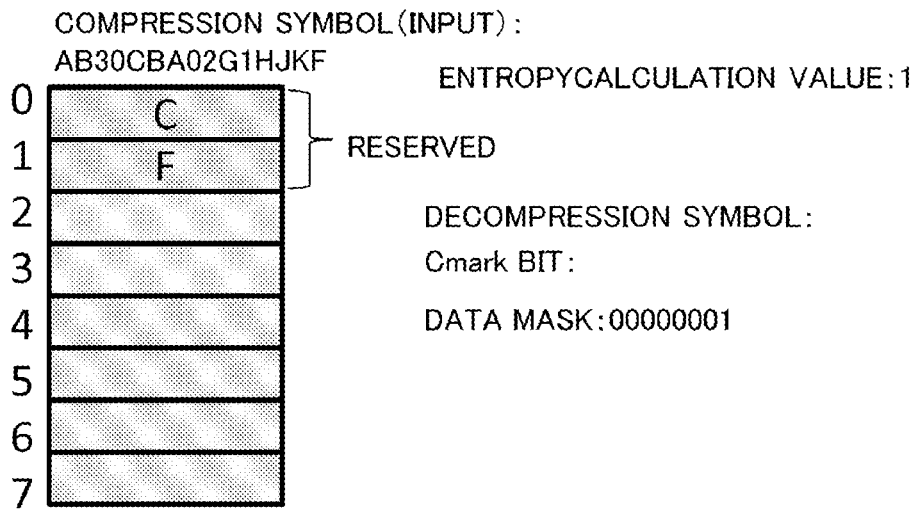
FIGS. 59A to 59C illustrate an operational example of a decompression apparatus in the fourth embodiment.

FIGS. 59A to 59C, FIGS. 60A to 60C, FIGS. 61A to 61C, FIGS. 62A to 62C, FIGS. 63A to 63C, and FIG. 64 illustrate an operational example (decompression method) of the decompression apparatus 50 in the fourth embodiment. As illustrated in FIG. 59A, indexes "0" and "1" of a conversion table included in a decompressor 52 are reserved in the same manner as those of the compression apparatus 10, and symbols "C" and "F" are registered (stored). For this reason, an initial value of an entropy calculation value is 1.

A serial data sequence output from the compression apparatus 10 is input to the decompression apparatus 50 as transmission data. The serial data sequence is a set of serial data in which a Cmark bit is added before each of compressed symbols "AB30CBA02G1HJKF". Hereinafter, processing in the decompression apparatus 50 will be described in comparison with the third embodiment.

Figure 59B:
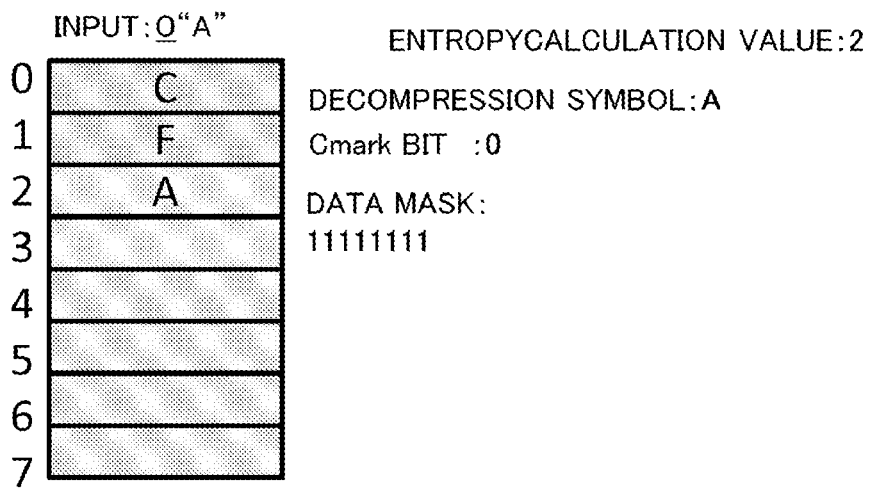

FIG. 59B illustrates processing for serial data "0A". In the decompression apparatus 50, a deserializer 51 separates the serial data "0A" into a Cmark bit "0" and a compressed symbol "A" and supplies the separated serial data to the decompressor 52. An operation of the deserializer 51 is the same as that in the third embodiment, and a symbol conversion unit 521 performs the same processing as that in the third embodiment in the decompressor 52 (FIG. 22). However, since indexes "0" and "1" are reserved, the same configuration as that in the third embodiment is adopted except that an entry for registering a compressed symbol starts from an index "2", and thereby a result of entropy calculation changes.

Figure 59C:
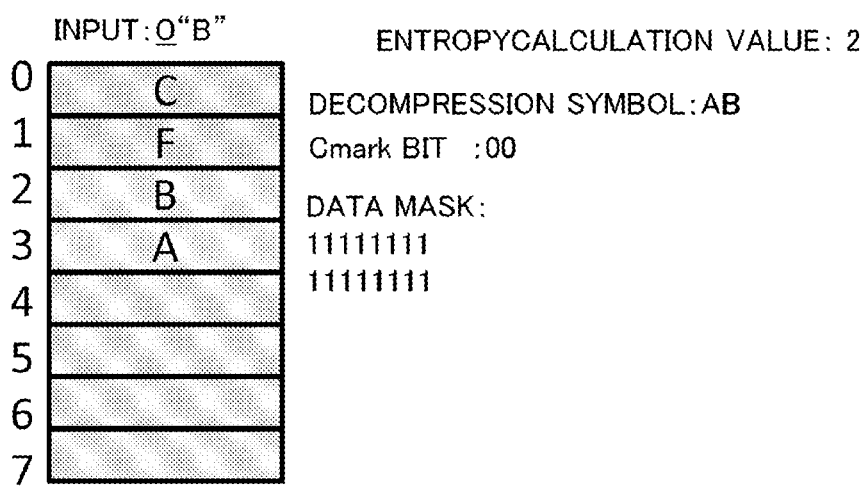

FIG. 59C illustrates processing for serial data "0B". FIG. 60A illustrates processing for serial data "111". FIG. 60B illustrates processing for serial data "100". In these respects, the same configuration as that in the third embodiment is adopted except that the above-described registration positions and entropy calculation values are different, and thus the description thereof will be omitted.

FIG. 60C illustrates processing for serial data "00". A Cmark bit "0" and a symbol "C" (a symbol of a command "RET") which is output as a compressed symbol by RETO in the compression apparatus 10 are input into the decompressor 52. When the symbol conversion unit 521 refers to a conversion table in accordance with the Cmark bit "0", the symbol "C" has already been registered, and thus an error occurs. A command "RET" to which the symbol "C" is assigned is executed with the error as a trigger, and a registration content of the conversion table is reset except for a reserved region.

FIGS. 61A to 61C illustrate processing for serial data "0B", "0A", "100". FIGS. 62A to 62C illustrate processing for serial data "110", "0G", "0F". FIGS. 63A to 63C illustrate processing for serial data "0H", "0J", "0K". These pieces of processing are substantially the same as those in the third embodiment, and thus the descriptions thereof will be omitted.

FIG. 64 illustrates processing for serial data "0F". A Cmark bit "0" and a compressed symbol "F" (a symbol of a command "EOS") which is output by the compression apparatus 10 by RETO are input to the decompressor 52. A symbol "F" is retrieved from a conversion table in accordance with the Cmark bit "0", and the symbol "F" has already been registered, which results in an error. The command "EOS" to which the symbol "F" is assigned is executed with the error as a trigger, and a terminal end of an original symbol sequence is recognized. Predetermined processing corresponding to the recognition of the terminal end may be executed.

According to the fourth embodiment, similarly to the third embodiment, the decompression apparatus 50 can be caused to execute a predetermined command.

Fifth Embodiment

Next, a compression apparatus and a decompression apparatus according to a fifth embodiment will be described. Since a configuration of the fifth embodiment has points in common with the first embodiment, differences therebetween will be mainly described, and the descriptions of common points will be omitted.

In the first embodiment, in a case where an entry in which a symbol to be retrieved has been registered is hit, the symbol in the hit entry is moved to an entry of an index "0", and a symbol registered in another entry is moved to the next entry by pushing (FIG. 16A). In the first embodiment, movement to an index "0" is performed independent of the position (index) of a hit entry. However, in a case where such processing is implemented by hardware (circuit), a circuit configuration becomes complicated, which may result in an increase in the size of the circuit and reduction in an operation frequency.

Consequently, in the fifth embodiment, when a table is updated (S16 in FIG. 15, S35 in FIG. 23), a symbol in a hit entry is moved to an entry that goes back by k indexes from an index i (i is an integer of 0 or greater) of the hit entry. Thereby, it is possible to achieve a reduction in the size of the circuit by reducing the number of symbols moved by pushing. However, in a case where i−k≤0, a symbol is moved to a leading entry in a region in which an original symbol is registered. The leading entry is an index "0" when there is no reserve, and in a case where there is a reserve, an index of the number of reserved entries+1 is a leading entry.

Figure 65A:
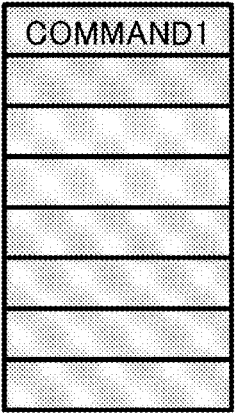
FIGS. 65A to 65C illustrate an operational example of a compression apparatus in a fifth embodiment.

FIGS. 65A to 65C, FIGS. 66A to 66C, and FIGS. 67A to 67C illustrate an operational example of the compression apparatus 10 according to the fifth embodiment. FIG. 65A illustrates a data structure of a conversion table included in the compression apparatus 10 and a decompression apparatus 50 according to the fifth embodiment. In the present operational example, similar to the first embodiment, a conversion table in which the size of an original symbol is 8 bits and the number of entries is 8 (indexes "0" to "7") is used. Furthermore, in the present operational example, the first operation method is used for the operation of a conversion table, and the first calculation method is used for the calculation of an entropy. An exception symbol is processed by RETI (third transmission method).

However, unlike the first embodiment, in a case where an entry is hit, a symbol in the hit entry is moved to an entry that goes back by k indexes from an index i (k=2). However, an appropriate number other than 2 can be set as the value of k. In addition, entropy culling described in the second embodiment is performed when an entry is hit twice (in the case of the number of hits (hit count=2)).

As illustrated in FIG. 65A, in the present operational example, an index "0" is reserved, and a command 1 is registered. The symbol of the command 1 (exception symbol) is a symbol other than an original symbol. In the present operational example, the command 1 is a command "EOS", but may be a command other than EOS. Since the index "0" is reserved, the head of an entry for registering an original symbol is an index "1".

Figure 65B:
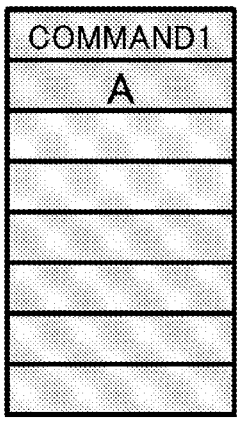
Figure 65C:
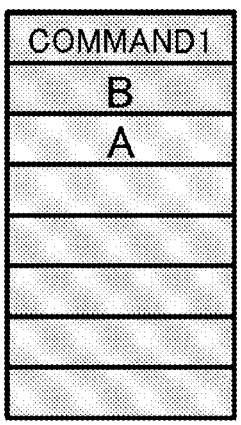

FIG. 65B illustrates processing for an Currently Amended symbol "A". FIG. 65C illustrates processing for an Currently Amended symbol "B". These operations are the same as those in the first embodiment except that the registration position of the symbol "A" is registered in an index "1", which is the head of the registration region of the Currently Amended symbol, and thus a detailed description will be omitted. A method of creating a data mask is also the same as that in the first embodiment.

FIG. 66A illustrates processing for an original symbol "A". In this case, an index "2" in which the symbol "A" is registered is hit. However, since i−k=2−2=0 (i−k≤0), the symbol "A" is moved to an index "1", which is the head of the registration region of the original symbol (see an arrow in FIG. 66A). Note that, in this case, a Cmark bit is "1", a compressed symbol is "2", and a data mask is "00000011". In addition, the value of the number of hits (hit count) is 1.

FIGS. 66B and 66C illustrate processing for original symbols "C" and "D". These pieces of processing are the same as the processing for the unregistered symbols in the first embodiment, and thus the description thereof will be omitted.

FIG. 67A illustrates processing for an original symbol "B". Since the symbol "B" is registered in an index "4", a Cmark bit "1" and an index value "4" are output from a compressor 11. At this time, the symbol "B" is moved to an index "2" that goes back by 2 indexes from the index "4" of the hit entry. At this time, the symbols "A" and "C" are pushed and moved to their next entries. Rewriting processing for these conversion tables is performed by, for example, the compressor 11 (symbol conversion unit 111), but may be performed by something other than the symbol conversion unit 111. An entropy calculation value in this case is 2, and a data mask is "00000011".

In addition, a hit count is 2. For this reason, the symbol "A" registered in the index "4", which is the last entry among entries having already been registered, is deleted by entropy culling. This processing can also be performed by something other than the compressor 11 (symbol conversion unit 111) or the symbol conversion unit 111. With the execution of culling, the value of the hit count is reset (is set to 0).

FIG. 67B illustrates processing for an original symbol "C". Since the symbol "C" is registered in an index "3", a Cmark bit "1" and an index value "3" are output from the compressor 11. At this time, the symbol "C" is moved to the index "1" that goes back by two indexes from the index "3" of the hit entry. At this time, symbols "D" and "B" are pushed and moved to their next entries. An entropy calculation value in this case is 2, a data mask is "00000011", and a hit count is 1.

FIG. 67C illustrates processing in a case where a command symbol "EOS" is input. In this case, RETI (first transmission method) is performed. That is, since a symbol indicating "EOS" (command 1) is registered in a reserved index "0", a Cmark bit "1" and an index "0" are output from the compressor 11. In a case where a command symbol is hit, the hit symbol is not moved. For this reason, whether to add this hit to a hit count which is a culling condition is optional and follows command specifications. FIG. 67C illustrates an example in which culling is executed in addition to the number of hits, and a symbol "B" at the end has been deleted. In this case, an entropy calculation value is 2, a data mask is "00000011", and a hit count is 0. When culling is not performed, the symbol "B" and a hit count value "1" are maintained.

Figure 68A:
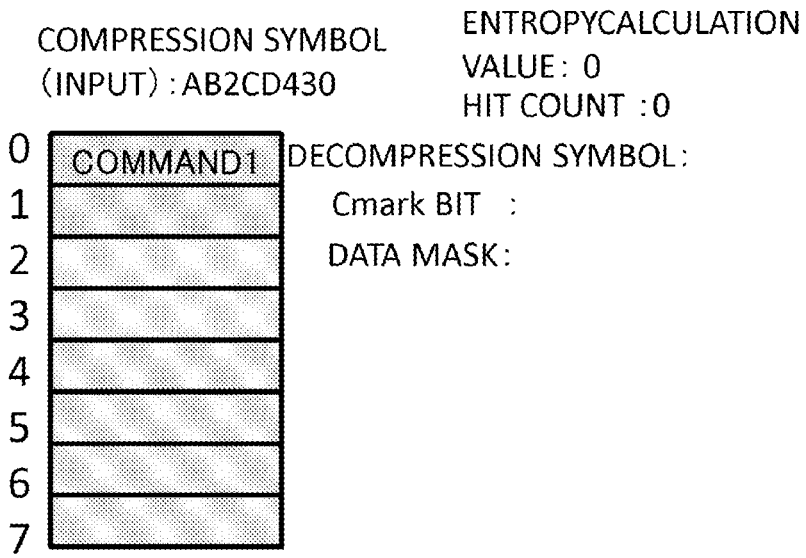
FIGS. 68A to 68C illustrate an operational example of a decompression apparatus in the fifth embodiment.

FIGS. 68A to 68C, FIGS. 69A to 69C, and FIGS. 70A to 70C illustrate an operational example of the decompression apparatus 50 in the fifth embodiment. FIG. 68A illustrates a conversion table included in a decompressor 52. A data structure of the conversion table is the same as the data structure of the conversion table included in the compressor 11. In the decompression apparatus 50, a serial data sequence to which a Cmark bit has been added is input to each symbol in a compressed symbol sequence "AB2CD430" obtained by the conversion of an original symbol sequence.

Figure 68B:
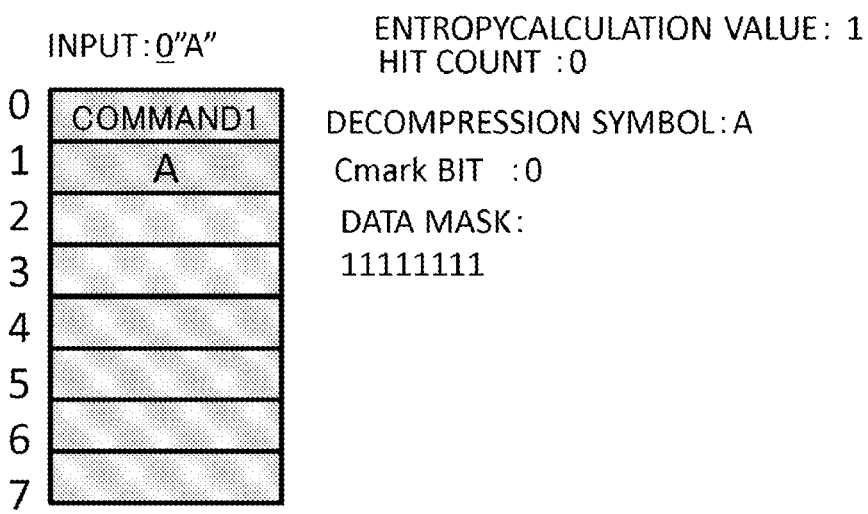
Figure 68C:
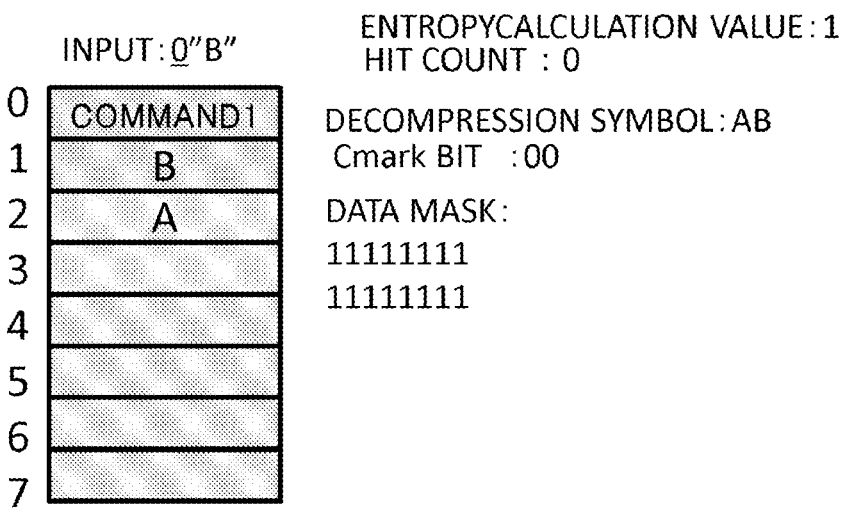

FIGS. 68B and 68C illustrate processing for serial data "0A" and "0B". In the decompression apparatus 50, a deserializer 51 separates the serial data into a Cmark bit "0" and a compressed symbol "A" and supplies the separated serial data to the decompressor 52. The operation of the deserializer 51 is the same as that in the third embodiment, and the symbol conversion unit 521 performs the same processing as that in the third embodiment in the decompressor 52 (FIG. 22). However, since an index "0" is reserved, the same configuration as that in the third embodiment is adopted except that an entry for registering a compressed symbol starts from an index "1", and thereby a result of entropy calculation changes.

FIG. 69A illustrates processing for serial data "110". An index "2" is hit based on a Cmark bit "1" and a compressed symbol "10". In this case, a symbol "A" registered in the index "2" is moved to an index "1" (because i−k≤0 is satisfied), and a symbol "B" registered in the index "1" is moved to the index "2". The symbol "A" is output as a decompressed symbol. An entropy calculation value is 2, a data mask is "00000011", and a bit count is 1.

FIG. 69B illustrates processing for serial data "00". A compressed symbol "C" is registered in an index "1" based on a Cmark bit "0", and symbols "A" and "B" are moved to their next entries. A symbol "C" is output as a decompressed symbol. There is no change in an entropy calculation value, a data mask, and a bit count.

FIG. 69C illustrates processing for serial data "0D". A compressed symbol "D" is registered in an index "1" based on a Cmark bit "0", and symbols "C", "A", and "B" are moved to their next entries. A symbol "D" is output as a decompressed symbol. An entropy calculation value is 3, and a data mask is "00000111". A bit count remains 1.

FIG. 70A illustrates processing for serial data "1100". An index "4" is hit based on a Cmark bit "1" and a compressed symbol "100". In this case, a symbol "B" registered in the index "4" is moved to an index "2" (because k=2), and symbols "C" and "A" registered in indexes "2" and "3" are moved to their next entries. At this time, since a hit count is 2, entropy culling is performed, and the symbol "A" positioned at the end is deleted. Thereby, an entropy calculation value is 2, and a data mask is "00000011". A hit count is reset.

FIG. 70B illustrates processing for serial data "111". An index "3" is hit based on a Cmark bit "1" and a compressed symbol "11". In this case, a symbol "C" registered in the index "3" is moved to an index "1" (because k=2), and symbols "D" and "B" registered in indexes "1" and "2" are moved to their next entries. At this time, a hit count is 1. A symbol "C" is output as a decompressed symbol. An entropy calculation value is 2, and a data mask is "00000011".

FIG. 70C illustrates processing for serial data "100". An index "0" is hit based on a Cmark bit "1" and a compressed symbol "00". In this case, a symbol "command 1=command EOS" registered in the index "0" is read. EOS is executed, and the decompressor 52 recognizes a terminal end of an original symbol sequence. Predetermined processing may be performed in accordance with the recognition. Further, in the example illustrated in FIG. 70C, a mode in which a symbol "B" at the end is deleted by entropy culling is represented, but the symbol may not be deleted.

According to the fifth embodiment, it is possible to reduce a range of an entry of which the registration content is changed in association with a hit by proximity exchange of entries, and to reduce a load and time related to conversion table update processing.

Sixth Embodiment

Next, a compression apparatus and a decompression apparatus according to a sixth embodiment will be described. Since a configuration of the sixth embodiment has points in common with the first embodiment, differences therebetween will be mainly described, and the descriptions of common points will be omitted.

Figure 71:
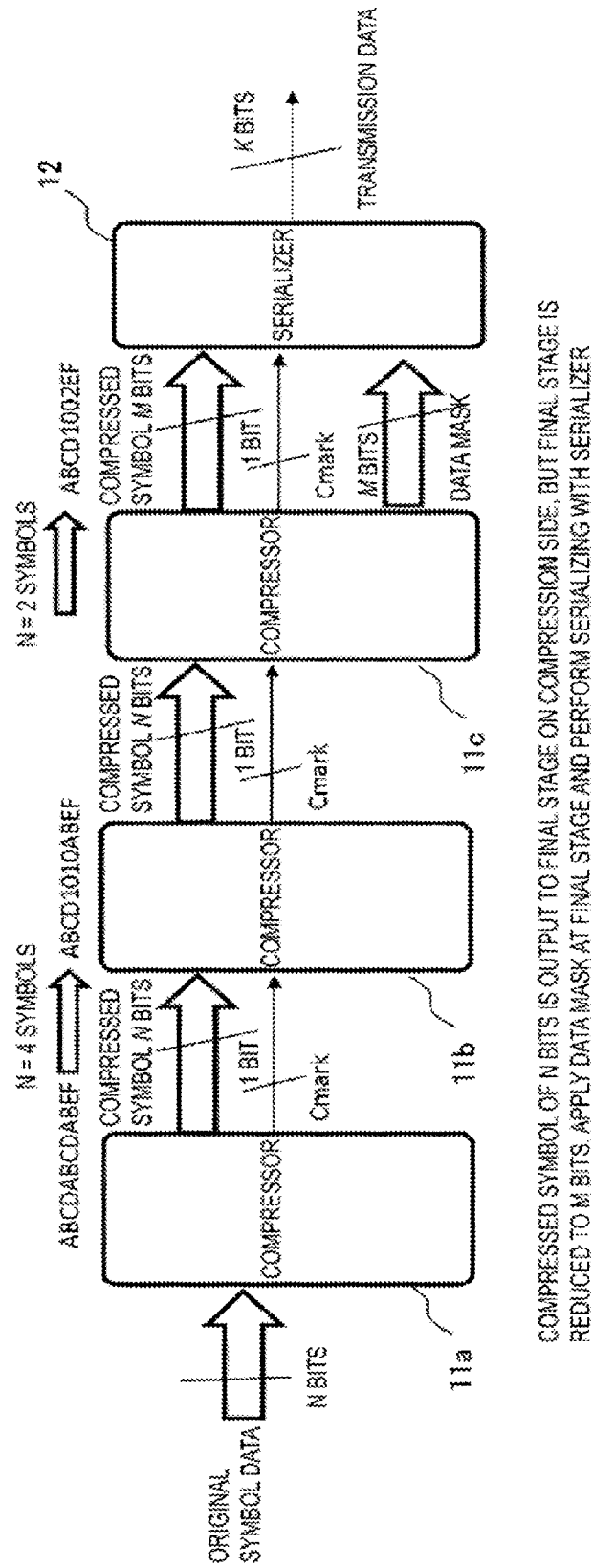
FIG. 71 illustrates a compression apparatus according to a sixth embodiment.

As the sixth embodiment, an example in which the compressor 11 and the decompressor 52 described in the first embodiment are cascade-connected to each other is described. FIG. 71 illustrates a compression apparatus 10A according to the sixth embodiment. In FIG. 71, the compression apparatus 10A is configured such that a plurality (three in the example of FIG. 71) of compressors 11a, 11b, and 11c and a serializer 12 are connected to each other in series.

Original symbol data (N bits) is input to the compressor 11a. The compressor 11a includes the conversion table described in the first embodiment, converts original symbol data (for example, "ABCDABCDABEF") into a compressed symbol "ABCD1010ABEF" of N bits (N=4 symbols), and outputs the converted compressed symbol together with a Cmark bit corresponding to the compressed symbol. The compressor 11b also has the same configuration as that of the compressor 11a. The compressor 11b converts the N-bit compressed symbol input from the compressor 11a into a compressed symbol "ABCD1002EF" of N bits (N=2 symbols), and outputs the converted compressed symbol together with the corresponding Cmark bit. The compressor 11b is an example of "another compression apparatus".

The compressor 11c and the serializer 12 have the same configuration as those of the compressor 11 and the serializer 12 described in the first embodiment. The compressor 11c outputs a compressed symbol of M bits, a Cmark bit, and a data mask.

Figure 72:
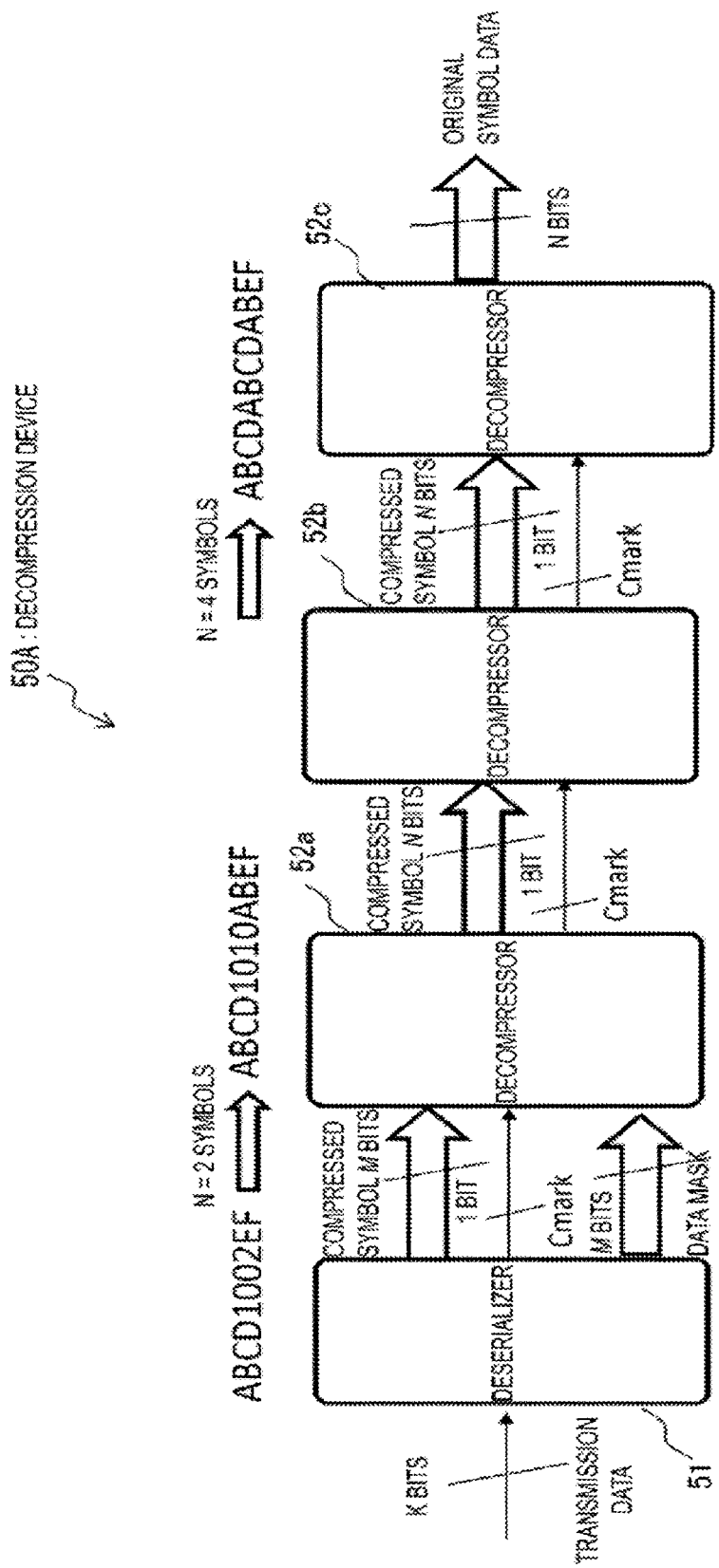
FIG. 72 illustrates a decompression apparatus according to the sixth embodiment.

FIG. 72 illustrates a decompression apparatus 50A according to the sixth embodiment. In FIG. 72, the decompression apparatus 50A is configured such that a deserializer 51 and decompressors 52a, 52b, and 52c corresponding to the number (three) of compressors included in the compression apparatus 10A are connected to each other in series.

The deserializer 51 and the decompressor 52a have the same configuration as those of the deserializer 51 and the decompressor 52 in the first embodiment. The deserializer 51 has an input of transmission data of K bits (compression apparatus 10A) which is transmitted from the compression apparatus 10A, and outputs a compressed symbol of M bits and a Cmark bit for the compressed symbol.

A decompressed symbol and a Cmark bit from the decompressor 52a are input to the decompressor 52b, and the decompressor 52b outputs a compressed symbol of N bits and a corresponding Cmark bit. The decompressor 52b is an example of "another decompression apparatus".

A decompressed symbol and a Cmark bit from the decompressor 52b are input to the decompressor 52c, and the decompressor 52c outputs original symbol data of N bits. The decompressor 52a outputs an N-bit decompressed symbol "ABCD1002EF", the decompressor 52b performs decompression in the case of N=2 symbols and outputs a decompressed symbol "ABCD1010ABEF", and the decompressor 52c outputs original symbol data "ABCDABCDABEF".

According to the sixth embodiment, the compression apparatus 10A and the decompression apparatus 50A have a configuration in which a plurality of compressors (the compressors 11a to 11c) and a plurality of decompressors (the decompressors 52a to 52c) which have different bit widths (the number of symbols) for performing compression and decompression are cascade-connected to each other. Thereby, it is possible to sufficiently reduce the size of original symbol data having a long bit pattern in a transmission path.

Seventh Embodiment

Next, a compression apparatus and a decompression apparatus according to a seventh embodiment will be described. Since a configuration of the seventh embodiment has points in common with the first embodiment, differences therebetween will be mainly described, and the descriptions of common points will be omitted.

In the seventh embodiment, a conversion table is divided into a plurality of banks. The number of entries included in the banks is less than the number of entries included in one conversion table by the division. For this reason, a speed can be increased by reducing the number of times of retrieval in implementation using software, and a frequency can be improved in implementation using hardware.

The selection of the divided table (bank) is performed using a hash function. There is no particular limitation on the hash function, and examples thereof include a case where some of bits constituting an original symbol are used, a case where a bank number is designated in a round-robin manner, a case where a primary hash and a secondary hash are used, and the like.

Figure 73A:
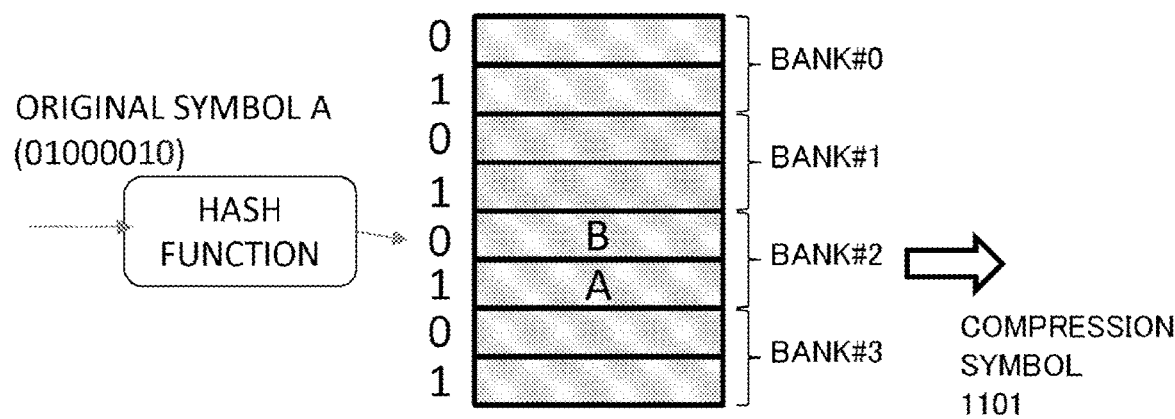
FIGS. 73A and 73B are diagrams illustrating a seventh embodiment.
Figure 73B:
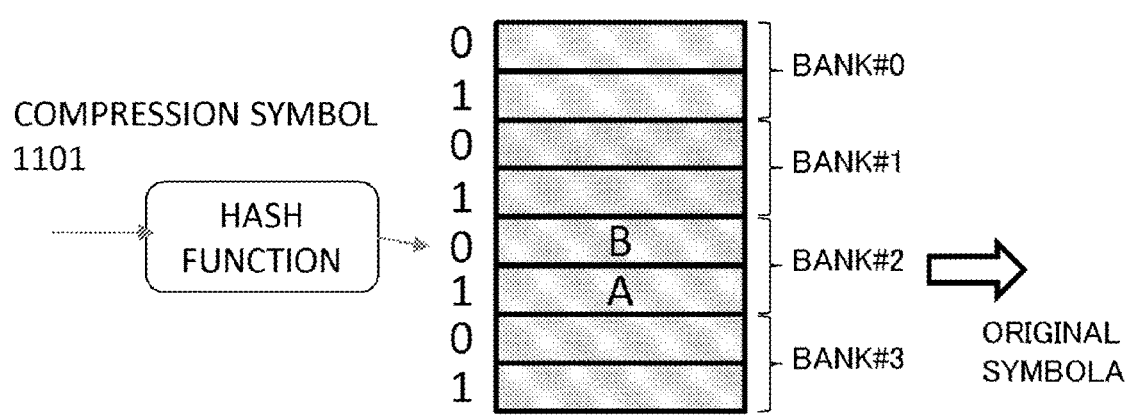

FIGS. 73A and 73B are diagrams illustrating the seventh embodiment. FIG. 73A illustrates an example of a conversion table included in the compressor 11 of the compression apparatus 10. In the example illustrated in FIG. 73A, a conversion table having eight entries is divided into four banks #0 to #3 each having two entries. Index values "0" and "1" are assigned to the entries of each of the banks. As a hash function, a function for hashing the lower 2 bits of an original symbol (N bits) as a bank number is applied.

For example, for an 8-bit original symbol "A (ASCII Code: 01000010)", the bank #2 is selected based on "10" (binary number 3) which is the lower 2 bits. An index "1" is hit as an entry in which the symbol "A" is registered by the retrieval of the bank #2. In this case, the compressor 11 generates a compressed symbol in which a bank number "10" is followed by an index number "1". A Cmark bit "1" indicating compression is added before the compressed symbol. Thus, an original symbol "A" is compressed into serial data "1101" of 4 bits and is transmitted as transmission data to the decompression apparatus 50. In the seventh embodiment, entropy calculation is performed for each bank in each of the compression apparatus 10 and the decompression apparatus 50, and a data mask is generated for each bank.

As described above, in a case where an entry is hit, symbol data is constituted by bits indicating a Cmark bit "1"+a bank number+an index number. However, in a case where a hash value is determined in accordance with the order of data (for example, in a case where a bank is determined in a round-robin manner according to a bank number), the bank number may not be included in the symbol data.

The bank number and the index number are represented by 2 bits and 1 bit, respectively, in the example of FIG. 73A, but is represented by a predetermined number of bits corresponding to the number of banks and the number of indexes. In a case where an entry is not hit, symbol data is, for example, a combination of a Cmark bit "0"+an original symbol. This is because a bank is uniquely determined according to a hash function, so that it is sufficient to perform the same operation in the bank as in a case where banks are not formed. In a decompressor, N bits after a Cmark bit "0" can be recognized as an original symbol. However, a Cmark bit, a bank number, an index number, and the position (order) of original symbols in symbol data are uniquely determined from an entry usage state in a bank, as long as the same hash function is used on the compression side and the decompression side.

As illustrated in FIG. 73B, a conversion table included in the decompressor 52 of the decompression apparatus 50 has the same configuration as that in FIG. 73A. For example, in a case where serial data "1101" is input, the decompressor 52 performs hashing using the next 2 bits "10" based on a Cmark bit "1" and has access to the bank #2 having a bank number 2. In addition, the least significant bit of the serial data is recognized as an index number, and a symbol registered in the index "1" is output as an original symbol. In this manner, an original symbol "A" is output.

Note that, for serial data including an original symbol, a Cmark bit is "0", and thus the decompressor 52 recognizes N bits from the least significant bit of the serial data as an original symbol. A bank number is determined according to hashing for an original symbol following the Cmark bit "0", a data mask is determined by entropy calculation corresponding to a bank, and the original symbol is registered within the bank.

A configuration in which the number of bits representing a bank number and an index number in a compressed symbol fluctuates depending on the usage conditions of an entry in a bank may be adopted using the entropy calculation unit 112 (522), the mask generation unit 113 (523), the serializer 12, and the deserializer 51 used in the first embodiment.

Eighth Embodiment

Next, a compression apparatus and a decompression apparatus according to an eighth embodiment will be described. Since a configuration of the eighth embodiment has points in common with the first embodiment, differences therebetween will be mainly described, and the descriptions of common points will be omitted.

In the compression methods illustrated in the first to seventh embodiments, a portion of a compressed symbol becomes complicated, and the compressed symbol cannot be restored to an original symbol when a configuration of a conversion table is unclear. In addition, since a portion of data converted for compression includes original data, it is not preferable to treat a compressed symbol itself as a code. The eighth embodiment solves such a problem. In the eighth embodiment, the encryption of transmission data transmitted from the compression apparatus to the decompression apparatus is performed using a common key encryption system.

Figure 74:
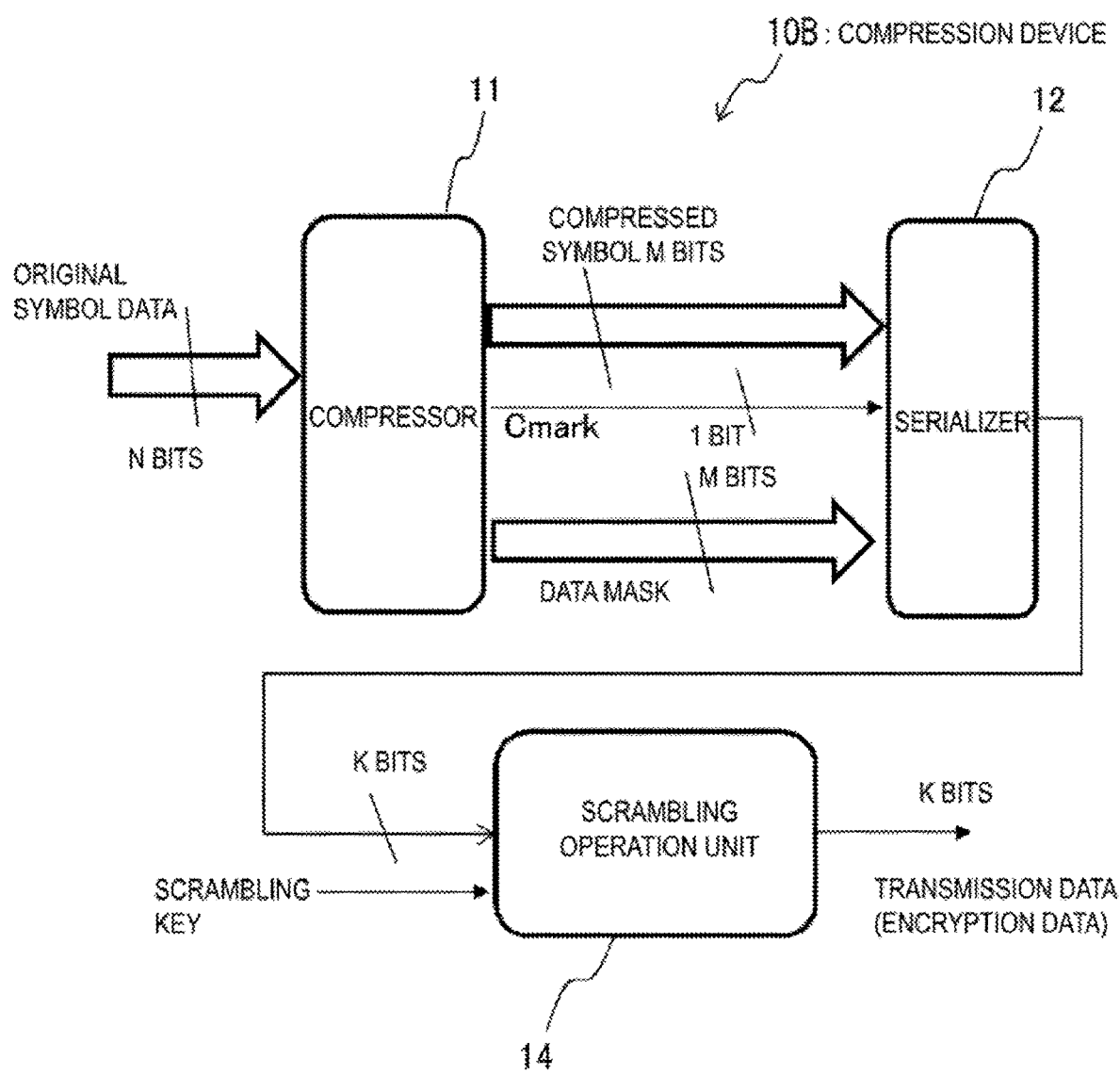
FIG. 74 illustrates a compression apparatus in an eighth embodiment.
Figure 75:
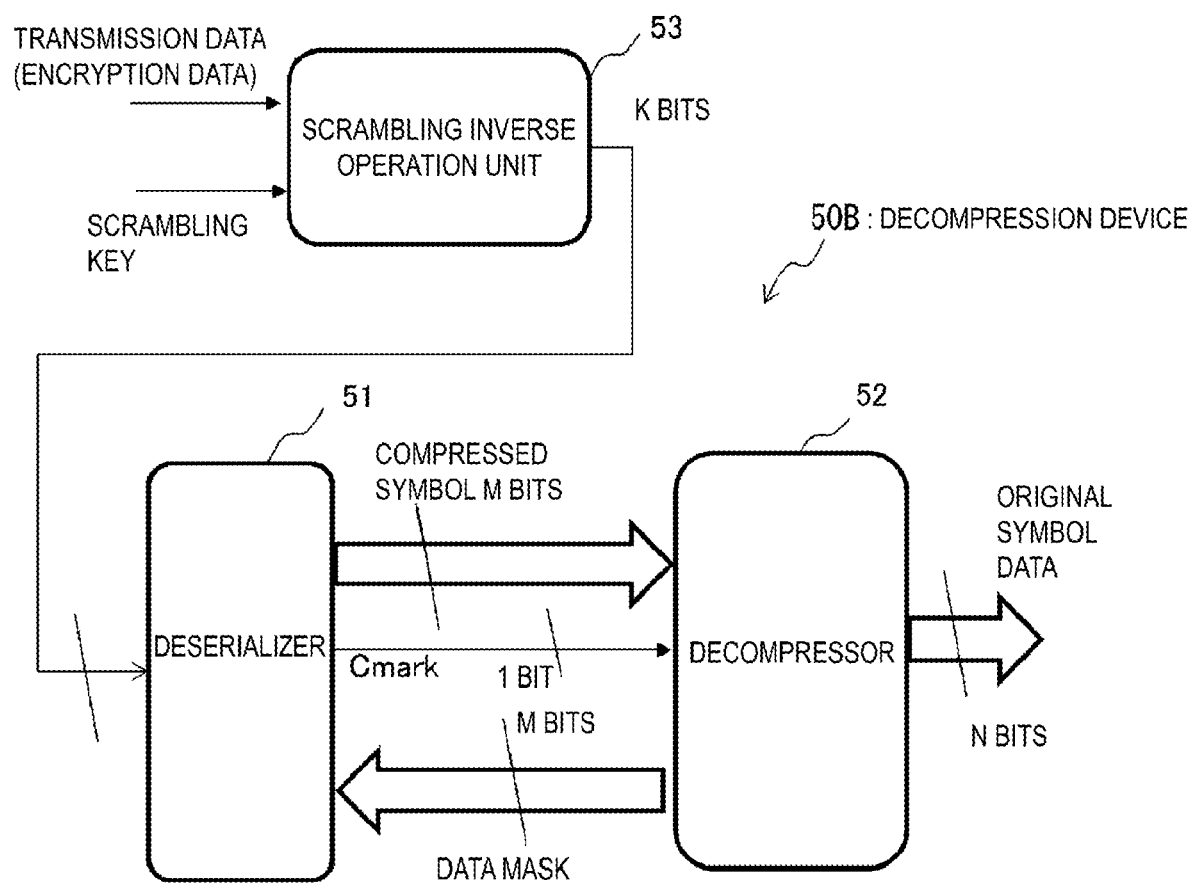
FIG. 75 illustrates a decompression apparatus in the eighth embodiment.

FIG. 74 illustrates a compression apparatus 10B in the eighth embodiment, and FIG. 75 illustrates a decompression apparatus 50B in the eighth embodiment. The compression apparatus 10B and the decompression apparatus 50B perform communication using a common key encryption system.

As illustrated in FIG. 74, the compression apparatus 10B includes a scrambling operation unit 14 in addition to the configuration of the compression apparatus 10 described in the first embodiment. Data output from a serializer 12 (K bits) and a scrambling key (common key) are input into the scrambling operation unit 14. The scrambling operation unit 14 encrypts data by scrambling operation using the scrambling key and outputs the encrypted data (encryption data, K bits). The encryption data is transmitted as transmission data to the decompression apparatus 50B via a transmission path (network).

The decompression apparatus 50B includes a scrambling inverse operation unit 53 in addition to the configuration of the decompression apparatus 50 described in the first embodiment. The encryption data (K bits) transmitted from the compression apparatus 10B and the scrambling key (common key) are input to the scrambling inverse operation unit 53. The scrambling inverse operation unit 53 outputs data (K bits) obtained by decrypting the encryption data by the scrambling inverse operation using the scrambling key. The data is the transmission data in the first embodiment and is input to the deserializer 51. The subsequent processing is the same as that in the first embodiment.

In order for the compression apparatus 10B and the decompression apparatus 50B to start encryption communication the following procedure (steps 1 to 3) is executed. However, step 2 is optional.

(Step 1) A first key (common key) is transmitted from the compression apparatus 10B to the decompression apparatus 50B.

(Step 2) A second key is transmitted from the compression apparatus 10B to the decompression apparatus 50B. Finally, an EOK (End of Key) command is transmitted. The EOK command is a command indicating the termination of key exchange.

(Step 3) Data to be encrypted (original symbol data) is input to the compression apparatus 10B.

In step 1, a combination of two or more parameters selected from among a plurality of parameters set for compression processing for a symbol, that is, one or two or more parameters selected from among a plurality of types of parameters related to compression and decompression is set for the compression apparatus 10 as a first key. The parameters include the number of bits N of an original symbol, the number of bits M of a compressed symbol, the number of bits K used for an output from the serializer 12, the number of hits or the number of mis-hits used for entropy culling, setting of an exception symbol, the type of scrambling operation, a scrambling key, a proximity entry exchange offset k, and a bank configuration (the number of banks).

For example, the following is an example of a case where all of the above-described parameters are combined.

(8, 8, 4, +2, EOK by RETI, f(x), 0xA5, 2, 1)

The above-described combinations indicate the execution of culling with N=8, M=8, K=4, two hits/mis-hits, a function f(x) used for scrambling operation, a scrambling key, k=2, and the number of banks=1 (no division). The function f(x) is, for example, "f(x)=X xor cyclic (KEY)" and is a function for performing an exclusive OR (XOR) operation of a bit sequence X with a cyclic key.

The second key transmitted in step 2 is a private key and is transmitted to create an initial state of a conversion table by the compression apparatus 10 and the decompression apparatus 50. For example, the compression apparatus 10 performs an operation of outputting "ABACDBC(EOK)(EOK)(EOK)(EOK)(EOK)" in which a command "EOK" is repeated a predetermined number of times (for example, four times) in "ABACDBC(EOK)" described in the fifth embodiment. Thereby, the private key is transmitted to the decompression apparatus 50. The second key is an example of "information for initializing the state of the second table".

In a case where each of symbols constituting a compressed symbol sequence "ABACDBC(EOK)" output in the fifth embodiment is output from the serializer 12, pieces of serial data such as "001000001", "001000010", "110", "001000011", "001000100", "1100", "111", and "100" are obtained. The pieces of serial data are input to the scrambling operation unit 14.

The scrambling operation unit 14 divides a bit sequence in which the above-described pieces of serial data are connected by N bits (8 in the present embodiment) and outputs a value obtained by performing an XOR operation using a cyclic key. Specifically, the following operations are performed.

00100000 xor 10100101=10000101
10010000 xor 11010010=01000010
10110001 xor 01101001=11011000
00001100 xor 10110100=10111000
10001001 xor 01011010=11010011
10011110 xor 00101101=10111111
01001001 xor 10010110=11011111
00100100 xor 01001011=01101111

Thereafter, the scrambling operation unit 14 serializes results of the scrambling operations with K bits (4 in the present embodiment). That is, the bit sequence is divided with 4 bits and output. As a result, pieces of serial data such as "1000", "0101", "0100", "0010", "1101", "1000", "1011", "1000", "1101", "0011", "1011", "1111", "1101", "1111", "0110", and "1111" are output as encryption data from the scrambling operation unit 14.

In the decompression apparatus 50B, the first key in step 1 is received and set in the decompression apparatus 50. The first key is treated as a common key (scrambling key) used for decryption in the decompression apparatus 50. In addition, the decompression apparatus 50 performs specification setting (configuration setting) of the deserializer 51 and the decompressor 52 for performing decompression processing of data received from the compression apparatus 10 in accordance with a parameter group included in the first key. The first key is as follows according to the above-described example.

(8, 8, 4, +2, EOK by RETI, $f^{-1}(x)$, 0xA5, 2, 1)

However, $f^{-1}(x)$ is an inverse function of a function $f(x)$ used for a scrambling operation, and "$f^{-1}(x)$=X xor cyclic (KEY)".

The encryption data described above is input to the scrambling inverse operation unit 53 of the decompression apparatus 50. The scrambling inverse operation unit 53 performs deserializing from K bits (K=4) to M bits (m=8) and performs an operation using $f^{-1}(x)$. The operations are represented below.

10000101 xor 10100101=00100000
01000010 xor 11010010=10010000
11011000 xor 01101001=00100001
10111000 xor 10110100=00000100
11010011 xor 01011010=00001000
10111111 xor 00101101=00001100
11011111 xor 10010110=00000000
01101111 xor 01001011=00000000

The scrambling inverse processing unit 53 collects operation results into one and divides it into a format of a Cmark bit+a compressed symbol. As a result, the same serial data as the output of the serializer 12, "001000001", "001000010", "110", "001000011", "001000100", "1100", "111", and "100" are obtained. That is, the decryption of encryption data is performed. An initial state of the conversion table in the decompressor 52 is generated using such a serial data group. In the decompression apparatus 50, a terminal end of a symbol sequence for creating the initial state of the conversion table is detected by detecting the repetition of a command "EOK".

As described above, a state where the compression apparatus 10 and the decompression apparatus 50 have common specifications is set based on the first key, the compression apparatus 10 performs processing of initializing the conversion table of the compression apparatus 10 based on the second key, and the decompression apparatus 50 initializes the conversion table of the decompression apparatus 50 using the second key transmitted from the compression apparatus 10. Thereby, an initial state of a conversion table synchronized between the compression apparatus 10 and the decompression apparatus 50 is generated. Thereafter, the compression apparatus 10 encrypts a compression result of an original symbol sequence with the first key and transmits the encrypted compression result to a transmission path as transmission data. The decompression apparatus 50 decrypts transmission data received from the transmission path using the first key and performs decompression processing. According to the eighth embodiment, data flowing through the transmission path can be encrypted.

Ninth Embodiment

The compression apparatus and the decompression apparatus described in the first to eighth embodiments may be implemented by software and may be implemented by hardware.

Example of Implementation Using Software

Figure 76:
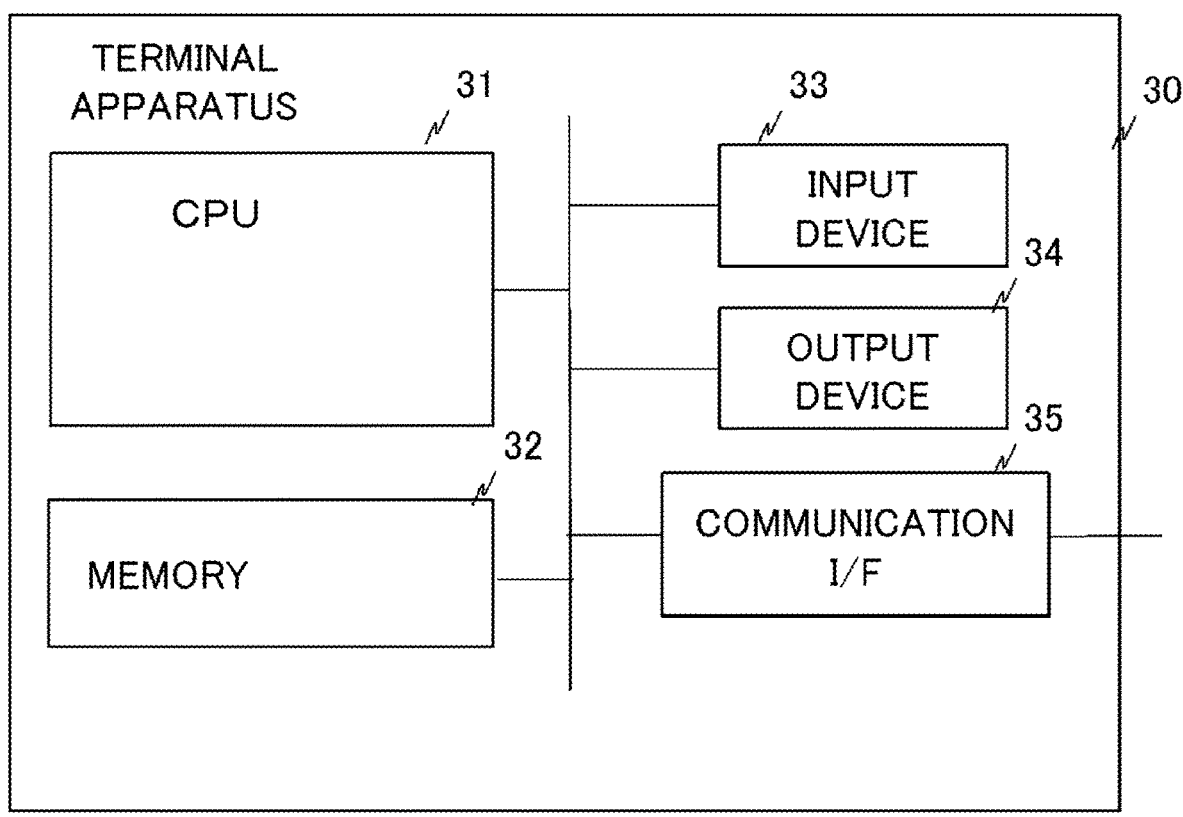
FIG. 76 illustrates a configuration example of a terminal apparatus applicable to the compression apparatus and the decompression apparatus according to the first to eighth embodiments.

FIG. 76 illustrates a configuration example of a terminal apparatus applicable to the compression apparatus and the decompression apparatus according to the first to eighth embodiments. For example, a personal computer (PC) or a workstation can be applied to a terminal apparatus 30 as a general-purpose computer which is a general-purpose or dedicated computer (information processing apparatus). As a dedicated computer, for example, a server machine can be applied. In addition, the terminal apparatus 30 may be a fixed terminal or a wireless terminal. The wireless terminal includes a smart apparatus such as a smart phone or a tablet terminal. In addition, the terminal apparatus 30 may also include a car navigation apparatus, a game apparatus, or the like.

As illustrated in FIG. 1, the terminal apparatus 30 includes, for example, a storage apparatus 32, an input device 33, an output device 34, and a communication interface (communication IF) 35 which are connected to a CPU 31 via a bus.

The storage apparatus 32 includes a main storage apparatus and an auxiliary storage apparatus. The main storage apparatus is used as a working region of the CPU 31, a storage region for programs and data, and a buffer region for communication data. The main storage apparatus is a so-called memory, and is formed by, for example, a Random Access Memory (RAM) or a combination of a RAM and a Read Only Memory (ROM).

The auxiliary storage apparatus stores programs executed by the CPU 31 and data used when the programs are executed. Examples of the auxiliary storage apparatus include a hard disk drive (HDD), a Solid State Drive (SSD), a flash memory, an Electrically Erasable Programmable Read-Only Memory (EEPROM), and the like. In addition, the auxiliary storage apparatus includes a portable storage medium that can be attachable or detachable to and from an information processing apparatus. The portable storage medium is, for example, a Universal Serial Bus (USB) memory.

The input device 33 is used to input information and data to the terminal apparatus 30. Examples of the input device 33 include a button, a key, a pointing apparatus such as a mouse, a touch panel, and the like. The input device 33 may include a voice input device, such as a microphone. The input device 33 may also include an imaging apparatus such as a camera or an image scanner, a sensor for acquiring sensing data, and the like.

The output device 34 outputs information and data. The output device is, for example, a display apparatus. The output device 34 may include a sound output device such as a speaker. The communication IF 35 is connected to a transmission path (network) of data. The communication IF 35 is, for example, a Local Area network (LAN) card. The communication IF 35 may include a wireless circuit for wireless communication. A wireless communication standard is not limited, and for example, 3G (such as W-CDMA), Long Term Evolution (LTE), wireless LAN (IEEE 802.11 series or Wi-Fi), Bluetooth (registered trademark), BLE, and the like can be applied. However, a communication standard is not limited thereto.

The CPU 31, which is an example of a processor, loads and executes programs stored in the storage apparatus 32. An operating system (OS) and an application program are installed in the storage apparatus 32. When the CPU 31 executes a program, the terminal apparatus 30 operates as the compression apparatus 10, 10A, and 10B and the decompression apparatus 50, 50A, and 50B described in the first to ninth embodiments.

That is, the CPU 31 can operate as a compressor 11 (the compressors 11a to 11c) and a serializer 12. In other words, the CPU 31 may serve as a main component in the operational examples illustrated in FIGS. 11 and 15. In addition, the CPU 31 operates as a deserializer 51 and a decompressor 52 (the decompressor 52a to 52c). In other words, the CPU 31 may serve as a main component in the operational examples illustrated in FIGS. 21 and 22. In addition, the CPU 31 may serve as a main body that recognizes and executes a command.

A conversion table is stored in the storage apparatus 32. However, the conversion table may be stored in something other than the storage apparatus 32. Original symbol data is acquired by being input from the input device 33 or by being received by the communication IF 35. The communication IF 35 is used to transmit and receive transmission data. The output device 34 can be used to output and display original symbol data obtained by decompression.

Note that processing executed by the CPU 31 may be executed by plurality of CPUs (processors). At least some of the processing executed by the CPU 31 may be executed by a processor other than a CPU, such as a Digital Signal Processor (DSP). In addition, at least some of the processing performed by the CPU 31 may be executed by hardware, as described above. The hardware includes integrated circuits such as a Field Programmable Gate Array (FPGA), an IC, an LSI, and an Application Specific Integrated Circuit (ASIC). In addition, the compression apparatus and the decompression apparatus may be implemented by a combination of a circuit, such as a Micro Control Unit (MCU) or a SoC (System-on-a-Chip), and a processor.

Example of Implementation Using Hardware

<<Circuit Configuration of Compression Apparatus>>

Figure 77:
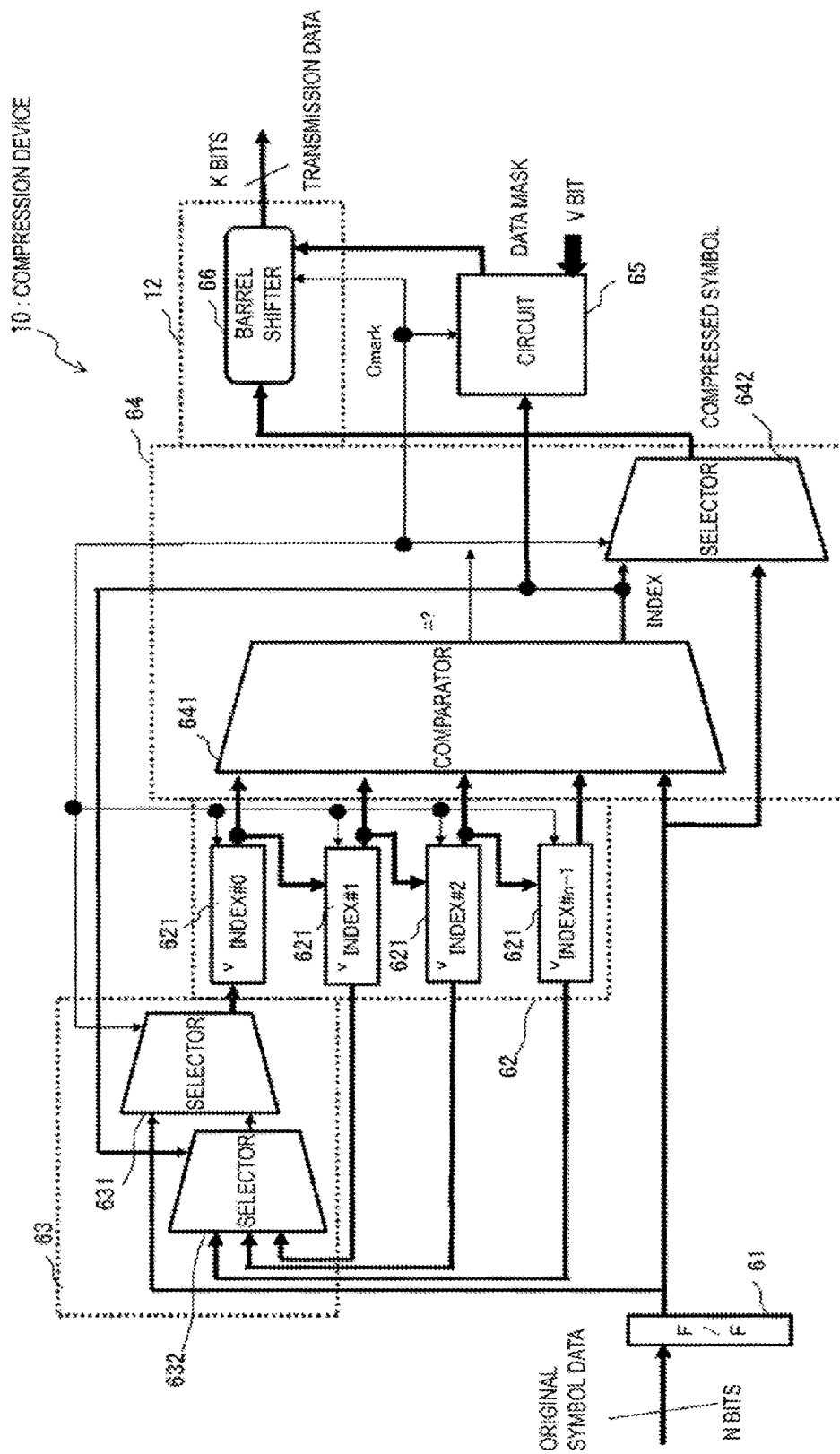
FIG. 77 illustrates an example of a circuit configuration of a compression apparatus.

FIG. 77 illustrates an example of a circuit configuration of the compression apparatus 10. In FIG. 77, the compression apparatus 10 includes a flip-flop (F/F) 61 that holds original symbol data of the decompression apparatus, a table circuit 62, an operation circuit 63 for a conversion table, a determination circuit 64 for compression or non-compression, a circuit 65 that operates as an entropy calculation unit 112 and a mask generation unit 113, and a barrel shifter 66 that operates as the serializer 12.

The table circuit 62 includes n storage regions 621 (indexes "0" to "n−1", and n=4 in the example of FIG. 77), and each of the storage regions 621 is used as an entry of the conversion table. In addition, "v" illustrated in the storage region 621 is information (bit) indicating whether an entry is in use (whether an original symbol is stored). For example, a case where a v bit is "0" indicates emptiness, and a case where a v bit is "1" indicates being in use.

The determination circuit 64 includes a comparator 641 and a selector 642. An output from each of the storage regions 621 and an output (original symbol) from the F/F 61 are input into the comparator 641. The comparator 641 compares the value of an original symbol with a value obtained from each of the storage regions 621, and outputs a Cmark bit "0" in a case where there is no matching storage region 621. On the other hand, in a case where there is a storage region 621 that has output the same value as the value of the original symbol, a Cmark bit "1" and an index value (INDEX) of the storage region 621 are output.

The selector 642 includes an input terminal to which an original symbol of the F/F 61 and an index value from the comparator 641 are input. In addition, the selector 642 includes a control terminal to which a Cmark bit is input, and an output terminal that outputs an original symbol as a compressed symbol when a Cmark bit is "0" and outputs an index value as a compressed symbol when a Cmark bit is "1".

The operation circuit 63 includes a selector 631 and a selector 632. The selector 632 includes an input terminal to which symbols stored in indexes "1" to "n−1" are input, a control terminal to which an index value of the storage region 621 (entry) having the same symbol as an original symbol registered therein is input, and an output terminal that inputs a symbol matching an index value to the selector 631.

The selector 631 includes an input terminal to which an output from the selector 632 and an original symbol from the F/F 61 are input, and a control terminal to which a Cmark bit is input. In addition, the selector 631 includes an output terminal that outputs an original symbol to the storage region 621 at the head (of the index "0") when a Cmark bit is "0", and outputs a symbol from the selector 632 to the storage region 621 of the index "0" when a Cmark bit is "1".

Each of the storage regions 621 is connected to the next storage region 621 in a direction in which an index value increases, and when a Cmark bit "1" is received and a symbol is stored in the storage region 621, the symbol is moved to the next storage region 621. However, the value of a symbol is overwritten on the storage region 621 of the index "n−1".

In addition, an index value from the comparator 641 is input to the storage region 621. The storage region 621 includes, for example, a magnitude comparator, and in a case where an input index value is greater than its index value, a stored symbol value is input to the selector 632. However, this is limited to a case where the storage region stores a symbol (a case where the value of a v bit is "1"). In this manner, the movement of a symbol to a leading entry and movement (pushing operation) to the next entry are performed in a case where an entry is hit.

An index value, a Cmark bit, and a v bit from each of the storage regions 621 are input to the circuit 65. A usage rate of a conversion table can be known by a v bit. The circuit 65 performs entropy calculation according to the first or second calculation method in a case where a Cmark bit is "1". The circuit 65 generates a data mask corresponding to an entropy calculation value and inputs the generated data mask to the barrel shifter 66.

Note that, in the ninth embodiment, the table circuit 62, the determination circuit 64, and the operation circuit 63 operate as the symbol conversion unit 111. Note that a counter indicating the number of storage regions 621 (entries) used may be used instead of a v bit.

A Cmark bit, a compressed symbol from the selector 642, and a data mask from the circuit 65 are input to the barrel shifter 66. The barrel shifter 66 outputs a Cmark bit+a compressed symbol in units of K bits. An output of the barrel shifter 66 is transmitted to the decompression apparatus 50 as transmission data.

Note that, when a Cmark bit is "0", a circuit is configured such that a data mask "11111111" is input to the barrel shifter from the circuit 65 regardless of an entropy calculation value. Alternatively, when a Cmark bit is "0", the circuit 65 does not output a data mask, and the barrel shifter 66 may output a compressed symbol as it is subsequently to a Cmark bit.

<<Circuit Configuration of Decompression Apparatus>>

Figure 78:
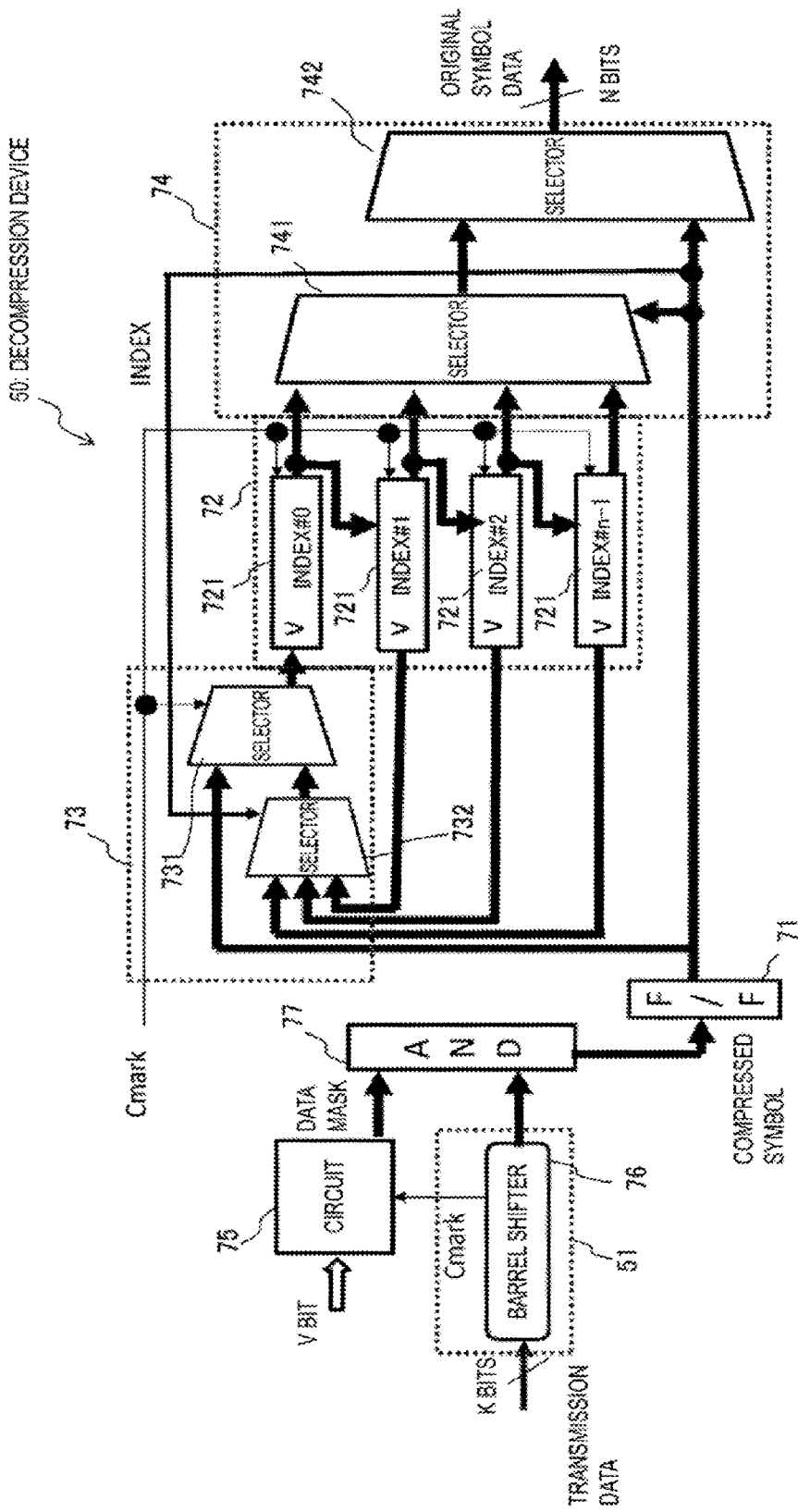
FIG. 78 illustrates an example of a circuit configuration of a decompression apparatus.

FIG. 78 illustrates an example of a circuit configuration of the decompression apparatus 50. The decompression apparatus 50 illustrated in FIG. 78 has a configuration corresponding to the compression apparatus 10 illustrated in FIG.

77. The decompression apparatus 50 includes a barrel shifter 76 that operates as the deserializer 51, a circuit 75, an AND circuit 77, an F/F 71, a table circuit 72, an operation circuit 73 for a conversion table, and a determination circuit 74 for the necessity of decompression.

Transmission data that has been transmitted through a transmission path is input to the barrel shifter 76. The barrel shifter separates a Cmark bit and a compressed symbol and outputs the separated Cmark bit and compressed symbol. The Cmark bit is input to the circuit 75, and the compressed symbol is input to an input end of the AND circuit 77.

The table circuit 72 has the same configuration as that of the table circuit 62, and includes storage regions 721 (entry) for a plurality of (n) symbols. In each of the storage regions 721, the above-described v bit is set, and the state of each of the v bits in the storage regions 721 is input to the circuit 75 as information indicating the usage conditions of the conversion table.

The circuit 75 operates as an entropy calculation unit 522 and a mask generation unit 523, and performs entropy calculation and generation of a data mask corresponding to the calculation result. In addition, the circuit 75 inputs the data mask to the input end of the AND circuit 77. Note that the number of bits of a compressed symbol input from the barrel shifter 76 to the AND circuit 77 is determined according to the number of valid bits represented in the data mask.

The AND circuit 77 performs an AND operation between the compressed symbol and the data mask, and outputs the result to the F/F. When a Cmark bit is "1", the circuit 75 outputs a data mask indicating the number of valid bits corresponding to an entropy calculation value. When a Cmark bit is "0", a data mask "11111111" indicating that all bits are valid is output regardless of an entropy calculation value. However, when a Cmark bit is "0", the circuit 75 does not output a data mask, and a configuration in which a compressed symbol output from the barrel shifter 66 is input to the F/F 71 as it is may be adopted.

The determination circuit 74 includes a selector 741 and a selector 742. An output from each of the storage regions 621 and an output from the F/F 71 are input to the selector 741. In a case where a compressed symbol output from the F/F 71 and input to a control end of the selector 741 is an original symbol, the selector 741 stops output from the selector 741 to the selector 742. On the other hand, in a case where the compressed symbol input from the control end is an index value, the selector 741 inputs an original symbol read from the storage region 721 corresponding to the index value to the selector 742.

When there is an input from the selector 741, the selector 742 outputs the input. In a case where there is no input from the selector 741, the selector 741 outputs an input from the F/F 71. Thereby, in a case where an output from the F/F 71 is an original symbol, the original symbol is output from the selector 742. On the other hand, in a case where an output from the F/F 71 is an index value, an original symbol output from the selector 741 is output from the selector 742.

The operation circuit 73 includes a selector 731 and a selector 732. The selector 732 includes an input terminal to which symbols stored in indexes "1" to "n−1" are input, a control terminal to which an index value of the storage region 621 (entry) having the same symbol as an original symbol registered therein is input, and an output terminal that inputs a symbol matching an index value to the selector 731.

The selector 731 includes an input terminal to which an output from the selector 732 and an Currently Amended symbol from the F/F 71 are input, and a control terminal to which a Cmark bit is input. In addition, the selector 731 includes an output terminal that outputs an Currently Amended symbol to the storage region 721 at the head (of the index "0") when a Cmark bit is "0", and outputs a symbol from the selector 732 to the storage region 721 of the index "0" when a Cmark bit is "1".

Each of the storage regions 721 is connected to the next storage region 721 in a direction in which an index value increases, and when a Cmark bit "1" is received and a symbol is stored in the storage region 721, the symbol is moved to the next storage region 721. However, the value of a symbol is overwritten on the storage region 621 of the index "n−1".

In addition, an index value from the F/F 71 is input to the storage region 721. The storage region 721 includes, for example, a magnitude comparator, and in a case where an input index value is greater than its index value, a stored symbol value is input to the selector 732. However, this is limited to a case where the storage region stores a symbol (a case where the value of a v bit is "1"). In this manner, the movement of a symbol to a leading entry and movement (pushing operation) to the next entry are performed in a case where an entry is hit.

As represented in the ninth embodiment, the compression apparatus and the decompression apparatus may be implemented using software or may be implemented using hardware.

Tenth Embodiment

As a tenth embodiment, a second entropy calculation method different from the entropy calculation method described in the first embodiment (first calculation method) will be described. In the second entropy calculation method, an entropy is calculated using a usage rate of a conversion table and a hit rate of an entry in compression processing for a past T symbol. For example, an entropy value E is obtained using Formula 2 below, instead of ceil($\log_2 k$) in the first calculation method.

$$E = \text{ceil}(\log_2((\text{usage rate/hit rate})*\text{the number of entries}))$$ Formula 2:

The usage rate and the hit rate indicate a usage rate and a hit rate of a conversion table for a compression result of the past T (T is a positive integer) symbol. However, the range of the entropy value E is 0 E m. M is a maximum bit length of a data mask of a compressor or a decompressor. In addition, M is 0 in a case where E is a negative number.

Since the second calculation method depends on statistics of the past hit rate and table usage rate, an index in which an original symbol is hit at the time of compression may exceed the range of an index indicated by a numerical value obtained by entropy calculation using Formula 2 (for example, a case where an index "7" is hit when E=2). For this reason, compression and decompression processing is performed in a manner different from that in the first embodiment.

Figure 79:
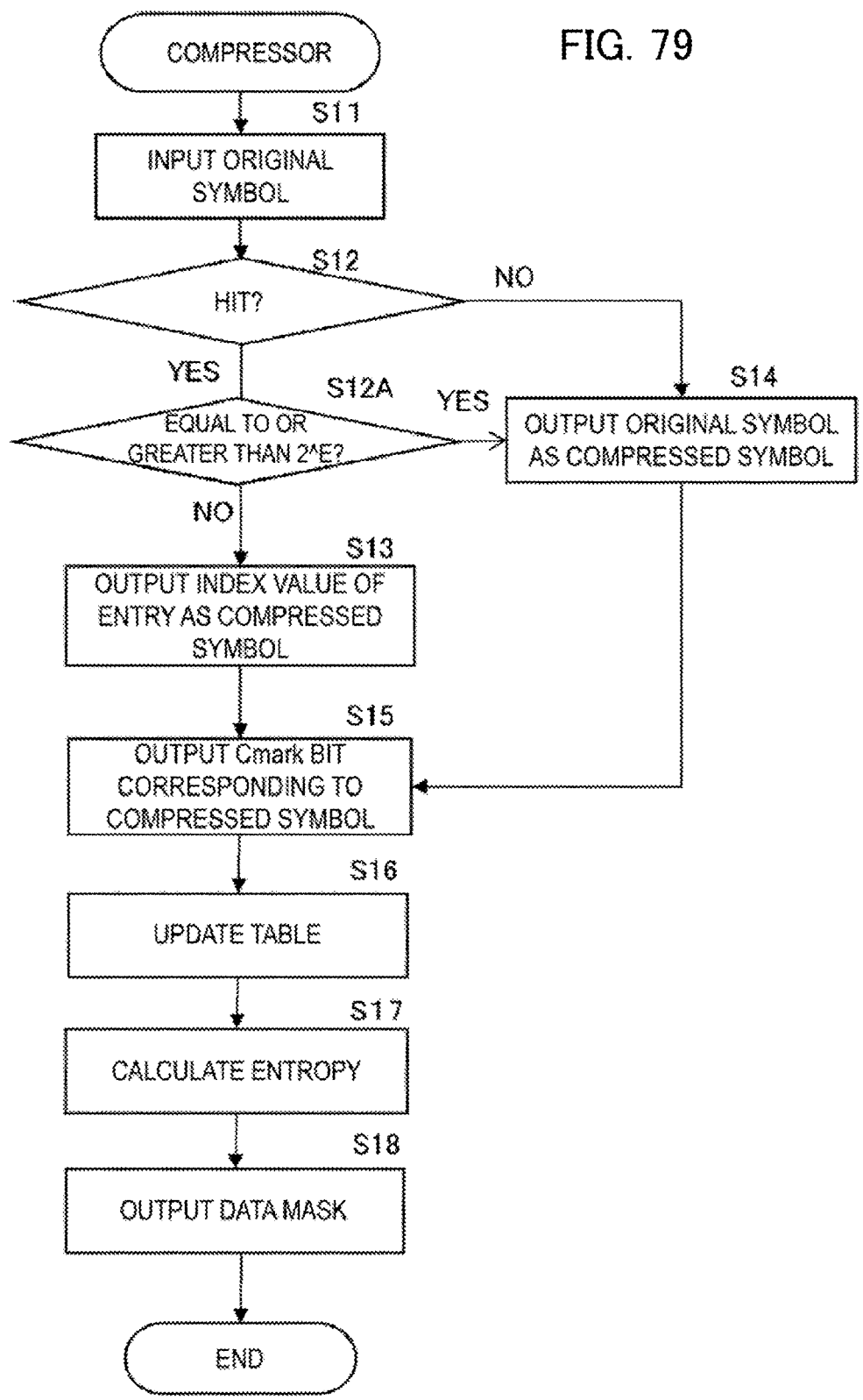
FIG. 79 is a flowchart illustrating an example of processing of a compressor in a tenth embodiment.

FIG. 79 is a flowchart illustrating an example of processing of a compressor using the second calculation method according to the tenth embodiment. The processing of a compressor 11 according to the tenth embodiment differs from the first embodiment in that the processing of S12A is provided between S12 and S13 in comparison with the processing (FIG. 15) of the compressor in the first embodiment.

In S12A, the compressor 11 determines whether an index value of an entry which is hit in S12 is equal to or greater than 2 to the power of E. In a case where it is determined that the index value is not equal to or greater than 2 to the power of E (less than 2 to the power of E), the processing proceeds to S13, and the same operation as that in the first embodiment is performed. On the other hand, in a case where the index value is equal to or greater than 2 to the power of E, the compressor 11 performs the processing of S14 and outputs a Cmark bit "0" in the processing of S15. That is, a case where the index value is equal to or greater than 2 to the power of E is treated as a mis-hit (unregistered).

Figure 80:
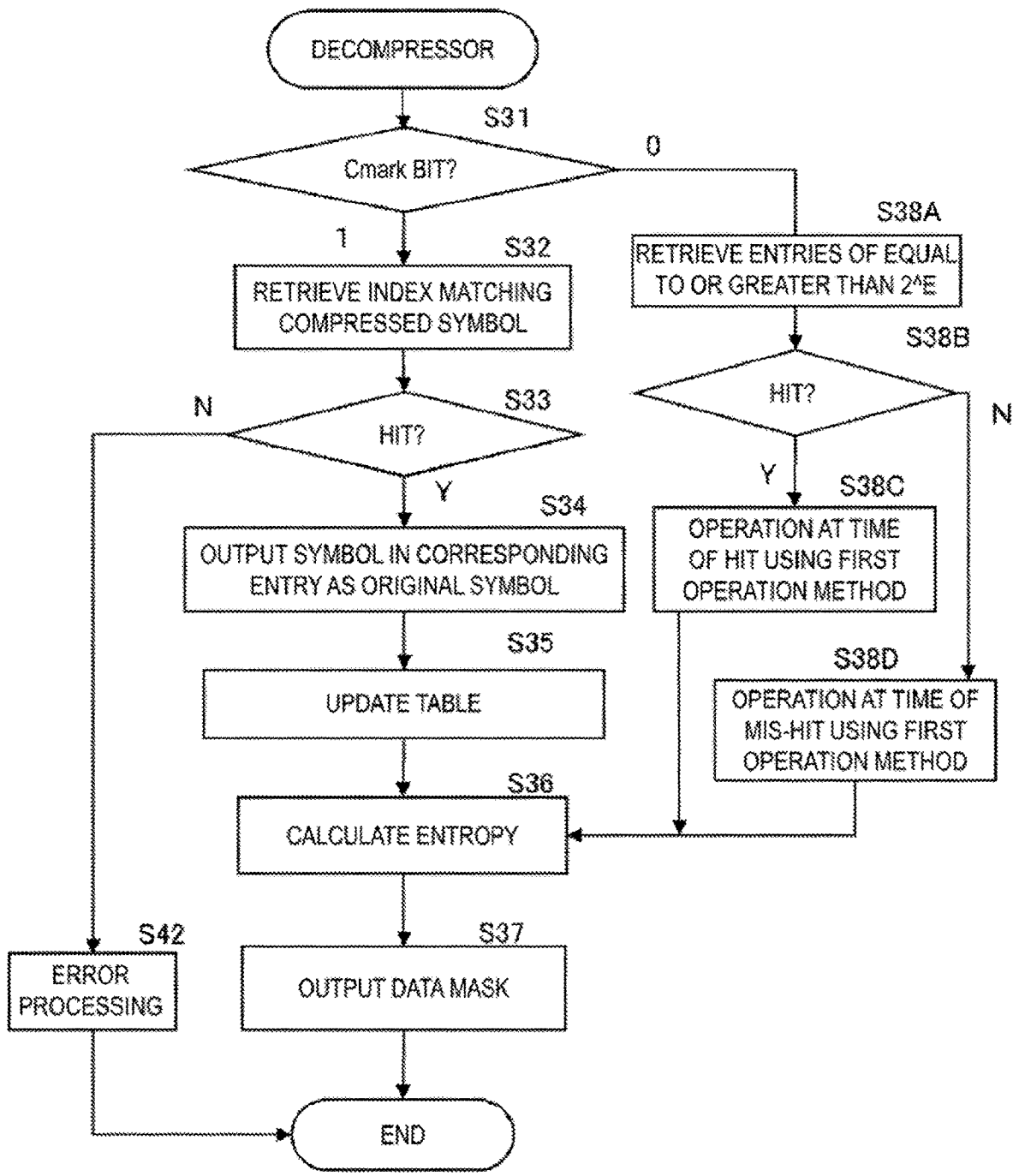
FIG. 80 is a flowchart illustrating an example of processing of a decompressor in the tenth embodiment.

FIG. 80 is a flowchart illustrating an example of processing of a decompressor using the second calculation method according to the tenth embodiment. The processing of the decompressor 52 according to the tenth embodiment differs from that in the first embodiment in that pieces of processing of S38A, S38B, S38C, and S38D are provided instead of S38, S39 S40, and S41 in comparison with the processing of the decompressor (FIG. 22) in the first embodiment.

In a case where it is determined in S31 that the value of the Cmark bit is "0", the decompressor 52 retrieves a compressed symbol for entries in which an index value exceeds 2 to the power of E in the conversion table (S38A). In a case where it is determined that a compressed symbol has been hit (S38B, Y), the decompressor 52 performs an operation at the time of a hit according to the first operation method (S38C) (see FIG. 16C), that is, the decompressor 52 outputs the hit compressed symbol as an original symbol (decompressed symbol), moves the compressed symbol to a predetermined position (for example, a leading entry), and moves a symbol registered in each of one prior entries of the entries hit from the leading entry to the next entry.

On the other hand, in a case where it is determined that the compressed symbol has not been hit (mis-hit) (S38B, N), the decompressor 52 performs an operation at the time of a mis-hit according to the first operation method (FIG. 16(B)) (FIG. 38D). That is, the decompressor 52 registers the compressed symbol in the leading entry and moves a symbol registered in each of entries after the leading entry to the next entry. When the processing of S38C or S38D is terminated, the processing proceeds to S36. The processing in FIGS. 79 and 80 is the same as that illustrated in FIGS. 15 and 22 except for the above-described points, and thus the description of the same processing will be omitted.

FIGS. 81A and 81B, FIGS. 82A and 82B, FIGS. 83A and 83B, FIGS. 84A and 84B, and FIG. 85 illustrate an example of the second calculation method for an entropy. An entropy value is calculated using a usage rate and a hit rate in inputs (compression processing) of the past T=5 symbols. Note that, in this calculation example, it is assumed that the change of a registration position due to an entry being hit and the deletion of entries associated with the number of hits or mis-hits are not performed. A calculation formula for an entropy value E is Formula 2, that is, E=ceil(log$_2$((usage rate/hit rate) * the number of entries)). The range of E is 0≤E≤m, and m is a maximum number of bits of a data mask.

FIG. 81A illustrates an initial state in a calculation example. A case where a symbol sequence of "ABCA-BABDAB" is input is assumed as an example of input data. As illustrated on the upper left side in FIG. 79A, it is assumed that a symbol is not registered in a conversion table in an initial state (the number of entries=4, indexes "0" to "3", and thus M=2). A table represented on the lower side in FIG. 81A represents a usage rate and a hit rate of a conversion table for each of five symbols input in the past (before four inputs before three inputs, before two inputs, and current), and an average value. In the example illustrated in FIG. 79A, an average initial value of a usage rate is set to "0/20", and an average initial value of a hit rate is set to "5/5". However, an average initial value of a usage rate may be set to "4/4", and an average initial value of a hit rate may be set to "0". In this case, an entropy value E is 0.

FIG. 81B illustrates a calculation example in a case where a symbol "A" is input and registered in a conversion table. The current usage rate is "1/4", and the average value thereof is "1/20". In addition, an average value of a hit rate is "4/5". In addition, an entropy calculation value according to Formula 2 is "−2". Since the calculation result is less than a possible range for E, an entropy value E is set to 0 which is the lower limit of the range.

FIG. 82A illustrates a calculation example in a case where a symbol "B" subsequent to the symbol "A" is input and registered in a conversion table. The current usage rate is "2/4", and the average value thereof is "3/20". In addition, an average value of a hit rate is "3/5". Both an entropy calculation value at this time and the value of E are "0". Note that, in compression processing for the symbol "B" at this time, the symbol "B" leads to a mis-hit and is output as a compressed symbol, and thus a data mask is not used. While the number of entries used is two, the number of valid bits indicated by the data mask is 0 bits, but no discrepancy occurs on the decompression side because no data mask is used.

FIG. 82B illustrates a calculation example in a case where a symbol "C" subsequent to the symbol "B" is input and registered in a conversion table. The current usage rate is "3/4", and the average value thereof is "6/20". In addition, an average value of a hit rate is "2/5". An entropy calculation value at this time is "1.58", and an entropy value E is 2.

FIG. 83A illustrates a calculation example in a case where a symbol "A" subsequent to the symbol "C" is input, and an index "2" is hit. The current usage rate is "3/4", and the average value thereof is "9/20". In addition, an average value of a hit rate is "2/5". Although an entropy calculation value at this time is "2.16", the entropy calculation value exceeds an upper limit value "2" of the range of E, and thus the value of E is set to the upper limit value "2".

FIG. 83B illustrates a calculation example in a case where a symbol "B" subsequent to the symbol "A" is input, and an index "1" is hit. The current usage rate is "3/4", and the average value thereof is "12/20". In addition, an average value of a hit rate is "2/5". Although an entropy calculation value at this time is "2.58", the entropy calculation value exceeds an upper limit value "2" of the range of E, and thus the value of E is set to the upper limit value "2".

FIG. 84A illustrates a calculation example in a case where a symbol "A" subsequent to the symbol "B" is input, and an index "2" is hit. The current usage rate is "3/4", and the average value thereof is "14/20". In addition, an average value of a hit rate is "3/5". Although an entropy calculation value at this time is "2.22", the entropy calculation value exceeds an upper limit value "2" of the range of E, and thus the value of E is set to the upper limit value "2".

FIG. 84B illustrates a calculation example in a case where a symbol "B" subsequent to the symbol "A" is input, and an index "1" is hit. The current usage rate is "3/4", and the average value thereof is "15/20". In addition, an average value of a hit rate is "4/5". An entropy calculation value at this time is "1.90", and an entropy value E is 2.

FIG. 85A illustrates a calculation example in a case where a symbol "D" subsequent to the symbol "B" is input, and symbols are registered. The current usage rate is "4/4", and the average value thereof is "16/20". In addition, an average value of a hit rate is "4/5". An entropy calculation value at this time and the value of E are "2".

FIG. 85B illustrates a calculation example in a case where a symbol "A" subsequent to the symbol "D" is input, and an index "3" is hit. The current usage rate is "4/4", and the average value thereof is "17/20". In addition, an average value of a hit rate is "4/5". Although an entropy calculation value at this time is "2.08", the entropy calculation value exceeds an upper limit value "2" of the range of E, and thus the value of E is set to the upper limit value "2".

FIG. 86 illustrates a calculation example in a case where a symbol "B" subsequent to the symbol "A" is input, and an index "2" is hit. The current usage rate is "4/4", and the average value thereof is "18/20". In addition, an average value of a hit rate is "4/5". Although an entropy calculation value at this time is "2.17", the entropy calculation value exceeds an upper limit value "2" of the range of E, and thus the value of E is set to the upper limit value "2".

Performance Evaluation of Calculation Method

It is proved experimentally whether the entropy calculation described in the first to tenth embodiments can correctly express a Shannon average information amount. An entropy is calculated and recorded whenever an original symbol is input using the above-described first calculation method and second calculation method for an entropy by using the compression apparatus 10 described in the first embodiment, and each of average values of calculation results according to the first and second calculation methods in a case where the processing of the entire original symbol sequence has been terminated is compared with a Shannon average information amount of the entire original symbol sequence.

In an experiment, for the configuration of the compression apparatus 10, the number of past symbols T in the second calculation method (the tenth embodiment) was set to 100. In addition, the number of entries in a conversion table was set to 256. However, entropy culling was performed with four hits as a trigger. Further, in the experiment, the setting of k=8 was adopted. For this reason, in a case where an entry is hit, a registration content of the entry is moved to an index position that goes back by 8 indexes from the index of the entry, and the contents of entries from the position after the movement to the position of the hit entry are shifted one by one.

For data in which the number of types can be selected from among 1 to 256, the number of types (for example, 128 (0 to 127) types) is determined. For data in which the number of types is 128, entropy calculation is performed whenever an original symbol appears with respect to an original symbol sequence when data (original symbols) has been made to randomly appear, and an average value of the whole is obtained. In addition, a Shannon average information amount is obtained for the above-described original symbol sequence, and comparison is performed.

Figure 36:
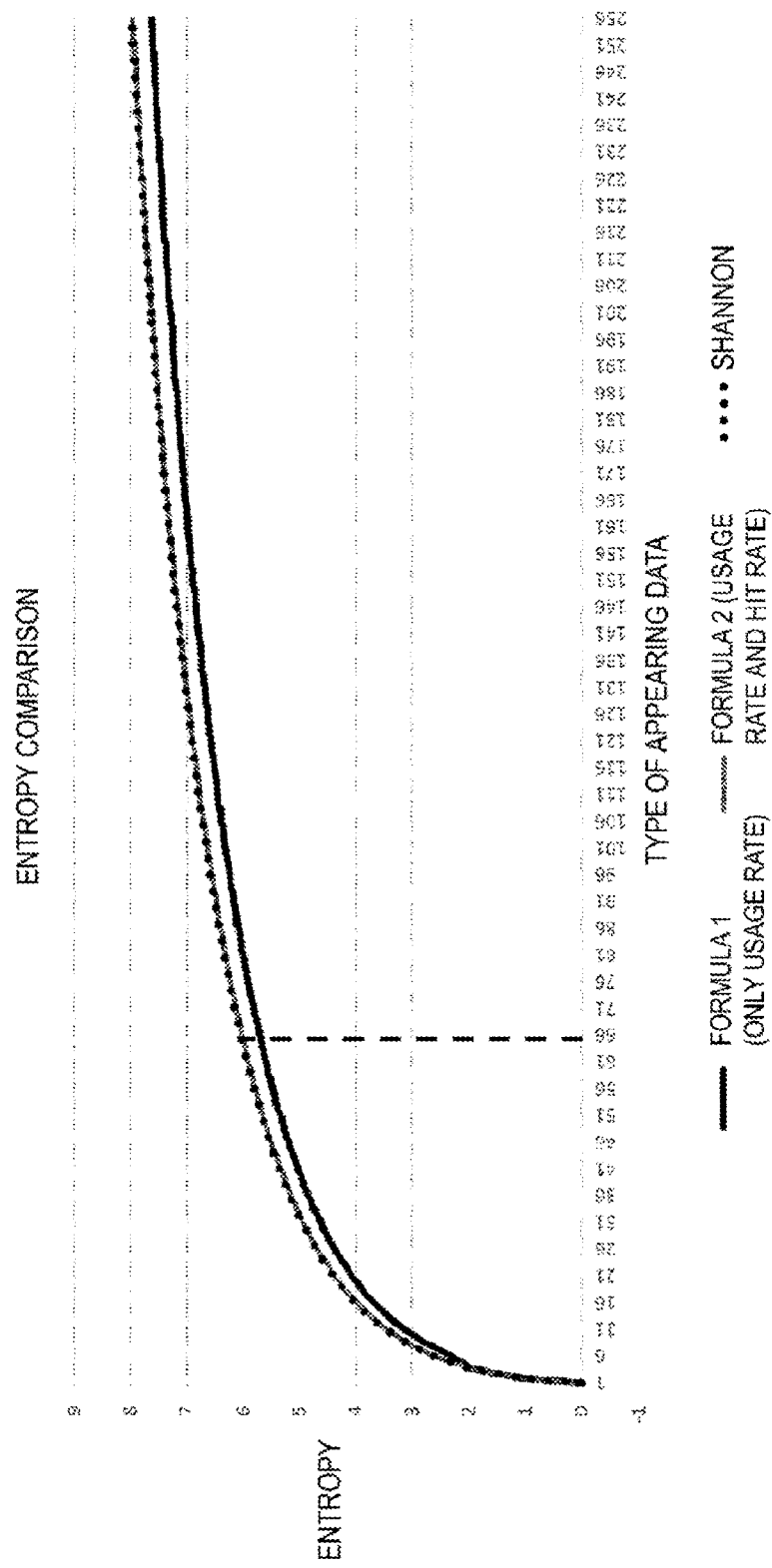
FIG. 36 is a graph illustrating experimental results.

FIG. 36 is a graph illustrating results of an experiment, where the vertical axis represents an entropy value and the horizontal axis represents the number of types of data (symbols). A dotted line is a graph illustrating a Shannon average information amount, a bold line is a graph in a case where the first calculation method (Formula 1) is used, and a thin line represents a graph in a case where the second calculation method (Formula 2) is used. A dashed line indicates a case where the number of types of data is 64 types.

In a case where 64 types of data appear, the data can be represented by 6 bits, and thus values of the graph of the Shannon average information amount and the graph of the second calculation method are approximately 6. Thereby, it can be said that a value obtained from the second calculation method using Formula 2 matches a theoretical value of an entropy. In the graph of the first calculation method, an entropy value is 5.66, which is approximately a theoretical value. However, since the entropy value is slightly smaller than the theoretical value, it indicates that a compressed symbol can be represented with a small number of bits.

Eleventh Embodiment

An eleventh embodiment will be described. The eleventh embodiment is a modification example of the fourth and fifth embodiments. In the fourth and fifth embodiments, for a reserved entry region of a conversion table, a registered symbol is fixed, and the reserved entry region is not subjected to table updating associated with a hit/a mis-hit of an entry (see FIGS. 54A and 66A).

However, in a case where RERI and RETO are performed, the reserved entry can also be subjected to exchange when the entry is hit by performing control so that the reserved entry does not become empty. For example, in the state of FIG. 53C, processing illustrated in FIG. 87A may be performed instead of performing the processing illustrated in FIG. 54A described in the fourth embodiment. That is, in a case where a symbol "A" is input and an index "3" is hit, the compressor 11 may move the symbol "A" to a leading index "0" and may move each of symbols "C", "F", and "B" to the next entry.

Figure 87A:
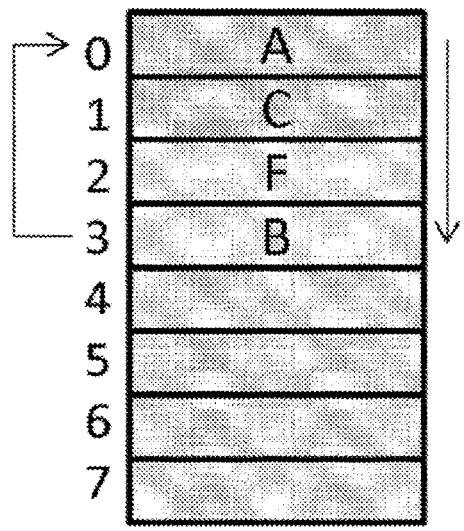
FIGS. 87A and 87B are diagrams illustrating an eleventh embodiment.
Figure 87B:
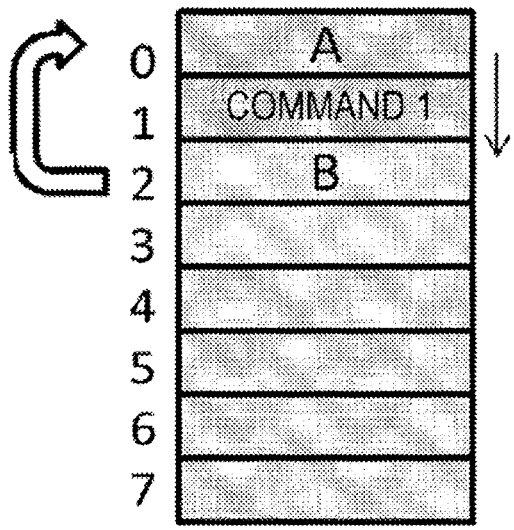

Alternatively, in the state of FIG. 65C, the processing illustrated in FIG. 87A may be performed instead of performing the processing illustrated in FIG. 54A described in the fourth embodiment. That is, in a case where a symbol "A" is input and an index "2" is hit, the compressor 11 may move the symbol "A" to a leading index "0" and may move each of symbols "command 1" and "B" to the next entry.

In this case, the "command 1" is treated as an original symbol, and the entry content of the "command 1" makes no sense as a command, but compression and decompression are performed correctly. Thus, the contents of the reserved entry are rewritten, but RETI and RETO can be realized. However, a condition is that a reserved entry is not made empty by a table reset command or entropy culling. It is considered that such control improves a compression ratio because the reserved entry is not sacrificed.

The configurations of the above-described embodiments can be combined as appropriate. The configurations described in the second and subsequent embodiments are optional and are not essential configuration requirements. Conversely, the configurations described in the second and subsequent embodiments, particularly the configurations for transmitting a command from a compression side to a decompression side described in the third and fourth embodiments can be applied to anything other than a compression apparatus and a decompression apparatus that make the number of valid bits of an index variable by entropy calculation. For example, the configuration can be applied to the compression apparatus and the decompression apparatus described in the reference example.

REFERENCE SIGNS LIST

10 Compression apparatus
11 Compressor
12 Serializer
50 Decompression apparatus
51 Deserializer
52 Decompressor 111, 521 Symbol conversion unit
112, 522 Entropy calculation unit
113, 523 Mask generation unit

The invention claimed is:

1. A data compression and decompression method comprising:
causing a compression apparatus to perform processing of registering a symbol, which is input, in one of a plurality of entries in a case where the symbol is not registered in a first table having the plurality of entries and outputting the symbol and index data indicating non-compression, and processing of outputting index data indicating compression and positional information indicating a position of the entry having the symbol registered therein and having a size smaller than a size of the symbol in a case where the symbol has been registered in the first table;
causing a decompression apparatus to perform processing of registering the symbol in a second table having the same data structure as that of the first table by the same method as a method of registering the symbol in the compression apparatus and outputting the symbol in a case where the index data indicating non-compression and the symbol have been received, and processing of reading and outputting the symbol registered in an entry in the second table indicated by the positional information in a case where the index data indicating compression and the positional information have been received;
causing the compression apparatus to output positional information of an entry in use in the first table which is represented by a first number of bits, which is a least number of bits capable of representing the positional information, based on information indicating usage conditions of the plurality of entries of the first table in a case where the index data indicating compression and the positional information are output; and
causing the decompression apparatus to extract positional information of an entry in use in the second table from a bit sequence which is transmitted from the compression apparatus and input to the decompression apparatus using a second number of bits which is a least number of bits capable of representing the positional information in a case where the decompression apparatus has received the index data indicating non-compression and the symbol and has registered the symbol in the second table, the second number of bits being calculated by the same calculation method as a method of calculating the first number of bits based on information indicating usage conditions of the plurality of entries of the second table.

2. The data compression and decompression method according to claim 1, wherein
the compression apparatus calculates the first number of bits using the number of entries k in use of the first table and Formula 1 below, and
the decompression apparatus calculates the second number of bits using the number of entries k in use of the second table and Formula 1 below Formula 1: $\text{ceil}(\log_2 k)$.

3. The data compression and decompression method according to claim 1, wherein
the compression apparatus calculates the first number of bits using a usage rate of the first table in a result of compression processing for a predetermined number of symbols, a hit rate of an entry in which a symbol is registered, and Formula 2 below, and
the decompression apparatus calculates the second number of bits using a usage rate of the second table in a result of decompression processing for the predetermined number of symbols, a hit rate of an entry in which a symbol is registered, and Formula 2 below Formula 2: $\text{ceil}(\log_2((\text{usage rate}/\text{hit rate})*\text{the number of entries}))$.

4. The data compression and decompression method according to claim 1, wherein the positional information is index numbers assigned to the plurality of entries of the first table and the second table in order from a leading entry.

5. The data compression and decompression method according to claim 1, wherein
the compression apparatus moves the symbol to a leading entry in the first table in a case where the entry having the symbol registered therein is hit in retrieval of the symbol in the first table, and moves a symbol, which is registered in an entry between the leading entry in the first table and one entry prior to the hit entry, to a next entry, and
the decompression apparatus moves the symbol to the leading entry in the second table in a case where the entry having the symbol registered therein is hit in retrieval of the symbol in the second table, and moves a symbol, which is registered in an entry between the leading entry in the second table and one entry prior to the hit entry, to a next entry.

6. The data compression and decompression method according to claim 1, wherein
the compression apparatus registers the symbol, which is registered in a hit entry, in a predetermined moving destination entry positioned on a side closer to a head than the hit entry with respect to the first table in a case where the entry having the symbol registered therein is hit in retrieval of the symbol in the first table, and moves a symbol, which is registered in an entry between the moving destination entry and one entry prior to the hit entry, to a next entry, and
the decompression apparatus registers a symbol, which is registered in a hit entry, in a predetermined moving destination entry positioned on a side closer to a head than the hit entry with respect to the second table in a case where the entry having the symbol registered therein is hit in retrieval of the symbol in the second table, and moves a symbol, which is registered in an entry between the moving destination entry and one entry prior to the hit entry, to a next entry.

7. The data compression and decompression method according to claim 6, wherein the predetermined moving destination entry is a leading entry in each of the first table and the second table.

8. The data compression and decompression method according to claim 6, wherein
the predetermined moving destination entry is an entry positioned at a location that goes back by a predetermined number of entries in a direction of the head from the hit entry in each of the first table and the second table, and
each of the compression apparatus and the decompression apparatus sets a leading entry as a moving destination in a case where the location that goes back by the predetermined number of entries passes across the head.

9. The data compression and decompression method according to claim 1, wherein
the compression apparatus registers the symbol in a leading entry in the first table in a case where the entry having the symbol registered therein is not hit in retrieval of the symbol in the first table in a state where all entries of the first table are in use, and moves a symbol, which is registered in an entry between the leading entry and one entry prior to a last entry in the first table, to a next entry to delete a symbol in an entry registered at an end, and
the decompression apparatus registers the symbol in the leading entry in the second table in a case where the entry having the symbol registered therein is not hit in retrieval of the symbol in the second table in a state where all entries of the second table are in use, and moves a symbol, which is registered in an entry between the leading entry and one entry prior to a last entry in the second table, to a next entry to delete a symbol in an entry registered at an end.

10. The data compression and decompression method according to claim 1, wherein
the compression apparatus registers the symbol in a first entry in the first table in a state where the first entry in the first table is in an empty state in a case where the entry having the symbol registered therein is not hit in retrieval of the symbol in the first table, and overwrites the symbol in the first entry in the first table in an overwriting manner when all entries of the first table are in use, and
the decompression apparatus registers the symbol in a first entry in the second table in a state where the first entry in the second table is in an empty state in a case where the entry having the symbol registered therein is not hit in retrieval of the symbol in the second table, and overwrites the symbol in the first entry in the second table in an overwriting manner when all entries of the second table are in use.

11. The data compression and decompression method according to claim 10, wherein
the first entry in the first table is a last entry in the first table, and
the first entry in the second table is a last entry in the second table.

12. The data compression and decompression method according to claim 1, wherein
the compression apparatus deletes a symbol in an entry having a maximum index number among entries having symbols registered therein, in a case where the number of hits of entries having symbols registered therein or the number of mis-hits of entries having symbols registered therein has reached a predetermined value with respect to the first table, and
the decompression apparatus deletes a symbol in an entry having a maximum index number among entries having symbols registered therein, in a case where the number of hits of entries having symbols registered therein or the number of mis-hits of entries having symbols registered therein has reached a predetermined value with respect to the second table.

13. The data compression and decompression method according to claim 12, wherein
the compression apparatus does not delete the symbol in the entry having a maximum index number in a case where the entry having a maximum index number corresponds to an entry in a predetermined range from the head with respect to the first table, and
the decompression apparatus does not delete the symbol in the entry having a maximum index number in a case where the entry having a maximum index number corresponds to an entry in a predetermined range from the head with respect to the second table.

14. The data compression and decompression method according to claim 1, wherein
command symbols indicating commands are registered in the same predetermined entries in the first table and the second table,
the compression apparatus outputs index data indicating compression and positional information indicating the predetermined entry, and executes the command indicated by the command symbol, and
the decompression apparatus reads the command symbol registered in the predetermined entry in the second table based on the index data indicating compression and the positional information indicating the predetermined entry, and executes the command indicated by the command symbol, the index data and the positional information being received from the compression apparatus.

15. The data compression and decompression method according to claim 1, wherein
command symbols indicating commands executed by the decompression apparatus are registered in the same predetermined entries in the first table and the second table,
the compression apparatus outputs index data indicating non-compression and the command symbol, and
the decompression apparatus executes the command indicated by the command symbol as exception processing for the command symbol having already been registered in the second table in registration processing for the command symbol based on the index data indicating non-compression.

16. The data compression and decompression method according to claim 1, wherein
the compression apparatus outputs index data indicating compression and positional information indicating an entry in an empty state of the first table in a case where the decompression apparatus executes a command, and
the decompression apparatus acquires and executes information indicating the command when an exception occurs due to a symbol not being registered in an entry in the second table indicated by the positional information in reading processing for a symbol based on the index data indicating compression and the positional information, the index data and the positional information being received from the compression apparatus.

17. The data compression and decompression method according to claim 16, wherein
the compression apparatus outputs the index data indicating compression and the positional information indicating an entry in an empty state of the first table, and then outputs the index data indicating non-compression and the command symbol indicating the command, and
the decompression apparatus executes the command indicated by the command symbol when the exception occurs.

18. The data compression and decompression method according to claim 1, wherein
the compression apparatus outputs index data indicating non-compression and symbols being registered in the first table in a case where the decompression apparatus executes a command, and the decompression apparatus acquires and executes information indicating the command when an exception occurs due to the same symbol being registered in the second table in registration processing for a symbol based on the index data indicating non-compression, the index data being received from the compression apparatus.

19. The data compression and decompression method according to claim 18, wherein
the compression apparatus outputs the index data indicating non-compression and the symbols being registered in the first table and then outputs index data indicating non-compression and the command symbol indicating the command, and
the decompression apparatus executes the command indicated by the command symbol when the exception occurs.

20. The data compression and decompression method according to claim 1, wherein
the symbols are symbols constituting a symbol sequence subjected to compression processing by another compression apparatus positioned at a stage before the compression apparatus, and
the symbols output by the decompression apparatus are input to another decompression apparatus positioned at a stage behind the decompression apparatus as a portion of the symbol sequence.

21. The data compression and decompression method according to claim 1, wherein
each of the first table and the second table is one of a plurality of banks obtained by dividing the table, and selection of the first table and the second table is performed using the same hash function.

22. The data compression and decompression method according to claim 1, wherein
the compression apparatus transmits a common key, which includes a combination of two or more parameters selected from among a plurality of parameters set for compression processing for the symbols, to the decompression apparatus, then performs encryption using the common key on a combination of the index data indicating non-compression and the symbols and a combination of the index data indicating compression and the positional information, and transmits a result of the encryption to the decompression apparatus, and
the decompression apparatus sets the two or more parameters in the common key transmitted from the compression apparatus for decompression processing of outputting the symbols using the combination of the index data indicating non-compression and the symbols or the combination of the index data indicating compression and the positional information, performs decryption of the result of the encryption using the common key, and performs the decompression processing for the decrypted result.

23. A data compression method comprising:
causing a compression apparatus to perform processing of registering a symbol, which is input, in one of a plurality of entries in a case where the symbol is not registered in a first table having the plurality of entries and outputting the symbol and index data indicating non-compression, processing of outputting index data indicating compression and positional information indicating a position of the entry having the symbol registered therein and having a size smaller than a size of the symbol in a case where the symbol has been registered in the first table, and processing of changing the size of the positional information depending on usage conditions of the plurality of entries; and
outputting the positional information represented by a least number of bits capable of representing positional information of an entry in use in the first table based on information indicating the usage conditions of the plurality of entries in the first table in the processing of outputting the index data indicating compression and the positional information.

24. A data compression apparatus comprising:
a compressor that performs processing of registering a symbol, which is input, in one of a plurality of entries in a case where the symbol is not registered in a first table having the plurality of entries and outputting the symbol and index data indicating non-compression, and processing of outputting index data indicating compression and positional information indicating a position of the entry having the symbol registered therein and having a size smaller than a size of the symbol in a case where the symbol has been registered in the first table,
wherein the compressor outputs the positional information represented by a least number of bits capable of representing positional information of an entry in use in the first table based on information indicating usage conditions of the plurality of entries in the first table in the processing of outputting the index data indicating compression and the positional information.

25. A non-transitory storage medium storing a program causing a computer to:
execute processing of registering a symbol, which is input, in one of a plurality of entries in a case where the symbol is not registered in a first table having the plurality of entries and outputting the symbol and index data indicating non-compression, and processing of outputting index data indicating compression and positional information indicating a position of the entry having the symbol registered therein and having a size smaller than a size of the symbol in a case where the symbol has been registered in the first table; and
output the positional information represented by a least number of bits capable of representing positional information of an entry in use in the first table based on information indicating the usage conditions of the plurality of entries in the first table in the processing of outputting the index data indicating compression and the positional information.

26. A data decompression method comprising:
causing a decompression apparatus to perform processing of registering a symbol in a second table and outputting the symbol, the second table having the same data structure as that of a first table included in a compression apparatus by the same method as a method of registering the symbol in the compression apparatus in a case where the decompression apparatus has received index data indicating non-compression and the symbol which are transmitted from the compression apparatus, and processing of reading and outputting the symbol registered in an entry in the second table indicated by positional information indicating a position of an entry having the symbol registered therein in the first table in a case where the decompression apparatus has received index data indicating compression and the positional information,
wherein the positional information is represented by a first number of bits, which is a least number of bits capable of representing positional information of an entry in use in the first table, the first number of bits being calculated based on information indicating usage conditions of the plurality of entries of the first table in a case where the compression apparatus outputs the index data indicating compression and the positional information, and the decompression apparatus extracts the positional information from a bit sequence transmitted from the compression apparatus and input to the decompression apparatus using a second number of bits which is a least number of bits capable of representing positional information of an entry in use in the second table, the second number of bits being calculated by the same calculation method as a method of calculating the first number of bits based on information indicating usage conditions of the plurality of entries of the second table in a case where the decompression apparatus has received the index data indicating non-compression and the symbol and has registered the symbol in the second table.

27. A data decompression apparatus comprising:

a decompressor that performs processing of registering a symbol in a second table and outputting the symbol, the second table having the same data structure as that of a first table included in a compression apparatus by the same method as a method of registering the symbol in the compression apparatus in a case where index data indicating non-compression and the symbol which are transmitted from the compression apparatus have been received, and processing of reading and outputting the symbol registered in an entry in the second table indicated by positional information indicating a position of an entry having the symbol registered therein in the first table in a case where index data indicating compression and the positional information have been received, wherein the positional information is represented by a first number of bits, which is a least number of bits capable of representing positional information of an entry in use in the first table, the first number of bits being calculated based on information indicating usage conditions of the plurality of entries of the first table in a case where the compression apparatus outputs the index data indicating compression and the positional information, and the decompressor extracts the positional information from a bit sequence transmitted from the compression apparatus and input to the decompression apparatus using a second number of bits which is a least number of bits capable of representing positional information of an entry in use in the second table, the second number of bits being calculated by the same calculation method as a method of calculating the first number of bits based on information indicating usage conditions of the plurality of entries of the second table in a case where the index data indicating non-compression and the symbol have been received and the symbol has been registered in the second table.

28. A non-transitory storage medium storing a program causing a computer to execute processing of registering a symbol in a second table and outputting the symbol, the second table having the same data structure as that of a first table included in a compression apparatus by the same method as a method of registering the symbol in the compression apparatus in a case where index data indicating non-compression and the symbol which are transmitted from the compression apparatus have been received, and processing of reading and outputting the symbol registered in an entry in the second table indicated by positional information, which indicates a position of an entry having the symbol registered therein in the first table and of which a size changes depending on usage conditions of the first table, in a case where the decompression apparatus has received index data indicating compression and the positional information, wherein the positional information is represented by a first number of bits, which is a least number of bits capable of representing positional information of an entry in use in the first table, the first number of bits being calculated based on information indicating usage conditions of the plurality of entries of the first table in a case where the compression apparatus outputs the index data indicating compression and the positional information, and the positional information is extracted from a bit sequence transmitted from the compression apparatus and input to the decompression apparatus using a second number of bits which is a least number of bits capable of representing positional information of an entry in use in the second table, the second number of bits being calculated by the same calculation method as a method of calculating the first number of bits based on information indicating usage conditions of the plurality of entries of the second table in a case where the index data indicating non-compression and the symbol have been received and the symbol has been registered in the second table.

* * * * *